(12) United States Patent
Kubota et al.

(10) Patent No.: US 6,719,394 B2
(45) Date of Patent: Apr. 13, 2004

(54) SEMICONDUCTOR DEVICE, INK TANK PROVIDED WITH SUCH SEMICONDUCTOR DEVICE, INK JET CARTRIDGE, INK JET RECORDING APPARATUS, METHOD FOR MANUFACTURING SUCH SEMICONDUCTOR DEVICE, AND COMMUNICATION SYSTEM, METHOD FOR CONTROLLING PRESSURE, MEMORY ELEMENT, SECURITY SYSTEM OF INK JET RECORDING APPARATUS

(75) Inventors: Masahiko Kubota, Tokyo (JP); Sadayuki Sugama, Ibaraki (JP); Ichiro Saito, Kanagawa (JP); Hiroyuki Ishinaga, Tokyo (JP); Yoshiyuki Imanaka, Kanagawa (JP); Muga Mochizuki, Kanagawa (JP); Ryoji Inoue, Kanagawa (JP); Kenji Kitabatake, Kanagawa (JP); Maki Nishida, Kanagawa (JP); Takaaki Yamaguchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 328 days.

(21) Appl. No.: 09/829,924

(22) Filed: Apr. 11, 2001

(65) Prior Publication Data
US 2002/0008724 A1 Jan. 24, 2002

(30) Foreign Application Priority Data

| Apr. 14, 2000 | (JP) | 2000-114228 |
| Jun. 16, 2000 | (JP) | 2000-181638 |
| Jun. 16, 2000 | (JP) | 2000-181639 |
| Jun. 16, 2000 | (JP) | 2000-181835 |
| Jun. 16, 2000 | (JP) | 2000-181837 |

(51) Int. Cl.[7] .............. B41J 29/393; B41J 29/38; B41J 2/165; B41J 2/175

(52) U.S. Cl. .............. 347/19; 347/14; 347/23; 347/85; 347/86

(58) Field of Search .............. 347/19, 50, 85, 347/86, 87, 94, 20, 17, 37, 14, 54, 23, 68, 10, 5, 12, 11, 7, 30, 70, 74, 75, 39; 257/531; 336/65, 223; 439/377

(56) References Cited

U.S. PATENT DOCUMENTS 4,825,056 A   4/1989   Ohta et al. .............. 235/449

(List continued on next page.)

FOREIGN PATENT DOCUMENTS

EP   765762   4/1997

(List continued on next page.)

OTHER PUBLICATIONS

J.W. Haskell, "Ink Concentration Monitor", IBM Technical Disclosure Bulletin, vol. 20, No. 2, Jul. 1977.

W.E. Broom, et al., "Continuous Liquid Level Sensor", IBM Technical Disclosure Bulletin, vol. 23, No. 7B, Dec. 1980.

Primary Examiner—Raquel Yvette Gordon
Assistant Examiner—Charles W. Stewart, Jr.
(74) Attorney, Agent, or Firm—Fitzpatrick, Cella, Harper & Scinto

(57) ABSTRACT

A solid type semiconductor device comprises energy converting means for converting energy from outside, and operating means operated by energy converted by the energy converting means. The energy converting means converts the electromotive force supplied from the outside to the device in non-contact into electric power. The operating means comprises information acquiring means actuated by electric power obtained by energy converting means; discriminating means; information accumulating means; and information communicating means.

85 Claims, 44 Drawing Sheets

U.S. PATENT DOCUMENTS

| | | | |
|---|---|---|---|
| 4,861,964 A | | 8/1989 | Sinohara ................ 219/121.68 |
| 5,370,766 A | | 12/1994 | Desaigoudar et al. ....... 156/643 |
| 5,529,831 A | | 6/1996 | Waga et al. ................. 428/209 |
| 5,555,005 A | * | 9/1996 | Pagnon .......................... 347/6 |
| 5,569,187 A | | 10/1996 | Kaiser .......................... 604/67 |
| 5,773,870 A | | 6/1998 | Su et al. ...................... 257/531 |
| 5,831,649 A | | 11/1998 | Watrobski et al. .......... 3117/19 |
| 5,835,111 A | | 11/1998 | Balazer ........................ 347/50 |
| 5,852,369 A | * | 12/1998 | Katsuma ..................... 324/678 |
| 5,945,725 A | | 8/1999 | Ishikawa .................... 257/531 |
| 5,992,990 A | | 11/1999 | Childers et al. .............. 347/87 |
| 6,003,966 A | | 12/1999 | Ahn ............................... 347/7 |
| 6,010,210 A | | 1/2000 | Wilson et al. ................ 347/85 |
| 6,012,794 A | | 1/2000 | Nakano et al. ................. 347/7 |
| 6,019,449 A | | 2/2000 | Bullock et al. ............... 347/14 |
| 6,022,090 A | | 2/2000 | Coudray et al. ............... 347/7 |

FOREIGN PATENT DOCUMENTS

| | | |
|---|---|---|
| EP | 794060 | 9/1997 |
| EP | 803360 | 10/1997 |
| EP | 812693 | 12/1997 |
| EP | 878316 | 11/1998 |
| EP | 903237 | 3/1999 |
| EP | 925936 | 6/1999 |
| EP | 956963 | 11/1999 |
| JP | 56-39414 | 4/1981 |
| JP | 60-136363 | 7/1985 |
| JP | 2-14573 | 1/1990 |
| JP | 2-177406 | 7/1990 |
| JP | 2-272753 | 11/1990 |
| JP | 6-143607 | 5/1994 |
| JP | 9-201348 | 8/1997 |
| JP | 2947245 | 7/1999 |
| WO | 97/16315 | 5/1997 |
| WO | 97/28001 | 8/1997 |
| WO | 98/04414 | 2/1998 |
| WO | 98/05508 | 2/1998 |
| WO | 98/52762 | 11/1998 |
| WO | 00/09836 | 2/2000 |

* cited by examiner

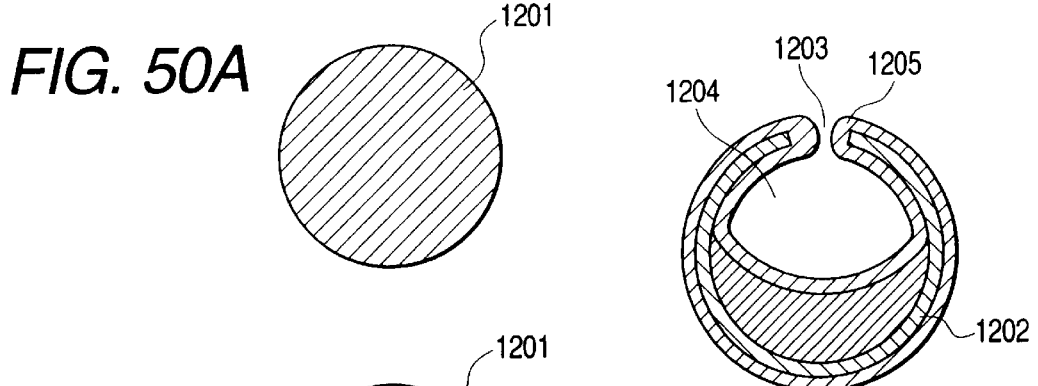
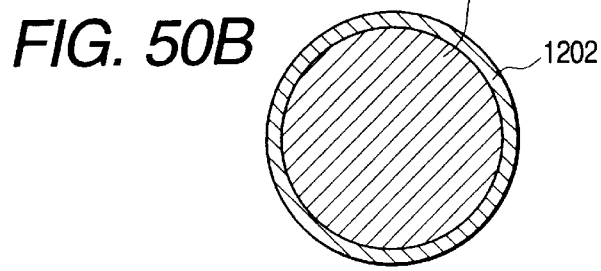
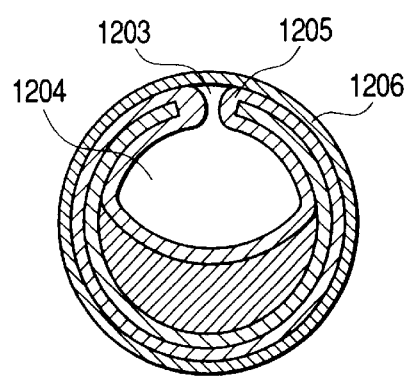
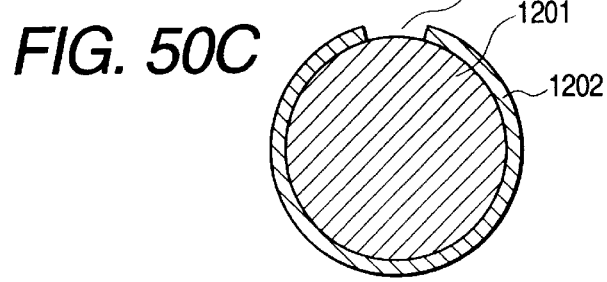
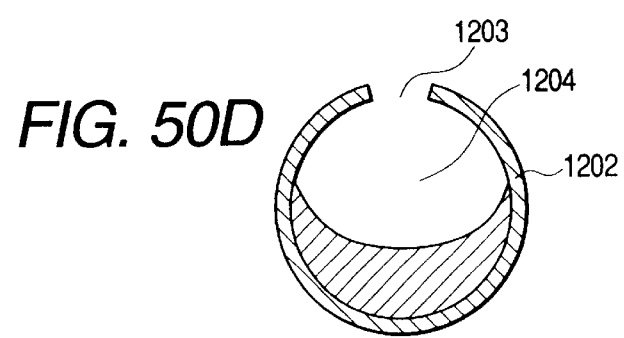
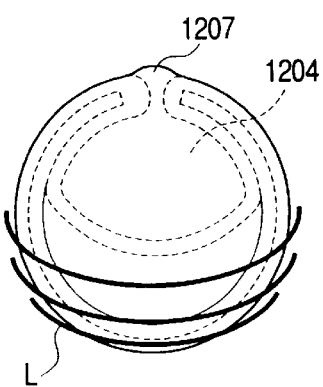

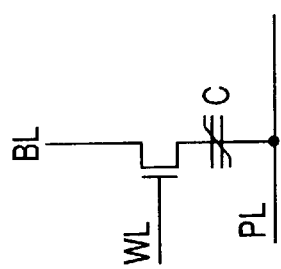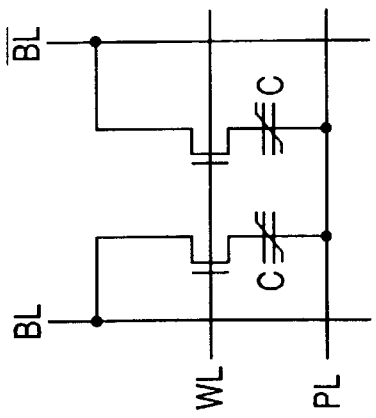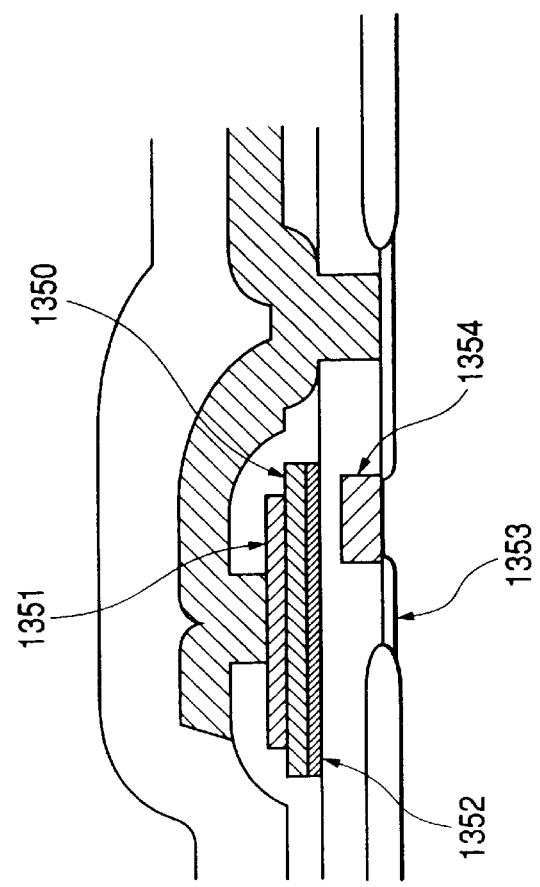

SEMICONDUCTOR DEVICE, INK TANK PROVIDED WITH SUCH SEMICONDUCTOR DEVICE, INK JET CARTRIDGE, INK JET RECORDING APPARATUS, METHOD FOR MANUFACTURING SUCH SEMICONDUCTOR DEVICE, AND COMMUNICATION SYSTEM, METHOD FOR CONTROLLING PRESSURE, MEMORY ELEMENT, SECURITY SYSTEM OF INK JET RECORDING APPARATUS

BACKGROUND OF THE INVENTION

1. Field of the Invention

The present invention relates to a semiconductor device provided with the function to convert energy transmitted from the outside and communicate with the outside regarding the performance of designated operation or information, as well as provided with the function to display the contents of communication. The invention also relates to an ink tank provided with such semiconductor device, and an ink jet cartridge, and an ink jet recording apparatus as well.

Also, the present invention relates to a method for manufacturing a semiconductor device provided with the function to convert energy transmitted from the outside, and communicate with the outside regarding the performance of designated operation or information, as well as provided with the function to display the contents of communication. Further, the invention relates to communication system, a method for adjusting pressure, security system, and memory element, which utilize the aforesaid semiconductor device.

2. Related Background Art

There are many apparatuses and equipments that detect the environmental information under the environments that surround us, and then, make decision and operate in accordance with the result thus detected.

For example, a cooler detects the current environmental temperature, and compares it with the predetermined temperature. Then, when the temperature is lower than the predetermined value, the device incorporated therein operates heating or operates cooling if the detected temperature is higher on the contrary. It is comparatively easy to structure such devices by use of the conventional equipment, components, and the like.

However, even when it is extremely difficult to structure components due to the inability of securing a sufficient space with restriction imposed upon the arrangement space, while the environmental information that should be taken into account is not only temperature, but many other aspects, a designated operation should be executed with an instantaneous decision to be made in accordance with the environmental information. There are many demands in this respect, but the status quo is that due to several restrictions including those described above, these demands have not been met satisfactorily as yet.

In recent years, even in the field of microdevices the utilization of which is expected widely in many industries, a considerable number of research and development projects are underway, but there are still many more studies needed for making them practicable.

Now, as a specific example of the field in which the utilization of microdevices is required, the filed of recording can be cited.

At present, various kinds of printer systems are utilized for printing various kinds of images. Such kind of printer system is formed by connecting a data processing apparatus like a personal computer, a printing apparatus, for example. Then, the printing apparatus outputs on a recording medium, such as a printing sheet, the printing data which have been processed by data processing apparatus.

As printer apparatuses used for such kind of printing system, there are on the market various apparatus using various recording methods at present. Of those kinds of recording methods, the so-called ink jet recording method is extremely useful, because this recording method is non-impact and generates almost no noises at the time of recording, making high-speed recording possible on an ordinary paper sheet without any particular fixation treatment.

The ink jet recording is such that a carriage having a recording head mounted thereon travels in the printing direction, while discharging ink from a plurality of discharge nozzles arranged for the ink jet recording head (hereinafter, referred to simply as a recording head as the case may be), thus printing images on the recording sheet by means of dot patterns. The discharge ink for recording use is contained in an ink tank and supplied to the recording head through ink supply paths. If the ink which should be supplied no longer exists in the ink tank, not only image formation becomes impossible, but the recording head may be damaged in some cases. Therefore, various proposals have been made to provide an ink remainder detection device for detecting the remainders of ink in the ink tank.

For example, in accordance with Japanese Patent Application Laid-Open No. 6-143607, the structure is disclosed in which as shown in FIG. 1 two (a pair of) electrodes 702 are arranged on the inner face of an ink tank 701 on the bottom side where non-conductive ink is filled, and then, a float 703 having electrodes 704 arranged to face the electrodes 702 is provided to float in ink in the ink tank 701. The two electrodes 702 are connected to the detecting section (not shown) that detects the conductive condition of both electrodes, respectively. Then, when the conductive condition of both electrodes is detected, the ink remainder error is issued to indicate that there in no more ink in the ink tank 701, and the operation of ink jet recording head 705 is suspended.

Also, in accordance with the specification of Japanese Patent No. 2947245, the ink cartridge 805 for use of ink jet printer is disclosed, which is structured to form the lower part thereof in the funnel form toward the bottom face, and at the same time, two conductors 801 and 802 are arranged on the bottom face as shown in FIG. 2. Then, the metallic ball 804 having a smaller gravity than ink 803 is arranged in the interior thereof. With the structure thus arranged, the liquid surface of ink 803 is lowered as ink 803 is consumed. Along with this, the position of the metallic ball 804 that floats on the surface of ink 803 is gradually lowered. When the liquid surface of ink 803 is lowered to the position of bottom face of ink cartridge housing, the metallic ball 804 is in contact with the two conductors 801 and 802. Then, the conductors 801 and 802 become conductive to allow electric current to flow across them. With detection of such current, the condition of ink end can be detected. With the detection of ink end condition, information indicating this ink end condition is notified to the user.

There has been known each of the structures represented by those disclosed in the publications described above for the detection of ink remainders in ink tank. However, it is required for each of them to provide electrodes for use of detection in the ink tank, and at the same time, to form a connector with the outside in order to transmit detection signals. Also, for the detection of ink remainders by the conductive condition across electrodes, no metallic ion or the like is used for the ink component so as not to cause electrolysis in ink, with the result that structural restriction is imposed on the apparatus with respect to ink to be used.

Also, in accordance with the structures disclosed in the aforesaid publications, only the amount of remaining ink is detected, and no other information in the interior of ink tank is obtainable from the outside. For example, the pressure information in the ink tank, the changes of physical properties of ink, and the like are important parameters for the ink jet recording head to operate at all the time in a stable amount of ink dischargers. Thus, it is desirable to inform the external ink jet recording apparatus of the internal of tank that changes from time to time along with the consumption of ink in the tank, as well as to communicate with the outside as to the changes of physical properties of ink.

Further, it is desired to provide an ink tank which is capable of not only providing the detected information of the internal condition of ink tank on one-way for the outside, but also, capable of exchanging information bidirectionally, such as to provide the internal information in response to inquires from the outside.

Also, for the color ink jet recording apparatus that uses plural kinds of ink for the formation of color images, the structure is proposed so that ink tank is formed per color, and that only the ink tank having no more ink in it is made replaceable independently. For the color ink tank of the kind, it is necessary to install each ink tank on the designated position per color. In order to prevent the user from installing ink tank on inadequate position when such kind of ink jet recording apparatus is used, it is generally practiced to configure ink tank of each color different so as to structurally avoid the installation on inadequate position. However, to differentiate the ink tank configurations in a number of ink colors leads to the increased costs of ink tank. Therefore, it is desired to provide the ink tank that can deal with the improvement of installation aspect, while keeping each of ink tanks in the same configuration.

On the other hand, the ink jet recording apparatus is provided with a plurality of nozzles (discharge ports) for discharging ink, and the ink which is supplied from the ink tank to the recording head is retained in each of the nozzles by means of the balance of capillary phenomenon and surface tension. As a result, in a case where the recording head and ink tank are mounted on a carriage, for example, ink is caused to leak from nozzles if the internal pressure of ink tank is higher than the atmospheric pressure. Here, it is necessary to make the internal pressure negative in the ink tank. Also, if an ink tank is an airtightly closed container, the negative pressure in the ink tank becomes higher along with the consumption of ink in the ink tank. Then, with the negative pressure which should become too high, ink in the nozzles is drawn to the ink tank side to cause such drawback as inability to discharge ink when the recording head is driven to discharge ink from the nozzles.

Therefore, in accordance with the conventional ink tank, an ink absorbent of porous material, fibrous material, or the like is contained partially or totally in the interior thereof, and at the same time, the chamber in which the ink absorbent is contained is conditioned to be communicative with the air outside, thus enabling the ink absorbent to absorb and retain ink. In this manner, the interior of ink tank is conditioned to be in negative pressure.

Here, nevertheless, ink is retained by enabling ink absorbent to absorb it with the result that the efficiency of ink storage is lowered inevitably. Also, whereas the interior of ink tank is conditioned to be communicative with the air outside, the negative pressure becomes higher when the amount of ink retained in the ink absorbent becomes smaller, and there is still a possibility that the discharges of ink from the recording head is disabled depending on the relations with the external pressure exerted on the ink tank. Therefore, if it is possible to provide an additional function to an ink tank so as to adjust the pressure in the interior of the ink tank, any ink absorbent is no longer needed, and also, the efficiency of ink storage is enhanced. Here, it is desired to provide an ink tank having such function. Also, in order to adjust the pressure in the interior of ink tank, there is a need for knowing the condition of internal pressure of ink tank by all means directly or indirectly.

Meanwhile, the development of ink jet recording technologies is remarkable, and the printing accuracy thereof has become extremely high in recent years. Thus, conceivably, the ink jet recording technologies can be utilized even for producing securities, official documents, or the like. For the printer system used for producing those documents, it is required to provide the security function so that the ink jet printer cannot be used by any one other than the owner or the authorized person by registration.

Also, copyright is given to the documents and images produced by the person himself with a computer dedicated to his personal use. No third party is allowed to print them out without the permission of such person. In this case, too, the printer should provide some security function as described above.

With respect to the development of recording systems to meet the various kinds of requirements described above, the inventors hereof have given attention to the ball semiconductor manufactured by the Ball Semiconductor Inc., in which semiconductor integrated circuit is formed on the spherical surface of a silicon ball of approximately 1 mm diameter. Since this ball semiconductor is spherical, it is expected that the detection of surrounding environmental information and the bidirectional information exchange with the outside can be carried out efficiently in a better condition than the flat type semiconductor if the ball semiconductor is contained in the ink tank. However, as a result of thorough investigation on the art that provides such function of the kind, it has been found that there are only those ones which are used for connecting ball semiconductors themselves by means of electric wires such as disclosed in the specification of U.S. Pat. No. 5,877,943, and that a ball semiconductor device itself should be developed in order to provide such function as described above. Also, there some more problems to solve before the ball semiconductor device is effectively used for an ink tank.

One of the problems is that a novel device should be provided in order to form means for accumulating information on such a device as the ball semiconductor, and that the novel device should be capable of making itself very small at first, and then, capable of being driven with a small amount of power dissipation, while keeping information without being influenced by the fluctuation of energy supplied from the power-supply system, and if required, being able to rewrite information.

Another problem is that the provision of an ink tank which is capable of performing the bidirectional exchange of information such as to receive inquiries from the outside and return internal information, not only by performing the one-way transmission of the detected internal information of ink tank to the outside.

Still another problem is that the device that accumulates information should be driven by the application of low electric power, together with the provision of power supply system to actuate the device contained in the tank. If the power-supply source should be built in the ink tank to actuate the device, the tank inevitably becomes larger. Even when the power-supply source is provided outside the tank, it is still necessary to arrange means for connecting the power-supply source and the device. This inevitably increases the costs of tank manufacture. Thus, the tank cartridge should become expensive. Therefore, the device should be actuated from the outside by use of non-contact means.

It is a further problem to be solved that the device should float on the ink liquid surface in the ink tank or should be capable of residing in ink with a designated depth from the liquid surface. For example, it is desirable to position the device on the ink liquid surface in order to monitor the changing amount of negative pressure in time series along with the consumption of ink in the ink tank, but it is difficult to enable the device to float on ink, because it is formed by silicon having a specific gravity greater than water.

SUMMARY OF THE INVENTION

It is an object of the present invention to provide a solid type semiconductor device having security function therefor, which can be actuated from the outside in non-contact so as to be able to detect environmental information surrounding the device and also, to perform extremely efficient communicate with the outside bidirectionally, at the same time, being capable of detecting the internal condition of the ink tank (such as the kind of ink contained in the tank, internal pressure, temperature, pH, ink remainders), and adjusting the pressure inside the container in non-contact with the outside of the container. It is also objects of the invention to provide a method for manufacturing such device, an ink tank provided with the device thus manufactured, an ink jet cartridge, as well as an ink jet recording apparatus.

It is also the object of the invention to provide a method for adjusting pressure for adjusting the pressure inside the container, at the same time, to provide the communication system which is actuated in non-contact, be able to detect surrounding environmental information and carry out extremely efficient bidirectional communications with the outside, as well as to provide the solid type semiconductor device with the security function to make it possible to registration from the outside, and also, to perform the user discrimination, hence providing the security system of the recording apparatus whereby to disable recording by any person other than the owner or the authorized personnel by registration, and the memory element used for this system as well.

The solid (three-dimensional) type semiconductor device of the present invention comprises energy converting means for converting energy from outside, and operating means operated by energy converted by the energy converting means.

Also, the communication system of the present invention that uses solid type semiconductor device comprises a liquid container having the solid type semiconductor device arranged therefor; an oscillation circuit provided with conductor coil, information acquiring means for acquiring information inside the container, reception means for receiving signals from the outside, and information communicating means for communicating information to the outside formed for the solid type semiconductor device; an external resonance circuit arranged outside the solid type semiconductor device to generate electric power by magnetic induction between the circuit and the oscillation circuit of the solid type semiconductor device; and an external communication means for communicating bidirectionally by the reception means and the information communicating means of the solid type semiconductor device.

Further, the method of the present invention for manufacturing a solid type semiconductor device, comprises the steps of forming a protection film A on the entire surface of Si; forming opening on a part of the protection film A; removing only the upper part of the Si; forming a protection film B on the inner and outer surfaces of the work formed by the Si and protection film A; making the hollow portion in airtightly closed condition by use of conductive material; and forming conductor coil made by the conductive material.

Also, the method of the present invention for manufacturing a solid type semiconductor device comprises the steps of forming a protection film A on the entire surface of Si; forming opening on a part of the protection film A; removing only the upper part of the Si; forming a protection film B on the inner and outer surfaces of the work formed by the Si and protection film A; making the hollow portion in airtightly closed condition by use of conductive material and forming conductive film on the entire surface thereof; and patterning the conductive film to from conductor coil made by conductive material.

Further, according to the present invention, the security system of a recording apparatus is provided with a recording head cartridge detachably mounted thereon, in which the recording head cartridge comprises a recognized data holding portion for holding as recognized data the personal information recognized by recognizing portion for recognizing personal information; a key code A holding portion for holding key code A; an encode converting portion for encoding the recognized data by the key code A; an encoded data holding portion for holding the encoded data by the encode data converting portion; an information input and output portion for receiving the key code A from the recording apparatus side, and for transmitting the recognized data and the encoded data to the recording apparatus; an energy converting portion for converting electromotive force supplied from the recording apparatus side in non-contact into electric power for actuating each of structural portions, and then, the recording apparatus comprises an energy supplying portion for supplying electromotive force to the energy converting portion in non-contact; a key code K setting portion for the owner of recording apparatus to set the key code K; a key code A holding portion and a key code B holding portion for holding key code A and key code B created from the key code K, respectively; an information input and output portion for transmitting the key code A to the solid type semiconductor device, and for receiving the recognized data and the encoded data from the solid type semiconductor device side; a recognized data holding portion for holding the recognized data; an encoded data holding portion for holding the encoded data; a decode converting portion for decoding the encoded data by the key code B; a decoded data holding portion for holding decoded data by the decode converting portion; a data comparing portion for comparing the recognized data and the decoded data for reference; and discrimination processing portion for admitting the use of recording apparatus or making the use thereof impossible in accordance with the result of comparison by the data comparing portion.

Also, the ink tank of the present invention is characterized in that at least one solid type semiconductor device arranged therefor which comprises energy converting means for converting energy from the outside; and operating means operated by energy converted by the energy converting means.

Further, the ink tank, which contains ink to be supplied to a discharge head for discharging ink, and holds negative pressure in the interior thereof, comprises pressure adjustment means for adjusting negative pressure in the interior in accordance with negative pressure in the interior; and energy converting means for converting energy provide from the outside into energy of different kind from the energy for operating the pressure adjustment means.

Also, the method of the present invention for adjusting pressure, which uses a solid type semiconductor device arranged for a container holding negative pressure in the interior thereof, and which is provided with pressure adjustment means for adjusting negative pressure inside the container in accordance with the internal pressure of the container, and energy converting means for converting energy provided from outside into different kind of energy from the energy in order to operate the pressure adjustment means, comprises the step of keeping pressure inside the container regularly by comparing pressure detected by the pressure detecting means for detecting pressure inside the container with the pressure inside the container.

Further, the memory element of the present invention comprises energy converting means for converting external energy supplied from the outside in non-contact into electric power, in which personal information is held by actuating the electric power.

Here, in this specification, the term "metacenter" means the intersection point of the line of action of weight at the time of being balanced, and the line of buoyance at the time of inclination.

Also, in this specification, the term "solid type" of the "solid type semiconductor device" is meant to include all the various three-dimensional shapes, such as a triangle, a sphere, a semi-sphere, a square column, a rotatively elliptical body, a mono-axially rotative body, among some others.

As the method for supplying external energy, it should be good enough if only means for supplying electromotive force to the device as the external energy is arranged in the recovery position, returning position, or arranged for the carriage, head, or the like when this method is applied to an ink jet recording apparatus. Besides this, if only an apparatus having means for supplying electromotive force is used, it becomes possible to detect internal conditions of an ink tank without ink jet recording apparatus. For example, therefore, this method can be adopted for carrying out inspection or the like at a factory or a shop (for quality guarantee).

BRIEF DESCRIPTION OF THE DRAWINGS

FIGS. 50A, 50B, 50C, 50D, 50E, 50F and 50G are views which illustrate one example of process of a method for manufacturing the solid type semiconductor device of the present invention.

FIGS. 52A, 52B and 52C are views which illustrate the cell structure of ferroelectric memory.

DETAILED DESCRIPTION OF THE PREFERRED EMBODIMENTS

Hereinafter, with reference to the accompanying drawings, the description will be made of the embodiments in accordance with the present invention. Then, the detailed description will be made of the embodiments particularly when the device is arranged for the interior of an ink tank. Here, the device is not only used for the ink tank, but for other objects, and the same effect is obtainable.

First Embodiment

Figure 1:
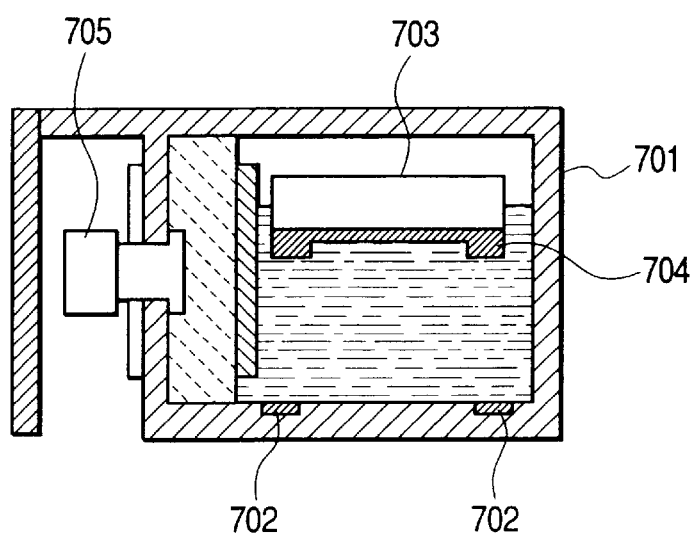
FIG. 1 is a view which shows one example of the conventional ink remainder detection device.
Figure 2:
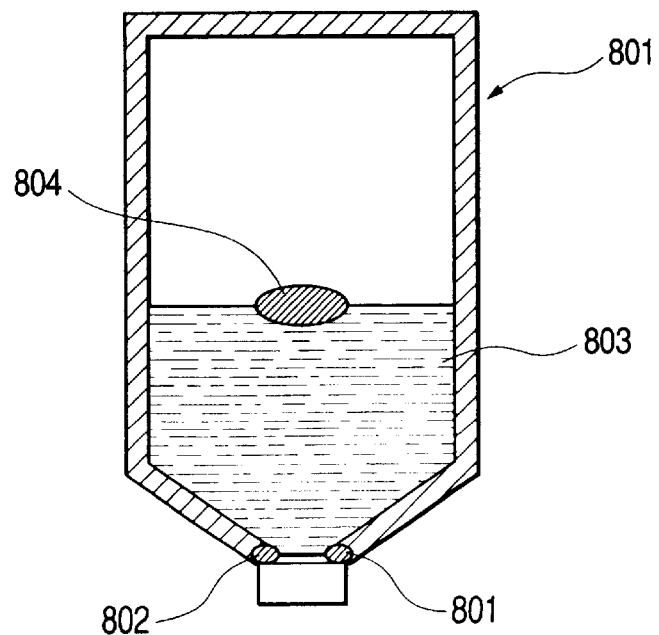
FIG. 2 is a view which shows another example of the conventional ink remainder detection device.
Figure 3:
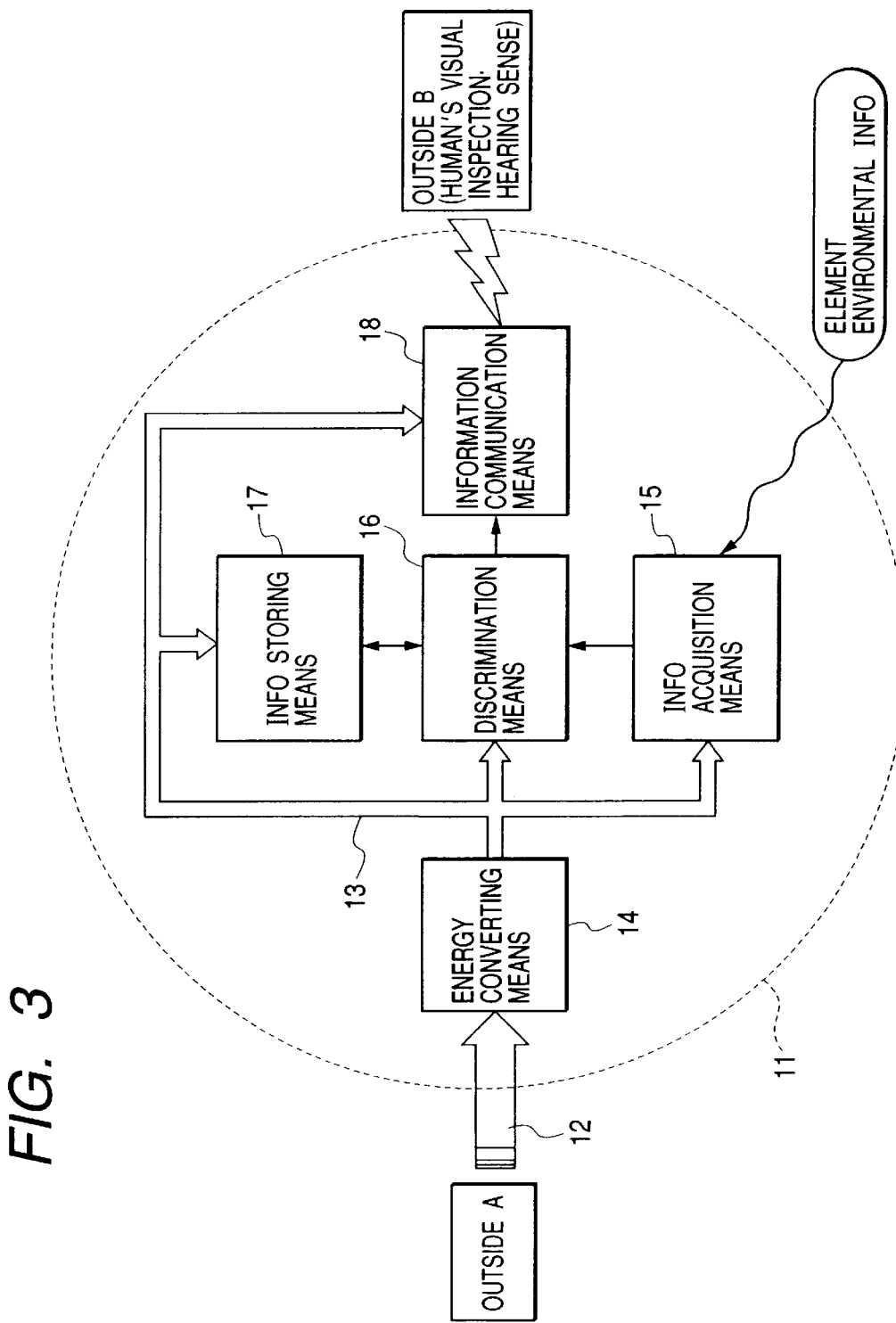
FIG. 3 is a block diagram which shows the inner structure of a solid type semiconductor device in accordance with a first embodiment of the present invention, and also, represents the communicative condition thereof with the outside.

FIG. 3 is a block diagram which shows the inner structure of a solid type semiconductor device in accordance with a first embodiment of the present invention, and also, represents the communicative condition thereof with the outside. The solid type semiconductor device 11 shown in FIG. 3 comprises the energy converting means 14 which converts the electromotive force 12 supplied from the outside A to the device 11 in non-contact into electric power 13; information acquiring means 15 actuated by electric power obtained by energy converting means 14; discriminating means 16; information accumulating means 17; and information communicating means 18. This device is arranged in an ink tank. For the electromotive force which is supplied to operate the device, electromagnetic induction, heat, light, radiant rays, or the like is preferably usable. Also, it is preferable to form at least energy converting means 14 and information acquiring means 15 on the surface or near the surface of the device. Although description will be made in detail, information accumulating means 17 should preferably be structured using FeRAM (Ferroelectric Random Access Memory) formed by ferroelectrics.

Information acquiring means 15 is the one for acquiring information inside the ink tank, which is the environmental information surrounding the device 11. Discriminating means 16 compares the tank internal information obtained from information acquiring means 15 with information stored on information accumulating means 17 and determines whether or not the tank internal information thus obtained should be transmitted to the outside. Information accumulating means 17 accumulates various conditions which should be compared with acquiring tank internal information, as well as the tank internal information obtained from information acquiring means 15. Information communicating means 18 converts electric power into energy to be communicated as tank internal information in accordance with instructions from discriminating means 16, and displays the tank internal information and communicate it to the outside B.

Here, the information acquiring means which is applicable to the solid type semiconductor device is exemplified for description. With solid type semiconductor device being incorporated on a spherical silicon, which is arranged in an ink tank, information acquiring means may be structured in such a manner that (1) $SiO_2$ film or SiN film is formed as ion sensitive film to provide a sensor for detecting pH in ink or (2) provide a pressure sensor of a diaphragm structure to detect pressure changes in the tank or (3) to provide a sensor for detecting the current position for the detection of ink remainders by incorporating photodiode capable of converting light into thermal energy for the production of pyroelectric effect or (4) to provide a sensor for detecting the presence or absence of ink depending on the amount of moisture in the tank by use of conductivity of material used the sensor, among some others.

Figure 4:
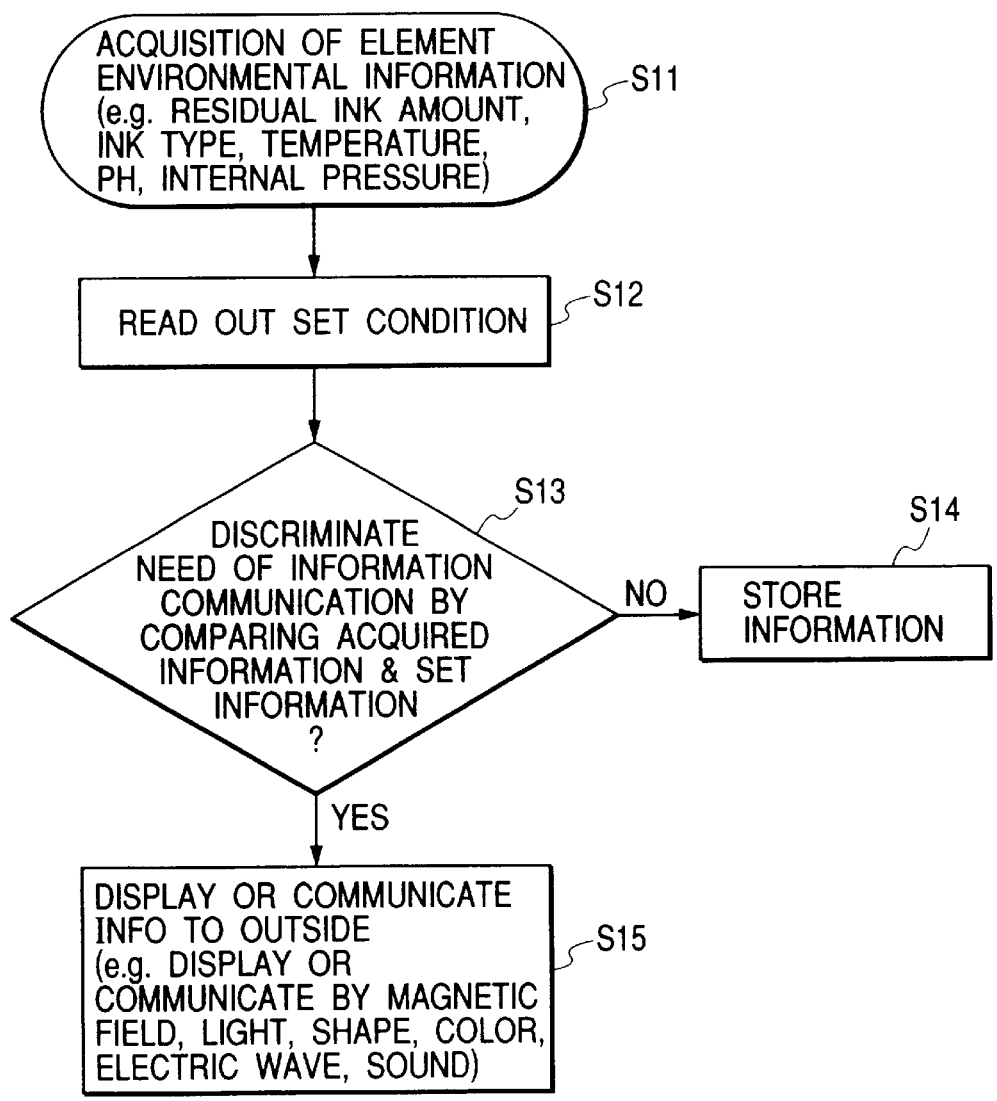
FIG. 4 is a flowchart which illustrates the operation of the device shown in FIG. 3.

FIG. 4 is a flowchart which illustrates the operation of device shown in FIG. 3. As referred to in FIG. 3 and FIG. 4, when electromotive force 12 is provided by the outside A toward the device 11, energy converting means 14 converts the electromotive force 12 into the electric power 13. Then, with the electric power thus converted, information acquiring means 15, discriminating means 16, information accumulating means 17, and information communicating means 18 are actuated.

Information acquiring means 15 thus actuated acquires information inside the ink tank, which is the environmental information that surrounds the device, such as ink remainders, the kind of ink, temperature, pH, and internal pressure (step S11 in FIG. 4). Then, discriminating means 16 reads out from information accumulating means 17 the conditions which are compared with the tank internal information thus obtained (step S12 in FIG. 4). Thus, the conditions thus read out are compared with the tank internal information thus acquired to determine whether or not information should be communicated (step S13 in FIG. 4). Here, the discrimination made on the basis of the conditions predetermined for information accumulating means 17 are such as to determine that tanks should be replaced, because the ink remainders become less than the designated value (2 milliliters, for instance) or the Ph of ink, the internal pressure, or the like has changed greatly, for example.

In step S13, if it is determined by discriminating means 16 that there is no need for the current inner condition of ink tank to be communicated to the outside, the information of the current condition inside the ink tank is accumulated on information accumulating means 17 (step S14 in FIG. 4). Here, using discriminating means 16 this accumulated information may be compared with the next information acquired by information acquiring means 15.

Also, in the step S13, if discriminating means 16 determines that tank internal information should be communicated to the outside, the electric power which is obtained by means of energy conversion is converted by information communicating means 18 into energy for communicating the ink tank internal information to the outside. Here, it is possible to use magnetic field, light, shape, color, electric wave, sound, or the like as energy for effectuating this communication. Then, for example, if it is found that ink remainders become less than a designated value, for example, sounds are made to inform the outside B (ink jet recording apparatus, for instance) of the need for replacing tanks (step S15 in FIG. 4). Also, the communicating end is not necessarily an ink jet recording apparatus, but it may be the eyesight or auditory sense of a human when light, shape, color, or sound is used in particular. Further, it may be possible to change communicating means such as using sound for communication regarding ink remainders, but using light for communication regarding pH of ink, or the like.

When the solid semiconductor device structured herein is used for an ink jet recording apparatus, it is possible to install means for supplying the electromotive force to this device as external energy on a recover position where recovery operation is performed; on a returning position where the carriage returns in the recording operation; on the carriage itself; or on the head itself or the like. Besides this arrangement, it may be possible to know the inner condition of ink tank without using an ink jet recording apparatus if only there is a device which is provided with means for supplying such electromotive force. Then, for example, it may be possible to use the device effectively for inspecting an ink tank, among some others, at a factory or at a shop, thus selling ink tank with a guarantee of quality.

In accordance with the present embodiment, the device is provided with energy converting means. Thus, there is no need for the provision of any electric wires directly connected with the outside. As a result, the device can be arranged for use in any location in an object, such as in ink as shown in FIG. 13 to FIG. 16 as described later. With the device being arranged in ink, it becomes possible to grasp the current condition of ink exactly in real time.

Also, with the energy converting means which is provided for the device, there is no need for the arrangement of means for accumulating the electromotive force which is required to operate the device (that is, the power-supply source in the present embodiment), thus making it possible to miniaturize the device so that it can be used in any location of the object, such as a narrow place or in ink as shown in FIG. 13 to FIG. 16. Here, for the present embodiment, electromotive force is supplied in non-contact mode, but it may be possible to adopt the mode in which electromotive force is supplied by being provisionally in contact with the outside, and subsequently, it becomes non-contact with the outside.

In this respect, when the FeRAM formed by ferroelectrics is used as information accumulating means 17, it becomes capable of reading and writing data at high speed like a generally used DRAM (Dynamic Random Access Memory), and also, this means becomes non-volatile memory that can retain data even with the power-supply being cut off. Like this, the FeRAM makes higher access possible. Then, since the FeRAM is non-volatile it does not eliminate data even if the power-supply is instable, hence making the solid type semiconductor device effectively usable for an ink tank. With the FeRAM that stores information to be accumulated, it becomes possible to perform information processing exactly, as well as to perform bidirectional signal communications with the external equipment at a low voltage to drive this means. In this respect, with the application of semiconductor process, the device can be formed smaller, which can be driven at low voltage. As described above, the FeRAM makes high speed access possible, while it is non-volatile so as not to eliminate data even with a power-supply being instable, and, further, miniaturization possible at low power dissipation. With these advantages, the FeRAM is formed as extremely effective information accumulating means for the solid type semiconductor device. It is particularly effective for an ink tank to use the solid type semiconductor device with these advantages in view, which will be described later.

Also, with information accumulating means 17, that is, FeRAM formed by ferroelectrics, it becomes possible to make the capacitance of solid type semiconductor device larger if utilizing the ferroelectric material of FeRAM as capacitor. With a larger capacitance of solid type semiconductor device thus arranged, it becomes possible to make the communication frequency of solid type semiconductor device smaller as described later when the solid type semiconductor device performs signal communications with the external equipment. As a result, the communication of solid type semiconductor is possible at lower frequency to enhance the freedom of communication.

Second Embodiment

Figure 5:
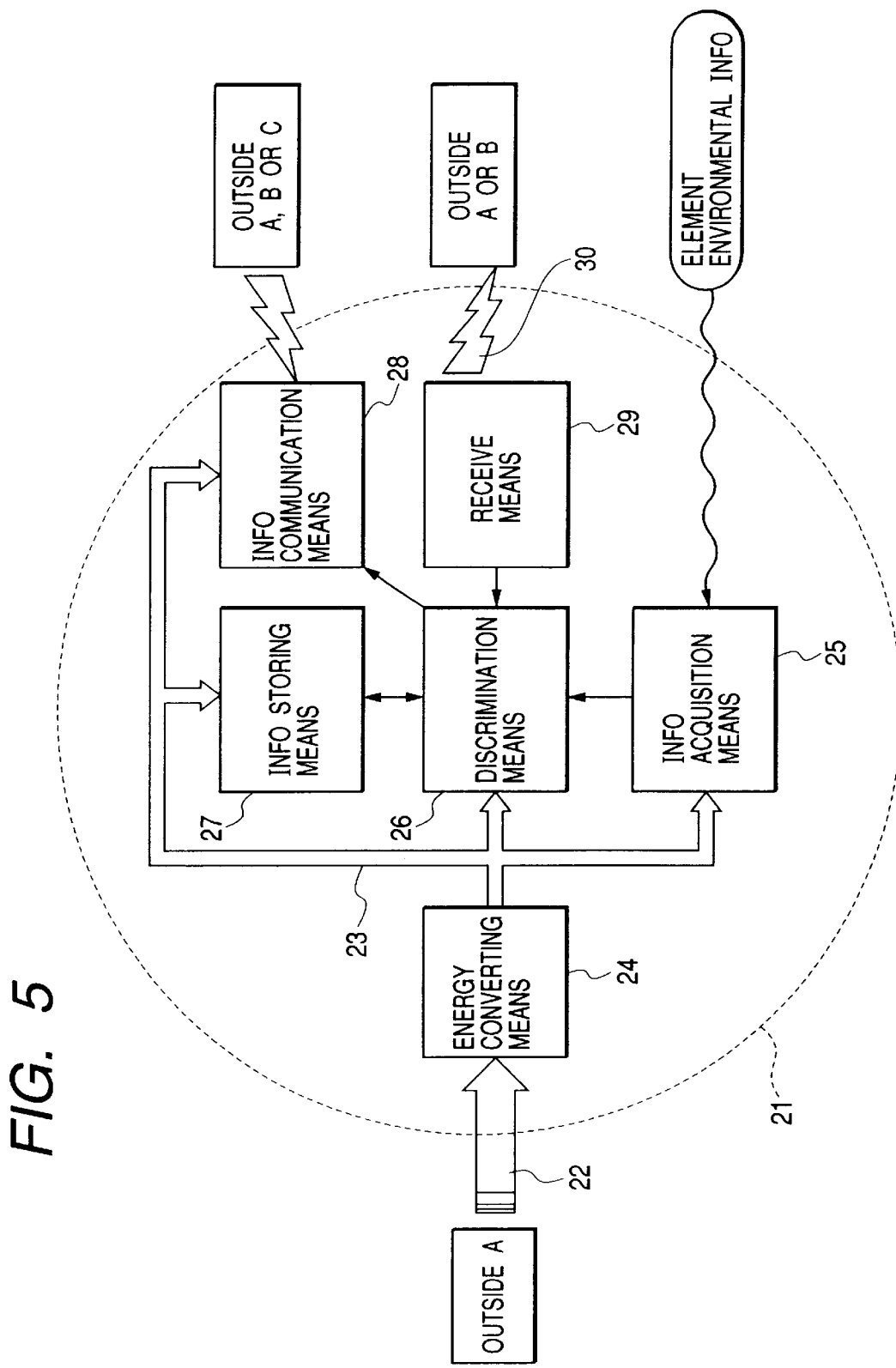
FIG. 5 is a block diagram which shows the inner structure of a solid type semiconductor device in accordance with a second embodiment of the present invention, and also, represents the communicative condition thereof with the outside.

FIG. 5 is a block diagram which shows the inner structure of a solid type semiconductor device in accordance with a second embodiment of the present invention, and also, represents the communicative condition thereof with the outside. The solid type semiconductor device 21 of the present embodiment shown in FIG. 5 comprises energy converting means 24 for converting into electric power 23 the electromotive force 22 which is supplied in non-contact from the outside A toward the device 21; information acquiring means 25 actuated by the electric power which is obtained by energy converting means 24; discriminating means 26; information accumulating means 27; information communicating means 28; and reception means 29. These means are arranged in an ink tank. What differs from the first embodiment is that there is provided a function to receive signals. Also, electromagnetic induction, heat, light, radiation rays, or the like is applicable as the electromotive force which is required to operate the device. Also, it is preferable to form at least energy converting means 24, information acquiring means 25, and reception means 29 on the surface of near the surface. In this respect, it is also preferable to structure information accumulating means 27 by FeRAM formed by ferroelectrics as described above.

Information acquiring means 25 acquires the information inside the ink tank, which is the environmental information surrounding the device 21. Reception means 29 receives input signals 20 from the outside A or outside B. Discriminating means 26 enables information acquiring means 25 to acquire the tank internal information in accordance with the input signals from reception means 29, and compares the tank internal information thus acquired with the information stored on information accumulating means 27 to determine whether or not the acquired tank internal information satisfies the designated conditions. Information accumulating means 27 accumulates various conditions to be compared with the tank internal information to be acquired, as well as the tank internal information acquired from information acquiring means 25. Information communicating means 28 converts electric power by the instruction from discriminating means 26 into energy for communicating to the tank internal information, and then, displays the result of discrimination provided by discriminating means 26 on the outside A, outside B, or outside C and communicates therewith accordingly.

Figure 6:
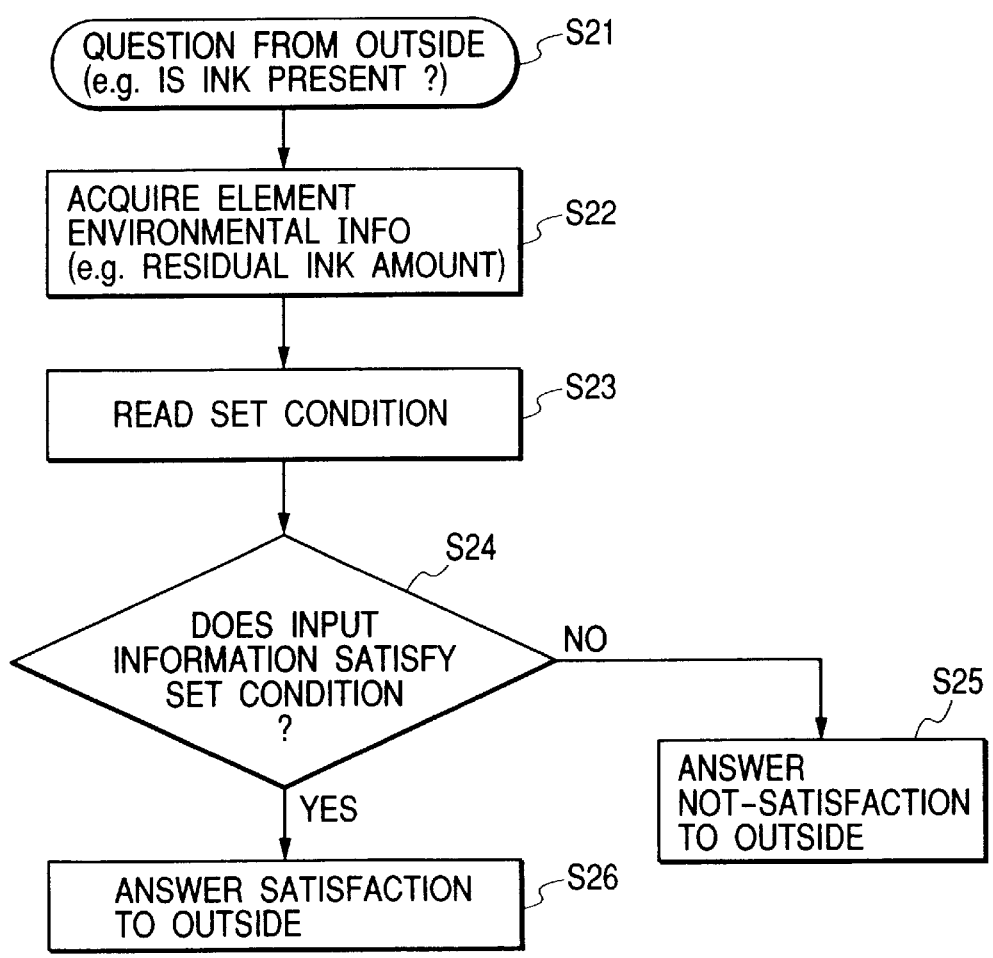
FIG. 6 is a flowchart which illustrates the operation of the device shown in FIG. 5.

FIG. 6 is a flowchart which illustrates the operation of device shown in FIG. 5. In FIG. 5 and FIG. 6, the electromotive force 22 is supplied from the outside A toward the device 21, and then, energy converting means 24 converts the electromotive force 22 to electric power 23. With the electric power thus converted, information acquiring means 25, discriminating means 26, information accumulating means 27, information communicating means 28, and reception means 29 are actuated.

In this condition, the outside A or outside B transmits to the device 21 the signal 30 which is used for inquiring the information inside the ink tank. This input signal 30 is, for example, the signal whereby to inquire whether or not ink still remains in the ink tank, which is received by reception means 29 (step S21 in FIG. 6). Then, discriminating means 26 enables information acquiring means 25 to acquire the information inside the ink tank, such as the amount of ink remainders, the kind of ink, temperature, and pH (step S22 in FIG. 6), and also, to read out the conditions from information accumulating means 27 to which the acquired tank internal information is referenced (step S23 in FIG. 6), thus determining whether or not the acquired information satisfies the set conditions (step S24 in FIG. 6).

If it is found in the step S24 that the acquired information does not satisfy the set conditions, the message of being unsatisfied is communicated to the outside A, outside B or outside C. If it is found that the acquired information satisfies the set conditions, the message is communicated accordingly (step S25 and step S26). At this juncture, it may be possible to communicate with the outside regarding the acquired information together with the result of discrimination. This communication is carried out by the information communicating means 28 which converts the electric power obtained by energy conversion into energy for communicating the information inside the ink tank to the outside. It is possible to use magnetic field, light, shape, color, eclectic wave, sound, or the like as energy for performing this communication, and the communication mode may be changeable in accordance with the result of discrimination, and also, in accordance with the contents of question to be answered (for example, whether or not the ink remainders are less than a designated amount (2 milliliters, for instance) or whether or not the pH of ink has changed or the like).

Also, it may be possible to provide electromotive force for the device 21 together with input signal 30 from the outside A or outside B. For example, the electromotive force may be used separately as signal for inquiring of the ink remainders if it is electromagnetic induction, and as signal for inquiring of the pH condition of ink if it is light.

In accordance with the present embodiment, there is provided the function to receive signals from the outside. Therefore, in addition to the effects obtainable from the first embodiment, it becomes possible for the present embodiment to answer various signalized questions from the outside, hence making it possible to perform communications between the device and outside bidirectionally.

In this respect, the description has been made of the preferable device to be arranged in an ink tank, and therefore the device is assumed to be provided with information acquiring means. However, it is to be understood that the fundamental structure of the present embodiment is the solid type semiconductor device having no information acquiring means, but capable of outputting the information stored in advance on the device to the outside in response to the input signals from the outside.

Third Embodiment

Figure 7:
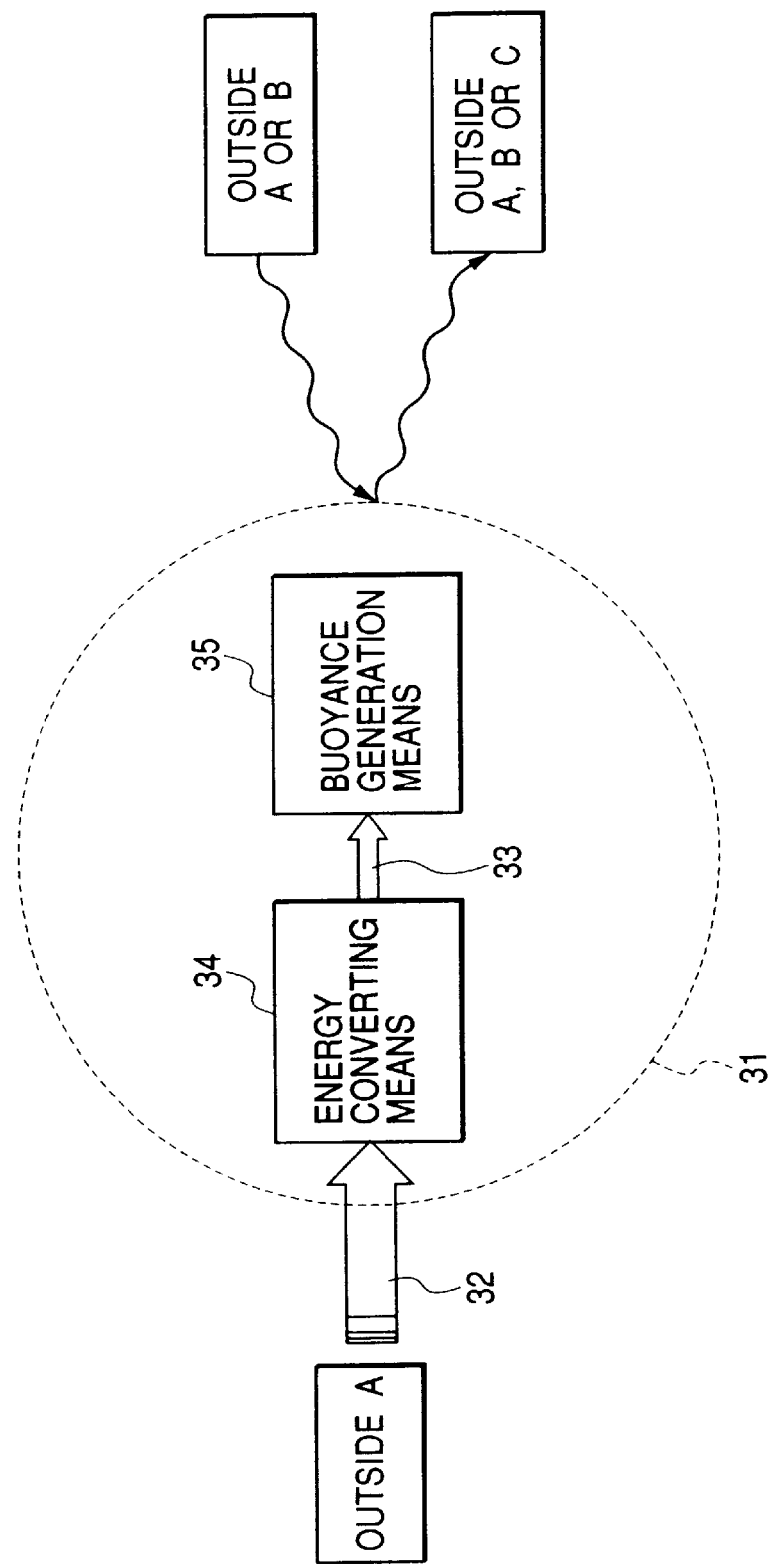
FIG. 7 is a block diagram which shows the inner structure of a solid type semiconductor device in accordance with a third embodiment of the present invention, and also, represents the communicative condition thereof with the outside.

FIG. 7 is a block diagram which shows the inner structure of a solid type semiconductor device in accordance with a third embodiment of the present invention, and also, represents the communicative condition thereof with the outside. The solid type semiconductor device 31 of the present embodiment shown in FIG. 7 comprises energy converting means 34 for converting into electric power 33 the electromotive force 32 which is supplied in non-contact from the outside A toward the device 31; buoyance generating means 35 for generating buoyance by use of the electric power which is obtained by energy converting means 34. These means are arranged in an ink tank.

In accordance with present embodiment, when the electromotive force 32 is provided from the outside A toward the device 31, energy converting means 34 converts the electromotive force 32 into the electric power 33. By use of the electric power 33, buoyance generating means 35 generates buoyance so as to enable the device 31 to float on the ink liquid surface. This buoyance is not necessarily arranged to reside on the ink liquid surface, but enable the device to be positioned below the ink liquid surface by a specific distance under any circumstances so as to prevent discharge from being effectuated in a state where ink is not available.

Figure 8A:
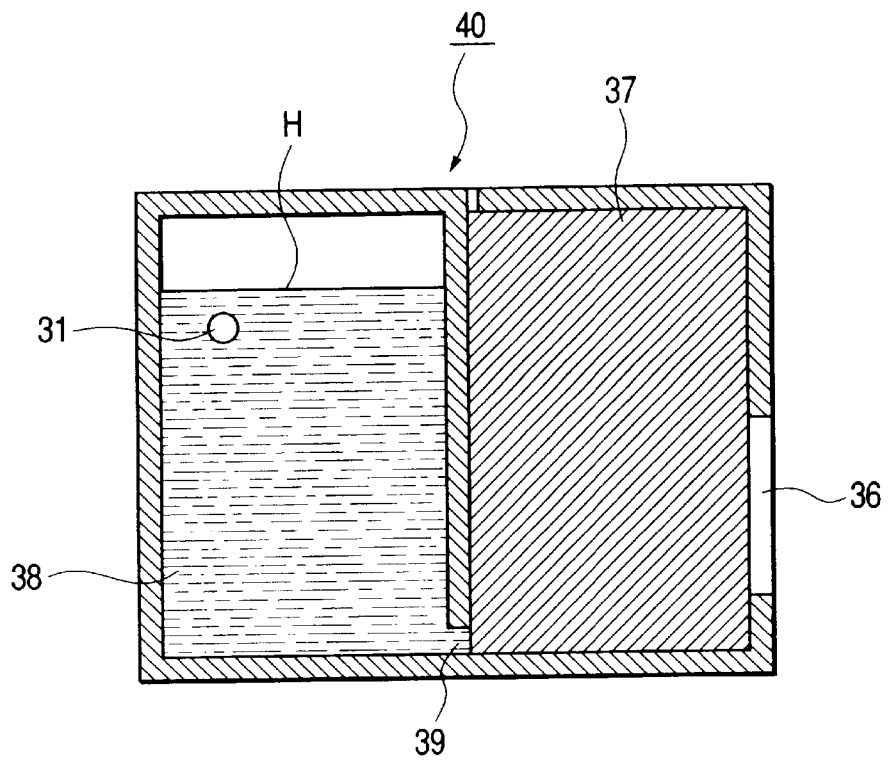
FIGS. 8A and 8B are views which illustrate the positions of the device floating on ink in the ink tank, together with the changes of ink consumption.
Figure 8B:
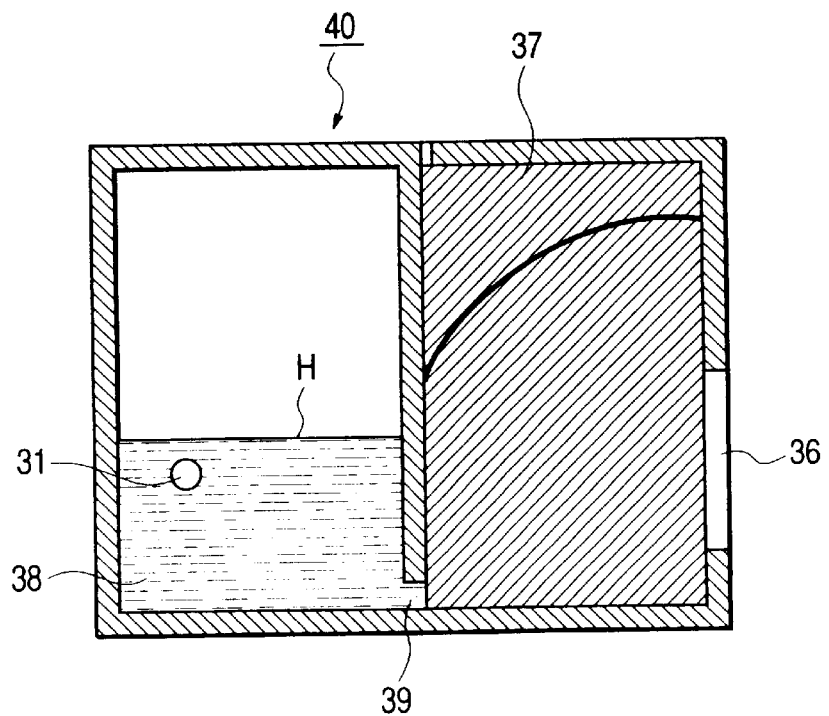

For example, FIG. 8A and FIG. 8B illustrate the positions of device 31 residing in ink in the ink tank along with the changes of ink consumption. In the tank structured with the ink chamber containing ink directly, and the absorbent chamber containing a negative pressure generating member in it, which are communicated by the communicating portion 39 as shown in FIG. 8A, ink is retained in the negative pressure generating member 37 in an amount equivalent to the ink which has been consumed along with ink being led out from the negative pressure generating member 37 through the ink supply port 36. Thus, the solid type semiconductor device 31 in ink 38 moves along with the lowered position of ink liquid surface H due to ink consumption while it still resides below the ink liquid surface H by a specific distance (FIG. 8B).

Figure 9:
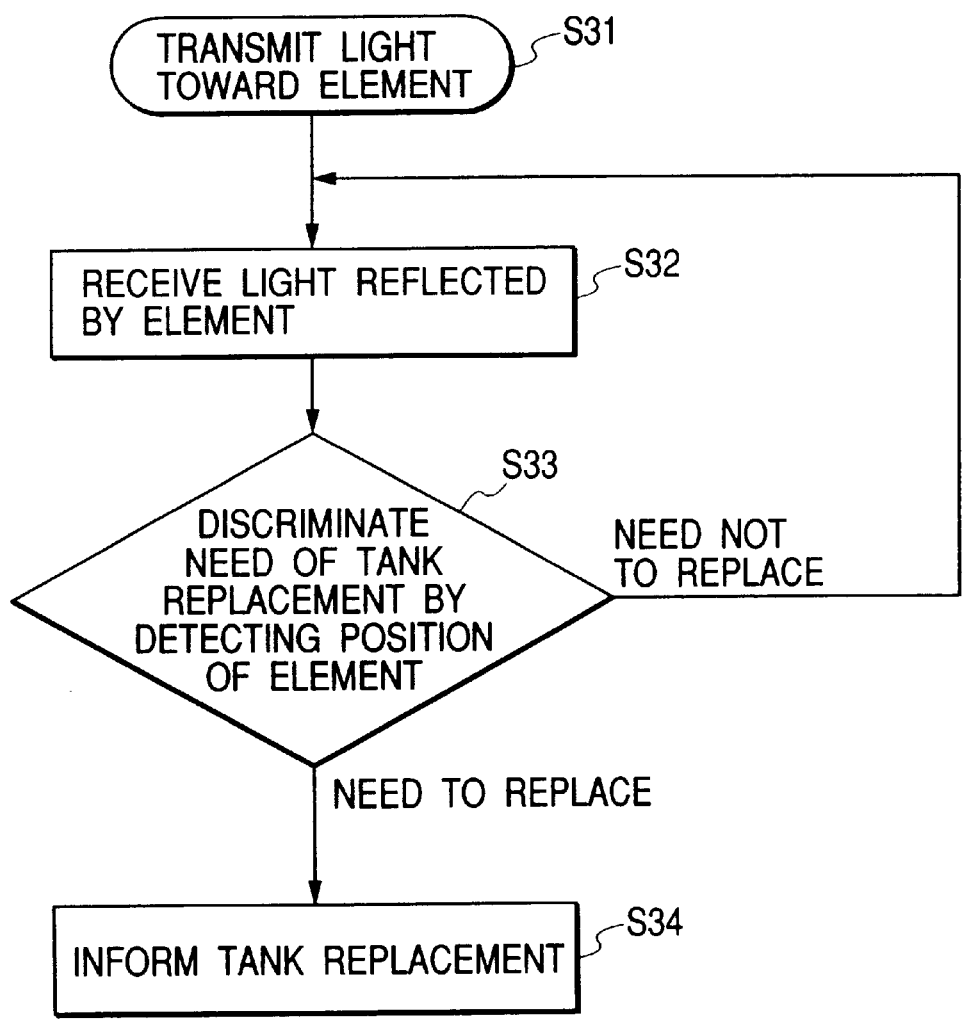
FIG. 9 is a flowchart which shows the process to confirm the position of device structured as represented in FIG. 5, and to determine whether or not the replacement of tanks is needed.

FIG. 9 is a flowchart to confirm the position of device 31, and determine whether or not it is necessary to replace tanks. With reference to steps S31 to S34 in FIG. 7 and FIG. 9, light is emitted from the outside A or outside B (an ink jet recording apparatus, for instance) toward the device 31. Then, the light is received by the outside A, outside B (the ink jet recording apparatus, for instance), or outside C, thus detecting the position of device 31. The ink jet recording apparatus is then allowed to determine whether or not it is necessary to replace tanks or the like by the detected position of device. If it is found necessary to replace tanks, notification is made accordingly by use of sound or light.

For this detection of device positions, light emitting means and photosensitive means are arranged to face each other to confirm the position of device when no light is allowed to pass the device or to confirm it when photosensitive means senses the reflection of light emitted from liquid emitting means. Further, as described later, it may be possible to arrange the structure so that the solid type semiconductor device 31 itself becomes light emitting means, and emits light toward photosensitive means provided outside the tank.

In accordance with the present embodiment, it becomes possible to use the device irrespective of the environment surrounding the device, because the device can be positioned always at a desired location by converting the electromotive force from the outside using energy converting means even when the buoyance or the like required for the device may change due to the difference in gravity of liquid or other environmental conditions where the device is used.

In this respect, the present embodiment may be combined with the first and second embodiments described above.

Fourth Embodiment

Figure 10:
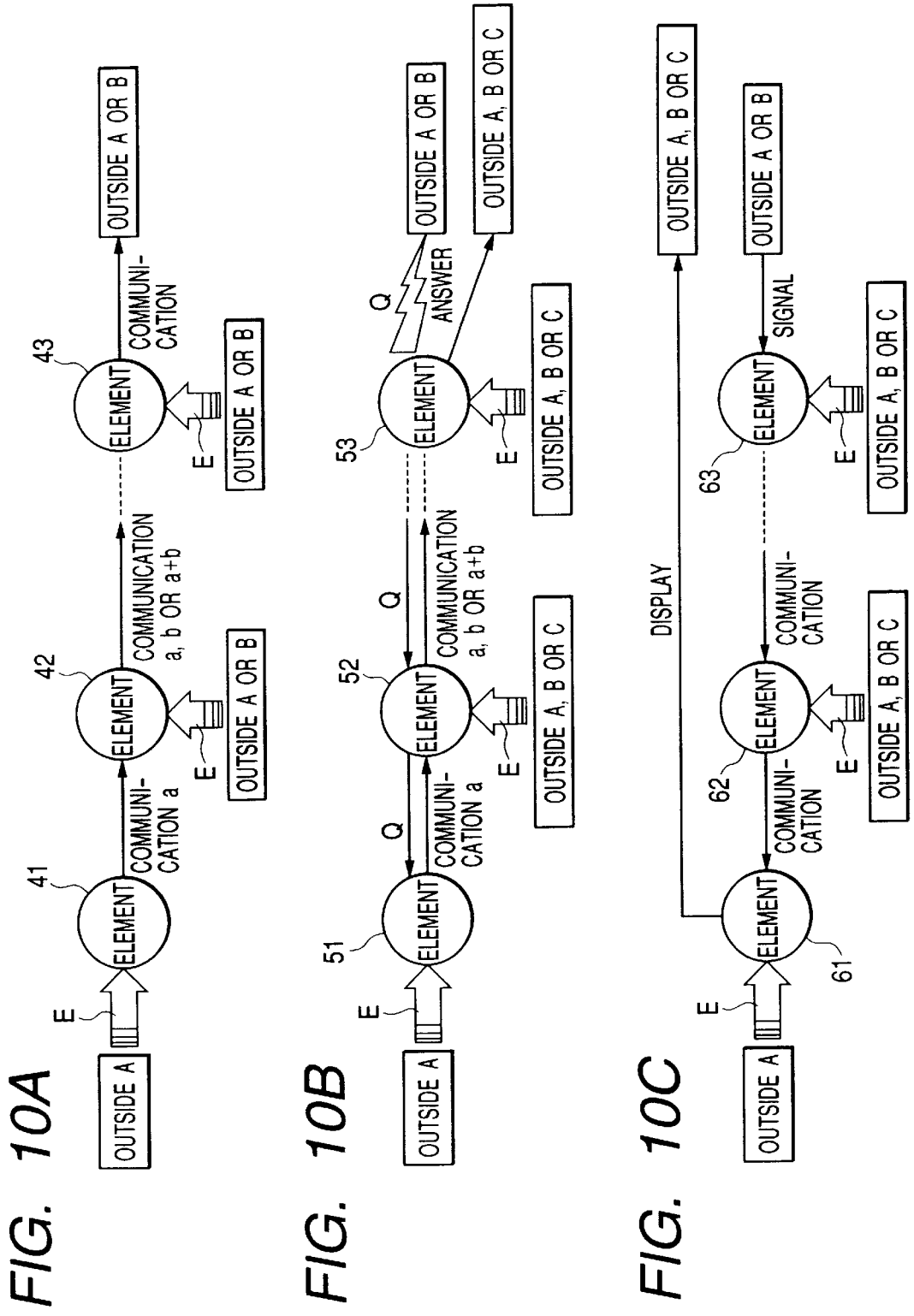
FIGS. 10A, 10B and 10C are conceptual views which illustrate the method for using the solid type semiconductor device in accordance with a fourth embodiment of the present invention.

FIGS. 10A to 10C are conceptual views which illustrate the method for using the solid type semiconductor device in accordance with a fourth embodiment of the present invention.

The present embodiment is structured by adding to the solid type semiconductor device of the first or second embodiment a function to communicate information to other devices, and a plurality of such devices are arranged in an object.

For the example shown in FIG. 10A, a plurality of solid type semiconductor devices of the first embodiment are arranged in the object. When electromotive force E is supplied from the outside A or outside B to each of the devices, each of them acquires the environmental information surrounding each of them, respectively. Then, the acquired information a of the device 41 is communicated to the device 42, and the acquired information a and b of the device 41 and device 42 are communicated to the next device one after another. The last device 43 communicates all the acquired information to the outside A or outside B.

Also, for the example shown in FIG, 10B, a plurality of solid type semiconductor devices of the second embodiment are arranged in an object, and electromotive force E is supplied from the outside A or outside B to each of the devices. Then, when a specifically signalized question Q is inputted from the outside A or outside B to the device 53, for example, the device 51 or device 52, which corresponds to the contents of such question, acquires information corresponding to the question and answers it. The answer from the device 51 or device 52 to such question is communicated to other devices one after another, and the answer is made from the desired device 53 to the outside A, outside B or outside C.

Also, for the example shown in FIG. 10C, a plurality of solid type semiconductor devices of the second embodiment are arranged in an object, and electromotive force E is supplied from the outside A or outside B to each of the devices. Then, when a certain signal is inputted from the outside A or outside B to the device 63, for example, such signal is communicated to the device 62 and device 61 one after another, and displayed from the device 63 on the outside A, outside B or outside C.

Here, for the examples shown in FIGS. 10A to 10C, the solid type semiconductor device of the third embodiment, which is provided with buoyance generating means, may be used as one of plural solid type semiconductor devices.

Figure 11:
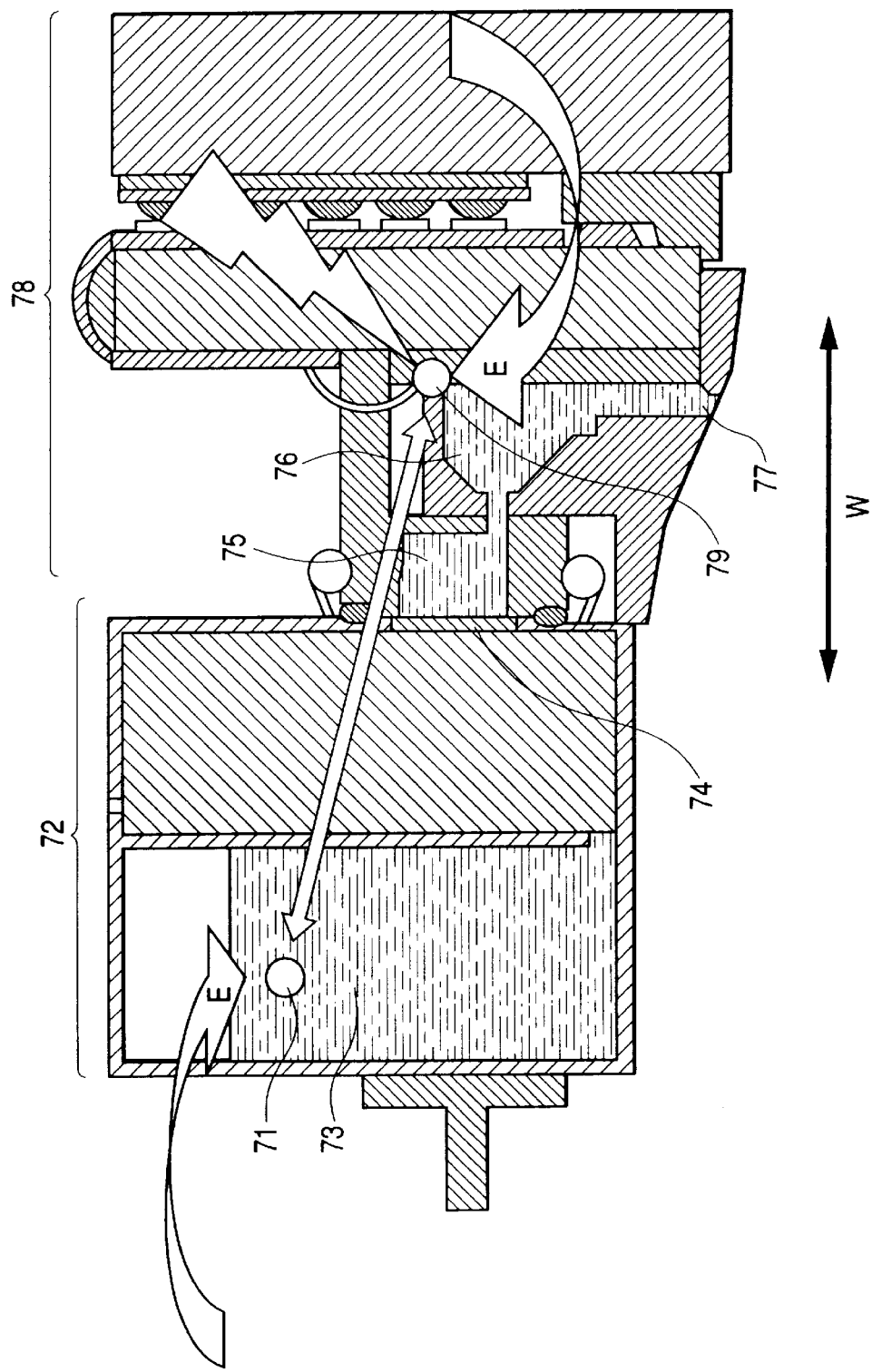
FIG. 11 is a view which shows the example of the solid type semiconductor arranged in an ink tank and the ink jet head which is connected therewith.

Also, FIG. 11 shows the structural example in which solid type semiconductor devices are arranged by appropriately combining those of the first, the second or the third embodiment in an ink tank and a recording head, respectively. In FIG. 11, a reference mark W designates the directions of printing scans, and E, electromotive force. For this example, the solid type semiconductor device 71, which is formed by adding to the first embodiment the device of third embodiment having buoyant generating means, and also, having information communicating function to the other device 79, is arranged in a desired position in ink 73 in the ink tank 72. On the other hand, for the recording head 78 that discharges from the discharge port 77 the ink supplied through the liquid path 75 and liquid chamber 76 connected with the ink supply port 74 of ink tank 72, the solid type semiconductor device 79 is arranged, which is formed by adding ID function (identifying function) to the solid type semiconductor device of second embodiment. The power supply to the device 79 may be made by the contact between the electrode portion arranged on the surface of the device and the contacting portion on the surface of electric base board arranged to drive the recording head 78.

Then, when electromotive force is supplied from the outside to each of the devices 71 and 79, the device 71 in ink acquires ink remainder information, for example, and the device 79 on the recording head side communicates to the device 71 the ID information which is needed for determining the replacement of ink tanks. Then, the device 71 compares the acquired ink remainder information with the ID information. If there is agreement between them, it communicates with the device 79 to instruct the outside for the tank replacement. When receiving such communication, the device 79 transmits signals to the outside for the tank replacement or outputs sound or light to appeal the eyesight or auditory sense of human being accordingly.

As described above, with the arrangement of plural devices in an object, it becomes possible to define complicated informational conditions.

Figure 12:
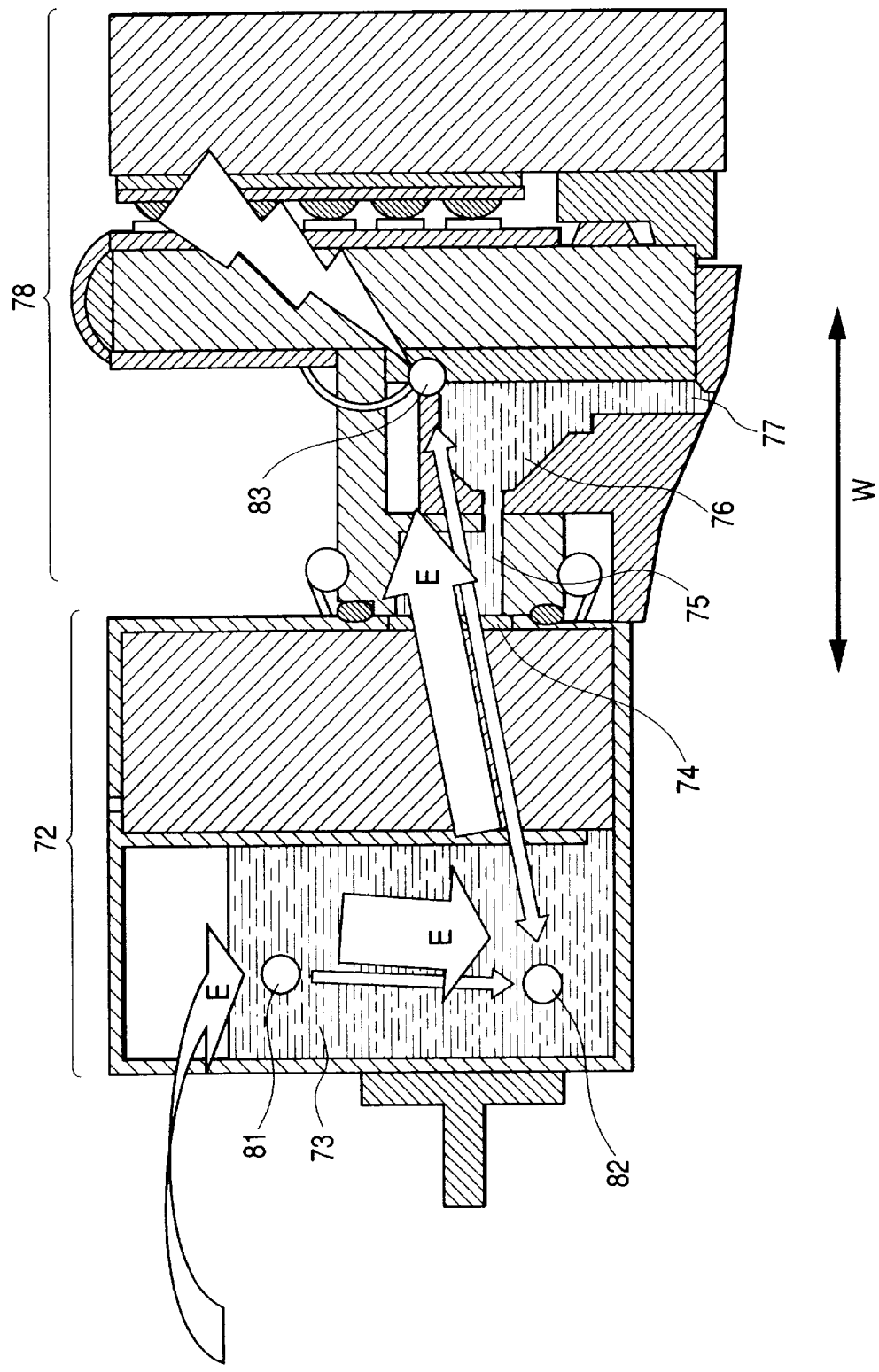
FIG. 12 is a view which shows the structural example of transmitting the electromotive force and information provided for a certain solid type semiconductor device in an ink tank and the ink jet head which is connected therewith to the other solid type semiconductor device sequentially.
Figure 13:
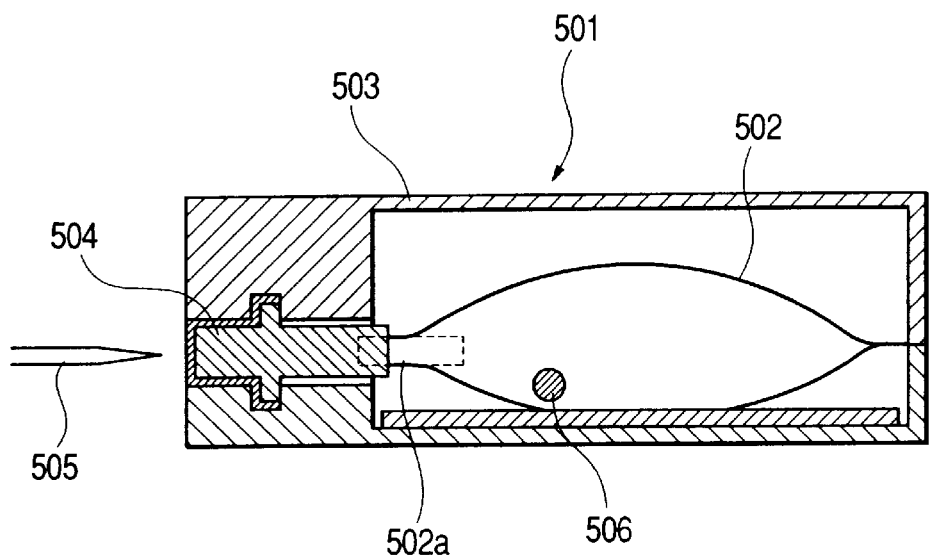
FIG. 13 is a view which shows one example of the ink tank in which solid type semiconductor device can be arrange preferably.

Also, the examples shown in FIGS. 10A to 10C and FIG. 11 are structured to supply electromotive force to each of solid type semiconductors, but the arrangement is not necessarily limited thereto. It may be possible to arrange structure so that the electromotive force supplied to a certain device is transmitted to the other devices one after another together with required information. For example, as shown in FIG. 12, the solid type semiconductor device 81, which is formed by adding to the first embodiment the buoyance generating means of third embodiment, function to communicate information to other devices, as well as electromotive force supplying function, and the solid type semiconductor device 82, which is formed by adding to the second embodiment the buoyance generating means of third embodiment, function to communicate information to other devices, as well as electromotive force supplying function, are arranged in ink 73 in the ink tank 72 in the same way as shown in FIG. 11, respectively. On the other hand, for the recording head 78 which is connected with the ink tank 72, there is arranged the solid type semiconductor device 83 of second embodiment which is provided with the ID function (identifying function). The electric power supply to the device 83 may be made by contacting the electrode portion on the surface of the device with the contacting portion on the electric base board arranged to drive the recording head 78. In FIG. 12, a reference mark E designates electromotive force, and W, the directions of printing scans.

Then, when electromotive force is supplied from the outside to the device 81, the device 81 which resides in ink acquires ink remainder information, for example, and compares this information with the regulated inner conditions, and if communication with the other devices is found necessary, the ink remainder information thus acquired is communicated to the device 82 together with electromotive force to operate the device 82. The device 82 which has received the supply of electromotive force receives the ink remainder information communicated from the device 81, and at the same time, acquires information regarding pH of ink, for example, and then, transmits electromotive force to the device 83 on the recording head side to operate the device 83. Thus, the device 83 on the recording head side, which receives electromotive force thus supplied, communicates ID information to the device 82 for determining the ink remainders which necessitates the replacement of tanks or determining the current pH of ink. Then, the device 82 compares the acquired ink remainder information and pH information with the ID information thus communicated, and if in agreement, communicate with the device 83 to instruct the outside for replacing tanks. Receiving this instruction, the device 83 transmits signals to the outside for replacing tanks or outputs sound, light, or the like to appeal the eyesight or auditory sense of human being accordingly. In this way, conceivably, there is a method for supplying electromotive force from a certain device to other devices together with required information.

In this respect, it is possible for the recording head 78 to adopt the discharge mode known in the field of ink jet recording, in which ink is bubbled in liquid flow path by the application of heat generated by heater or the like, such as electrothermal converting device, thus discharging ink from each of fine openings communicated with each of the liquid flow path, respectively, or to adopt the structure in which ink is discharged by driving piezoelectric device.

FIG. 13 to FIG. 16 are views which illustrate the structure of an ink tank to which the solid type semiconductor device of the above embodiments is applicable. The ink tank 501 shown in FIG. 13 has a flexible ink bug 502 containing ink therein arranged in a housing 503, and the bug opening 502a is closed by means of a rubber plug 504 fixed to the housing 503. Then, when the hollow needle 505 which is used for leading out ink is pierced through the rubber plug 504, ink is supplied to an ink jet head (not shown). The solid type semiconductor device 506 of the present invention can be arranged in the ink bug 502 of such ink tank 501 as this.

Figure 14:
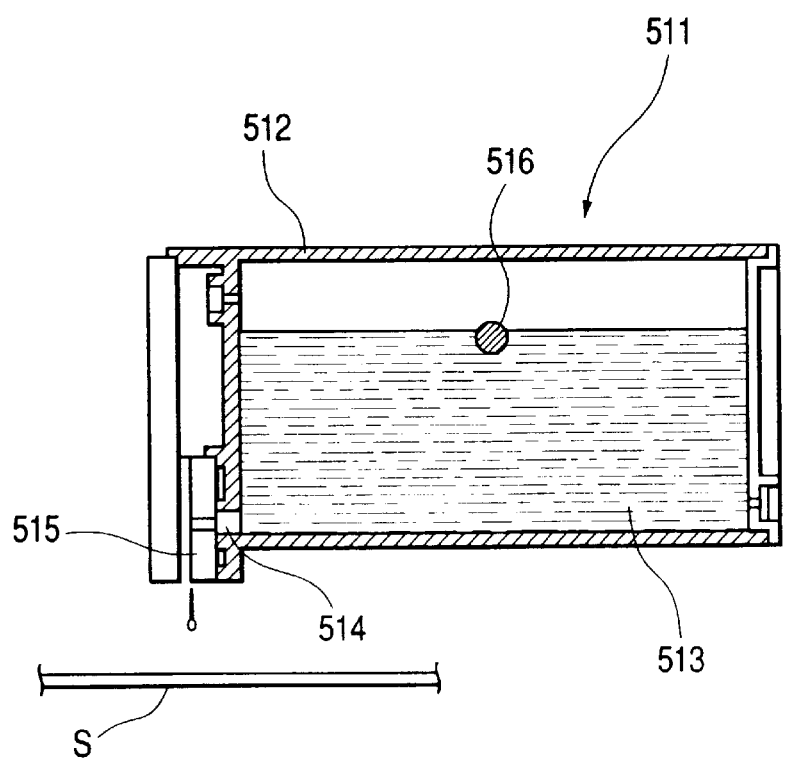
FIG. 14 is a view which shows another example of the ink tank in which solid type semiconductor device can be arrange preferably.

Also, an ink tank 511 shown in FIG. 14 is such that the ink jet head 515 that records by discharging ink to a recording sheet S is installed on the ink supply port 514 of the housing 512 containing ink 513. It is possible to arrange the solid type semiconductor device 516 of the present invention in ink 513 in the tank 511.

Figure 15:
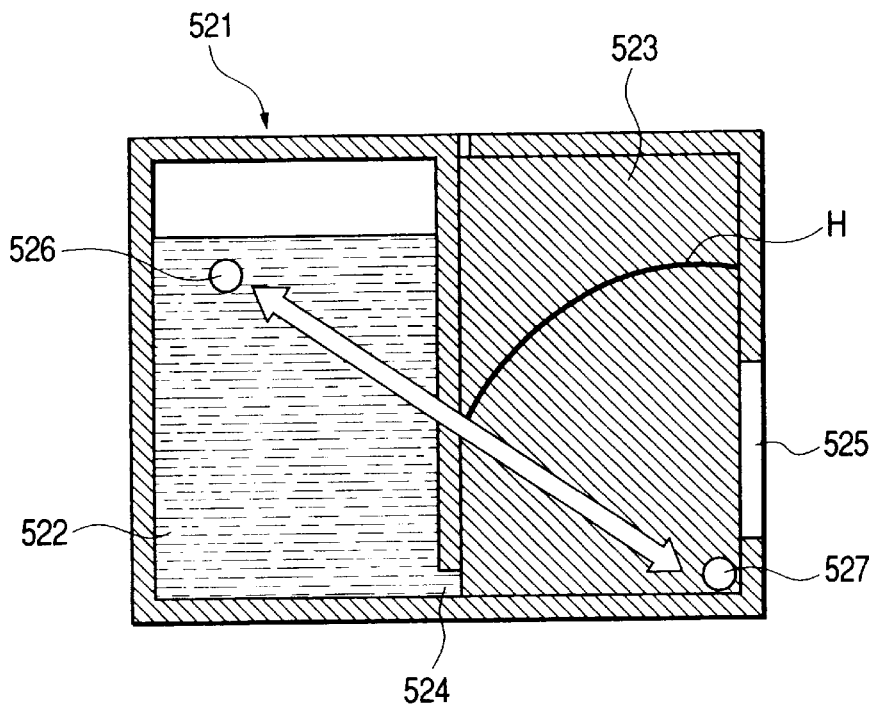
FIG. 15 is a view which shows still another example of the ink tank in which solid type semiconductor device can be arrange preferably.

Also, an ink tank 521 shown in FIG. 15 is the same tank as the one shown in FIGS. 8A and 8B, FIG. 11, and FIG. 12, which comprises a completely closed first chamber for containing ink 522; a second chamber containing a negative pressure generating member 523 in a state of being communicated with the air outside; and the communicative passage 524 to enable the first chamber and the second chamber to be communicated on the lowest portion of the tank. When ink is consumed from the ink supply port 525 on the second chamber side, ink 522 in the first chamber is led out to the second chamber in place of the air outside that enters the first chamber from the second chamber side. In the tank 521 structured in this manner, the solid type semiconductors 525 and 526 are arranged each in the first chamber and the second chamber, respectively. It is advisable to let them communicate with each other regarding ink in each of the separated chambers.

Figure 16:
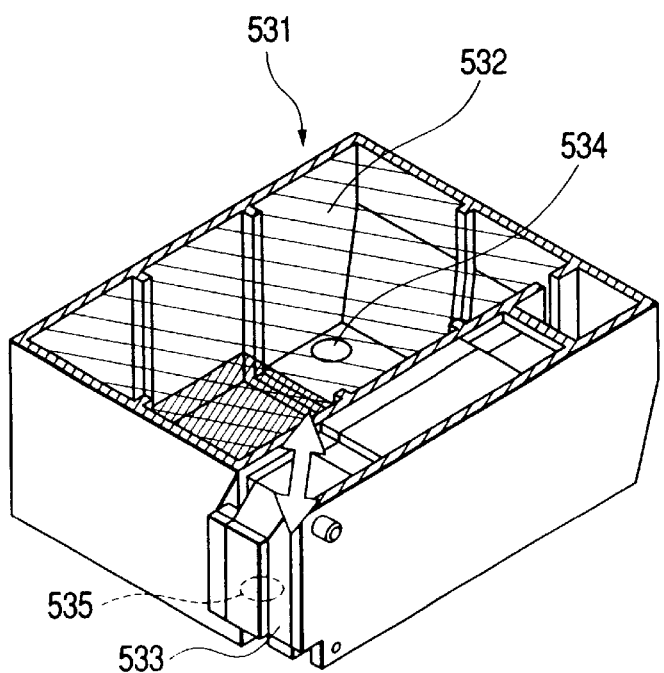
FIG. 16 is a view which shows a further example of the ink tank in which solid type semiconductor device can be arrange preferably.

Also, an ink tank 531 shown in FIG. 16 is such that a porous member 532 retaining ink is housed, and then, an ink jet head 533 is installed thereon to use ink thus retained for recording. In the tank 531 structured in this manner, the solid type semiconductors 534 and 535 are arranged each in the ink tank side and the ink jet head side, respectively. It is advisable to let them communicate with each other regarding ink in each of the separated structures.

Figure 17:
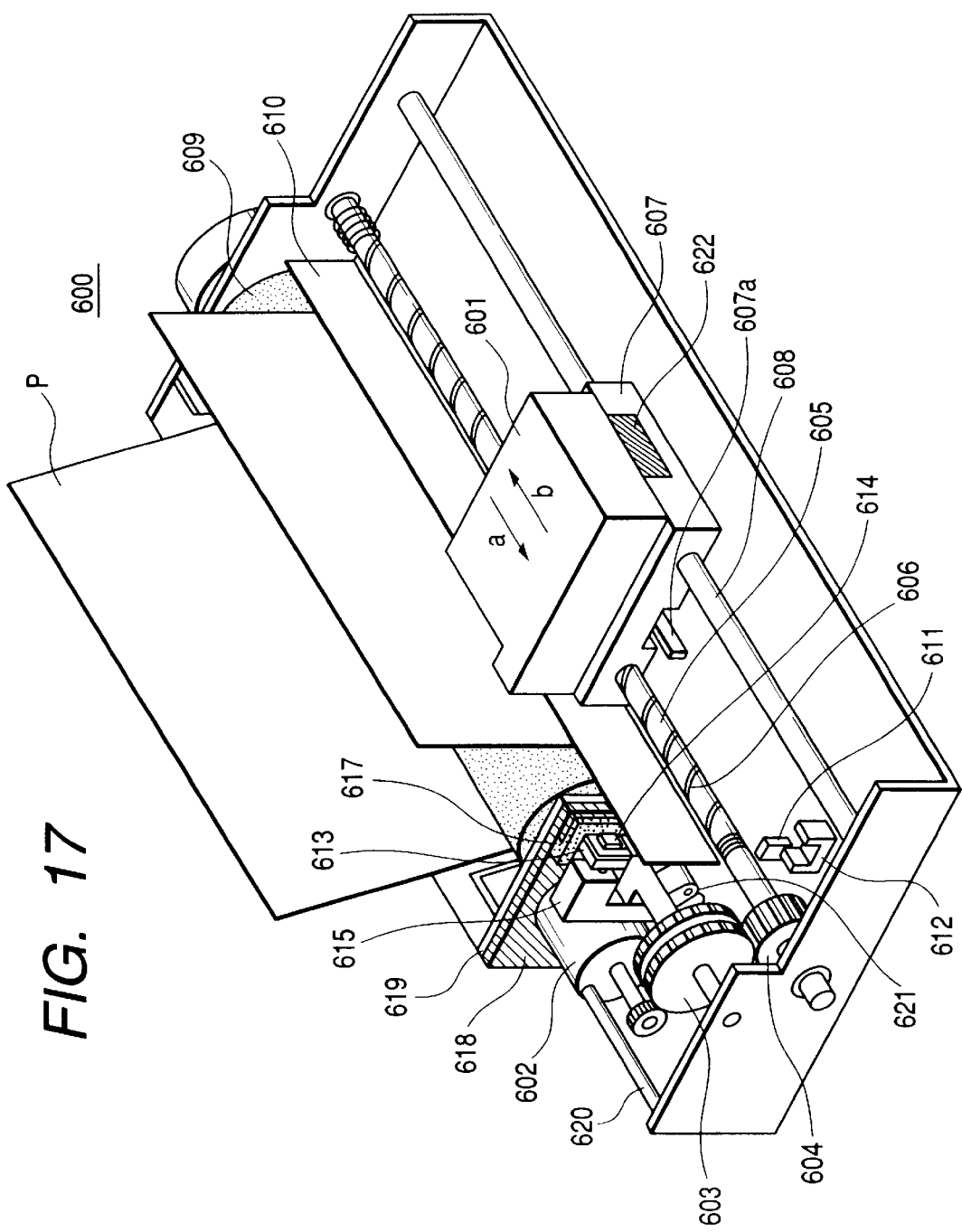
FIG. 17 is a perspective view which shows one example of the ink jet recording apparatus on which the ink tank is mounted.

Now, FIG. 17 is a view which schematically shows the structure of an ink jet recording apparatus having mounted thereon the ink tank which is provided with the solid type semiconductor device of the present invention. The head cartridge 601 which mounted on the ink jet recording apparatus 600 shown in FIG. 17 comprises a liquid discharge head to discharge ink for recording prints, and an ink tank as shown in FIG. 13 to FIG. 16 in order to retain liquid to be supplied to the liquid discharge head. Also, in the recording apparatus 600, there are arranged means 622 for supplying electromotive force serving as external energy to the solid type semiconductor device (devices) arranged in the ink tank, and means (not shown) for communicating information to and from such device bidirectionally.

As shown in FIG. 17, the head cartridge 601 is mounted on the carriage 607 which engages with the spiral groove 606 of a lead screw 605 rotative through the driving power transmission gears 603 and 604 which are interlocked with the regular and reverse rotations of a driving motor 602. The head cartridge 601 reciprocates by driving of the driving motor 602 together with the carriage 607 along the guide 608 in the directions indicated by arrows a and b. The ink jet recording apparatus 600 is provided with means for carrying recording medium (not shown) for carrying a printing sheet P serving as the recording medium that receives liquid, such as ink, discharged from the cartridge 601. The pressure plate 610 for the printing sheet P carried on a platen 609 by means for carrying recording medium is arranged to press the printing sheet P to the platen 609 over the traveling directions of the carriage 607.

In the vicinity of on end of the lead screw 605, photocouplers 611 and 612 are arranged. The photocouplers 611 and 612 constitutes the home position detecting means which recognizes the presence of the lever 607 a of carriage 607 in the region formed by the photocouplers 611 and 612 in order to switch the rotational directions of driving motor 602. In the vicinity of one end of the platen 609, a supporting member 613 is arranged to support the cap member 614 that covers the front end of discharge ports of head cartridge 601. Also, ink suction means 615 is arranged to suck ink residing inside the cap member 614 due to idle discharges from the head cartridge 601 or the like. With this ink suction means 615, the suction recovery is carried out for the head cartridge 601 through the opening of cap member 614.

For the ink jet recording apparatus 600, a main body supporting member 619 is provided. For this main body supporting member 619, a movable member 618 is movably supported in the front and backward directions, that is, in the direction at right angles to the traveling direction of the carriage 607. On the movable member 618, a cleaning blade 617 is installed. The mode of cleaning blade 617 is not necessarily limited thereto. Any known modes of cleaning blade may be usable. Further, the lever 620 is arranged for initiating suction when suction recovery operation is carried out by use of ink suction means 615. Then, the lever 620 moves along with the movement of the cam 621 with which the carriage 607 engages, and the movement thereof is controlled by known transmission means, such as clutch switching of driving power from the driving motor 602. On the recording apparatus main body side, an ink jet recording controller is arranged to transmit signals to the heat generating elements which are provided for the head cartridge 601, and also, execute the driving controls of each of the mechanisms described earlier. This controller is not shown in FIG. 17.

The ink jet recording apparatus 600 thus structured enables the head cartridge 601 to reciprocate over the entire width of a printing sheet P. The printing sheet P is carried on the platen 609 by use of the aforesaid means for carrying recording medium. When driving signals are supplied from means for supplying driving signals (not shown) to the head cartridge 601 at the time of this movement, ink (recording liquid) is discharged from the liquid discharge head unit to the recording medium for recording in accordance with such signals.

Fifth Embodiment

Figure 18:
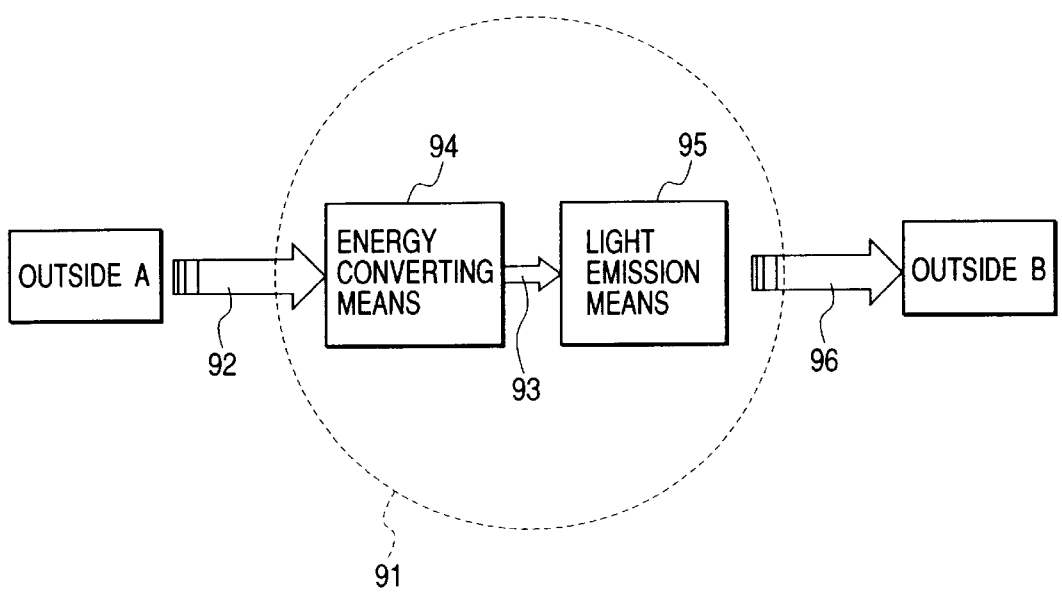
FIG. 18 is a conceptual view which illustrates the method for using the solid type semiconductor device in accordance with a fifth embodiment of the present invention.

FIG. 18 is a block diagram which shows the inner structure of the solid type semiconductor device in accordance with a fifth embodiment of the present invention, and the communication thereof with the outside. The solid type semiconductor device 91 shown in FIG. 18 comprises energy converting means 94 for converting into electric power 93 the electromotive force 92 which is external energy supplied in non-contact from the outside A toward the device 91; and light emitting means 95 for emitting light by use of the electric power which is obtained by energy converting mean 94. The device is arranged ink in an ink tank. Light emitting means 95 is formed by photodiode or the like.

In this respect, electromagnetic induction, heat, light, radiation rays, or the like is usable as the electromotive force which is supplied to operate the device. Also, it is desirable to form energy converting means 94 and light emitting means 95 on the surface of device or near thereto.

In the present embodiment, when electromotive force 92 is given from the outside A toward the device 91, energy converting means 94 converts electromotive force 92 into electric power 93. Then, using the electric power 93 light emitting means 95 emits light 96. The intensity of light 96 thus emitted from light emitting means 95 is detected by the outside B.

Figure 19:
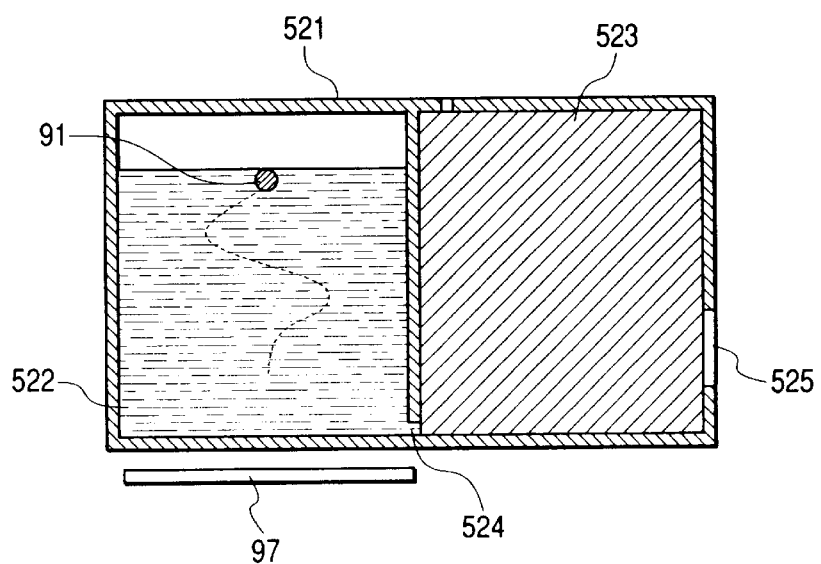
FIG. 19 is a structural view which schematically shows the ink tank which uses the solid type semiconductor device of the fifth embodiment.

FIG. 19 is a structural view which schematically shows the ink tank that uses the solid type semiconductor device 91 illustrated in accordance with the fifth embodiment. The solid type semiconductor device 91 shown in FIG. 19 floats near the liquid surface of raw ink 522 in the ink tank 521, and electromotive force is induced by electromagnetic induction provided by external resonance circuit (not shown) outside the ink tank 521. Then, the photodiode which is arranged near the surface of solid type semiconductor device 91 is driven to emit light. The light transmits through ink 522 to be received by the external photosensor 97 of the ink tank 521.

Figure 20:
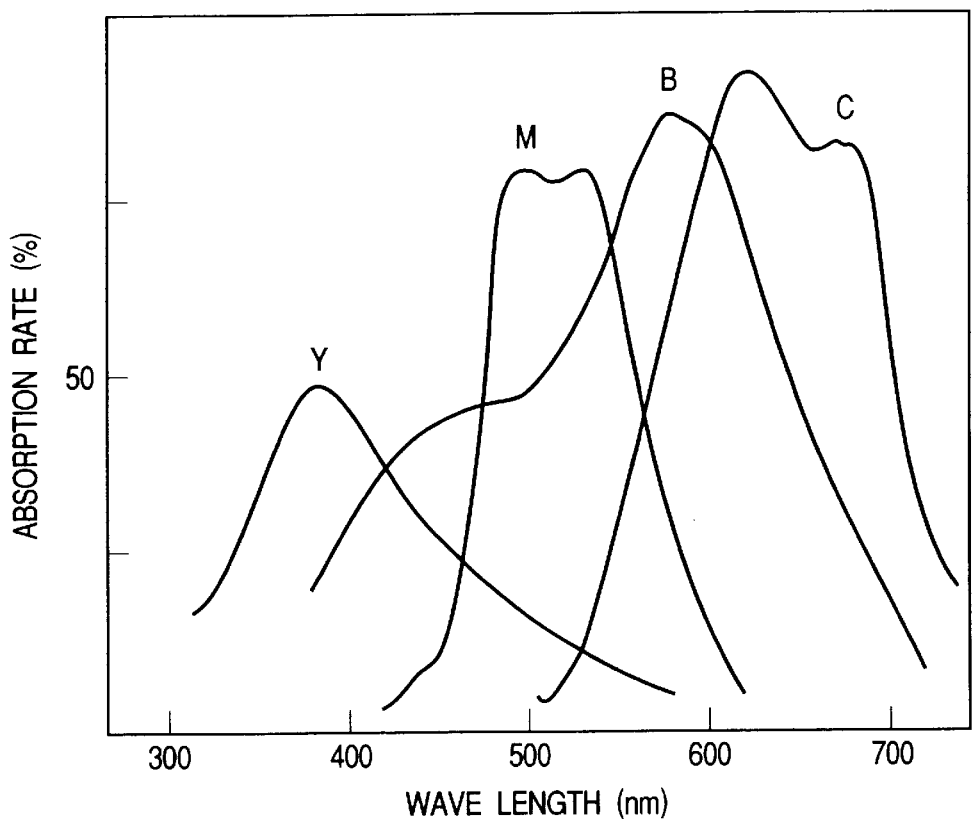
FIG. 20 is a graph which shows the extinction wavelength of typical ink (yellow, magenta, cyan, and black).

FIG. 20 is a view which shows the extinction wavelength (absorbance spectrum) of typical ink (yellow (Y), magenta (M), cyan (C), and black (B)). As understandable from the representation of FIG. 20, the peak of extinction ratio of each color ink, yellow, magenta, cyan, and black, is dispersed in the wavelength band of 300 to 700 nm. The peak of extinction ratio of yellow is approximately 390 nm, magenta approximately 500 nm, black approximately 590 nm, and cyan approximately 620 nm. Thus, the light the wavelength of which is included in a range of 300 to 700 nm is emitted from the solid type semiconductor device, and then, such light is received by the light sensor 97 (see FIG. 19) outside the ink tank after being transmitted through ink for detection of the most absorbed wavelength. In this manner, it is possible to discriminate the ink color through which the light has transmitted among the aforesaid colors of ink.

Also, as clear from FIG. 20, the extinction ratio of each ink of yellow, magenta, cyan, and black colors is distinctly different at the wavelength of 500 nm. The extinction ratio of each ink color at the wavelength of 500 nm is: magenta approximately 80%, black approximately 50%, yellow approximately 20%, and cyan approximately 5%. Therefore, with the detection of intensity rate (transmissivity) of transmitted light through ink against the intensity of light emitted from the solid type semiconductor device with respect to light having wavelength of 500 nm, it is possible to discriminate the color of ink that allows the light to transmit through from ink of those colors described above.

Here, in either case described above, it is possible to discriminate plural kinds of ink by arranging one kind of solid type semiconductor device each in different ink tanks, respectively.

Also, for the ink jet recording apparatus which is structured to install each of plural ink tanks on each designated position in accordance with the kind of ink contained in each of such ink tanks, it is advisable to arrange means for issuing warning to the user by use of the light sensor 97 that receives light transmitted through ink in the ink tank when it is detected that the ink tank is not installed adequately as designated. As warning means in this case, light emitting means such as lamp or sounding means such as buzzer may be useable. The user notices by the warning thus issued by such means that the ink tank is installed on an inadequate position so that he can install it again on the designated position exactly.

Or, it may be possible for an ink jet recording apparatus of the kind to arrange control means for controlling the recording head depending on the kind of ink to be supplied to such recording head from the ink tank installed thereon when it is detected by the light sensor that receives light transmitted through ink in the ink tank that the ink tank is installed on an inadequate position. With this control, recovery operation is automatically carried out even when the user should install the ink tank on an inadequate position so that an appropriate image recording becomes possible once ink in the recording head is refreshed, and that user is no longer very sensitive to the installing position of ink tank.

As described above, in accordance with the present invention, there are provided energy converting means for converting external energy into different kind of energy, and light emitting means for emitting light by use of energy thus converted by energy converting means. Therefore, it becomes possible to discriminate the kinds of ink by detecting the intensity of wavelength of transmitted light after light emitted from the solid type semiconductor device is allowed to transmit ink.

The solid type semiconductor device described in accordance with the fifth embodiment, for which light emitting means is provided, may be usable as given below in addition to the utilization thereof in the ink tank for the discrimination of the kind of ink therein.

For example, with the provision of this device, it is possible to measure the changes of continuous flow of fluid following the Reynolds fluidity. In other words, the solid type semiconductor device provided with light emitting means is buried on the side face of a tube in which liquid flows so that the device is exposed in the tube, and then, on the opposite face thereof, a photosensitive device (this device may also be formed by the solid type semiconductor itself) is arranged. Here, for example, it becomes possible then to adjust the liquid flow when gasoline and air are mixed for use of automobile engine or to detect the clogging condition of liquid pipe, such as city water pipe.

Also, for example, the device is preferably usable when data should be obtained by simulating the behavior of a structure or the like. In this case, for example, solid type semiconductors each provided with light emitting means of a designated wavelength are appropriately arranged for the designated locations of a member required to perform a specific operation, and then, the structure is driven to operate for obtaining data by detecting the behavior of the devices. Here, the result is obtainable by utilizing solid type semiconductor devices each capable of executing assigned functions in non-contact with the outside. More specifically, it is possible to detect the behavior of driving elements that operate for discharge the ink which has been distributed in the interior of an ink jet head. For example, the devices each provided with light emitting means having wavelength of 300 nm, 400 nm, 500 nm, and 600 nm, respectively, are appropriately arranged for the driving elements, and then, by detecting light from the discharge port side, it becomes possible to measure the movement of each element for acquiring the behavioral information of each driving element.

Sixth Embodiment

Figure 21:
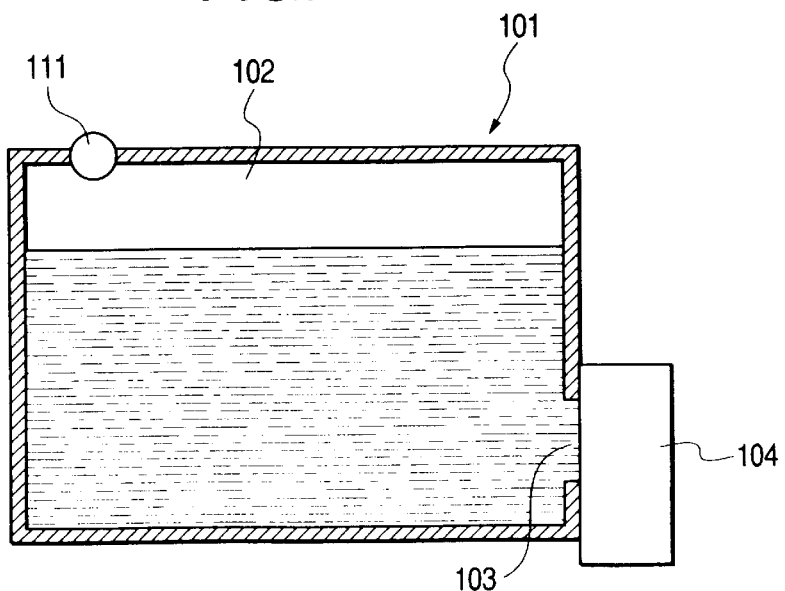
FIG. 21 is a cross-sectional view which shows the ink tank schematically in accordance with a sixth embodiment of the present invention.
Figure 22:
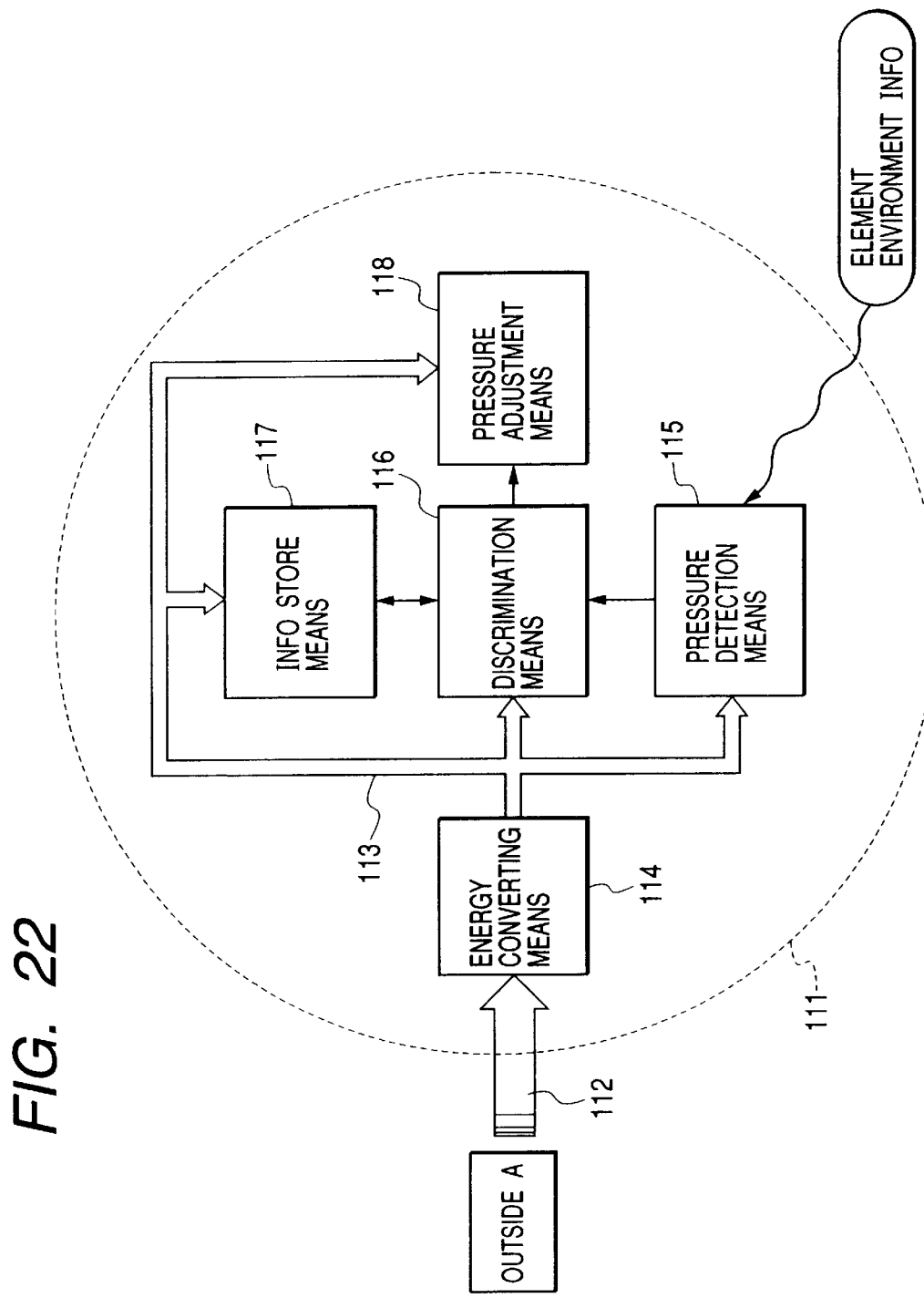
FIG. 22 is a block diagram which shows the inner structure of a solid type semiconductor device in accordance with the sixth embodiment of the present invention, and also, represents the communicative condition thereof with the outside.

FIG. 21 is a cross-sectional view which shows the ink tank schematically, to which the solid type semiconductor device in accordance with a sixth embodiment of the present invention is applicable. FIG. 22 is a structural block diagram which shows the inner structure of the solid type semiconductor device represented in FIG. 21, and the communicative condition thereof with the outside.

As shown in FIG. 21, the ink tank 101 comprises an ink containing chamber 102 that contains ink, and the ink supply port 103 through which ink in the ink containing chamber 102 is supplied to an ink recording head 104. The recording head 104 is connected detachably to the ink tank 101 or connected fixedly to the ink supply port 103. Recording is made on a recording medium by discharging from a plurality of discharge ports (not shown) the ink which is supplied from the ink tank 101 in accordance with recording signals. For the recording head 104, ink supplied from the ink tank 101 is retained in each of the discharge ports by the balance between capillary phenomenon and surface tension. In order to prevent ink leakage from the recording head 104 at the time when recording is not in operation, the interior of ink containing chamber 102 is kept in negative pressure.

Also, for the ink tank 101, the solid type semiconductor device (hereinafter referred to simply as "device") 111 is fixed in the state where a part thereof is exposed outside the ink tank 101, while another part is exposed in the interior of ink containing chamber 102. Although the fixing position of the device 111 is not necessarily limited, but at least the portion which is exposed in the ink containing chamber 102 is positioned so as not to be in contact with ink when the ink tank 101 is in use or preferably, on the upper wall portion of ink tank 101 when it is in use.

The ink tank 101 is a container the interior of which is essentially closed, and in order to prevent ink leakage from the discharge ports of recording head 104 when recording is not in operation, the interior of ink containing chamber 102 is kept at a designated negative pressure. However, since the ink tank 101 is a container the interior of which is essentially closed, the internal pressure of ink tank 101 is reduced along with the consumption of ink in the ink containing chamber 102. In other words, the negative pressure becomes higher. If the negative pressure in the ink tank 101 becomes too high, ink is not easily discharged if even it is intended to discharge ink from the recording head 104, and the event is encountered in some cases that ink cannot be discharged ultimately. Therefore, the device 111 of the present embodiment is provided with the function to detect the inner pressure of ink tank 101, and then, to communicate the inner and outer side of ink tank 101 in accordance with the result of such detection, thus suppressing the negative pressure in ink tank 101 to rise.

Now, with reference to FIG. 22, the functional structure of the device 111 will be described.

In FIG. 22, the device 111 comprises energy converting means 114 for converting into electric power 113 the electromotive force 112 which is supplied in non-contact from the outside A of ink tank 101 toward the device 111; pressure detecting means 115 actuated electric power 113 converted by energy contenting means 114; discriminating means 116; information accumulating means 117; and pressure adjustment means 118. For the electromotive force which is supplied to operate the device 111, electromagnetic induction, heat, light, radiation rays, or the like is usable. Also, at least, energy converting means 114 should preferably formed on the surface or near the surface of the device 111. In this respect, it is one of preferable structures that information accumulating means 117 is formed by FeRAM as described earlier.

Pressure detecting means 115 detects the pressure inside the ink tank, which is the environmental information surrounding the device 111, and outputs it to discriminating means 116. As pressure detecting means 115, the pressure sensor can be cited, which has diaphragm on the surface of the device 111, for example, and detects pressure by the displacement of diaphragm based on the pressure changes. Discriminating means 116 compares the tank internal pressure information thus detected by pressure detecting means 115 with the information stored on information accumulating means 117, and determines whether or not the detected information of tank internal pressure to pressure adjustment means 118. Information accumulating means 117 accumulates the condition of internal pressure which is the upper limit of negative pressure set for discharging ink from the recording head 104 installed on the ink tank 101, and also, the tank internal information itself detected by pressure detecting means 115.

Pressure adjustment means 118 is driven by electric power given by energy converting means 114 and adjusts the internal pressure of ink tank 101 in accordance with the instruction from discriminating means 116. As pressure adjustment means 118, a valve mechanism can be used, for example, so as to enable the interior of ink tank 101 to be communicated with the outside. In this case, the internal pressure of ink tank 101 is adjusted in accordance with the difference between the result of detection obtained by pressure detecting means 115 and the value of internal pressure of ink tank accumulated on information accumulating means 117. Then, the opening time of valve mechanism is controlled depending on such difference. In this manner, the internal pressure of ink tank 101 is made adequate.

Figure 23:
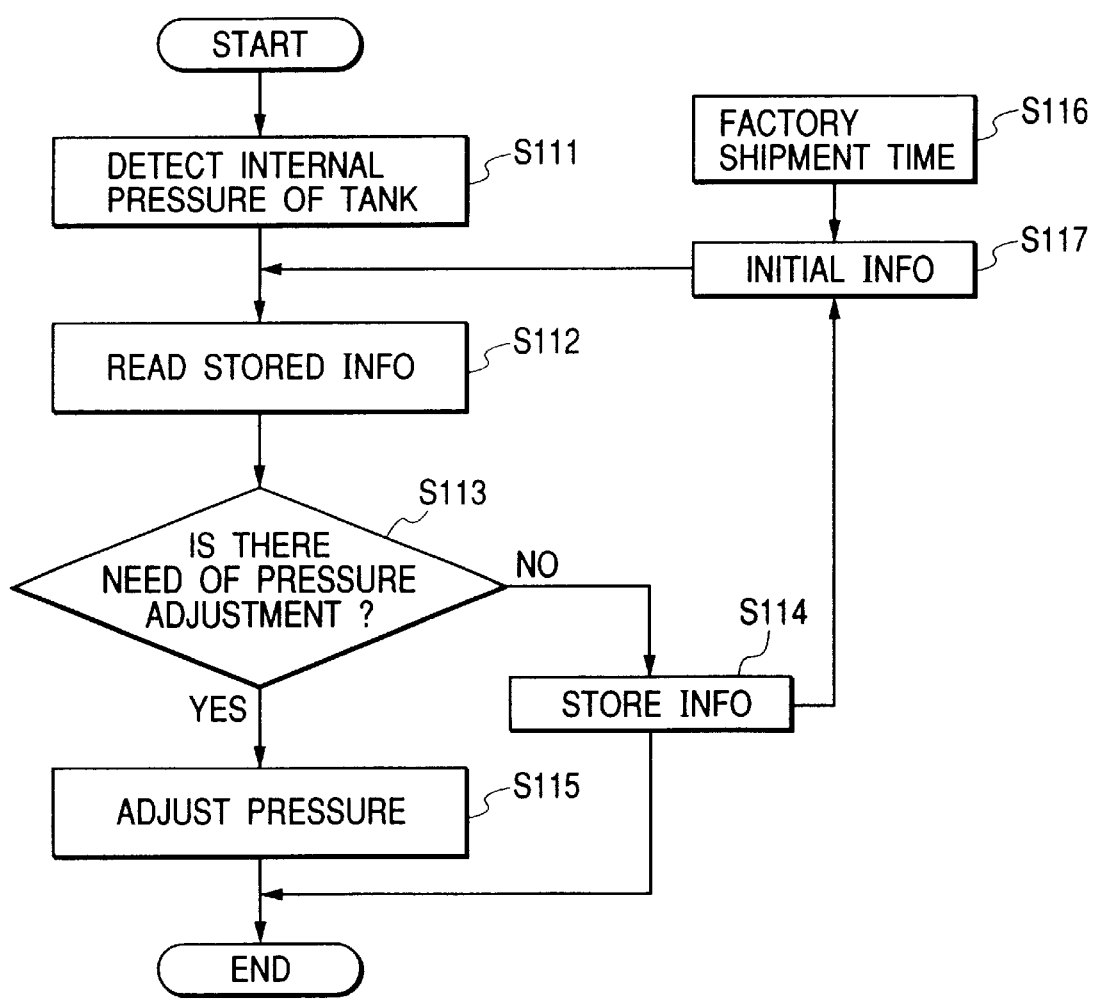
FIG. 23 is a flowchart which illustrates the operation of the solid type semiconductor device shown in FIG. 22.

FIG. 23 is a flowchart which illustrates the operation of device represented in FIG. 22. Now, referring to FIG. 21 to FIG. 23, when electromotive force 112 is given from the outside A of ink tank 101 toward the device 111, energy converting means 114 converts the electromotive force 112 into electric power 113. With the electric power 113 thus provided, pressure detecting means 115, discriminating means 116, information accumulating means 117, and pressure adjustment means 118 are actuated.

Figure 36:
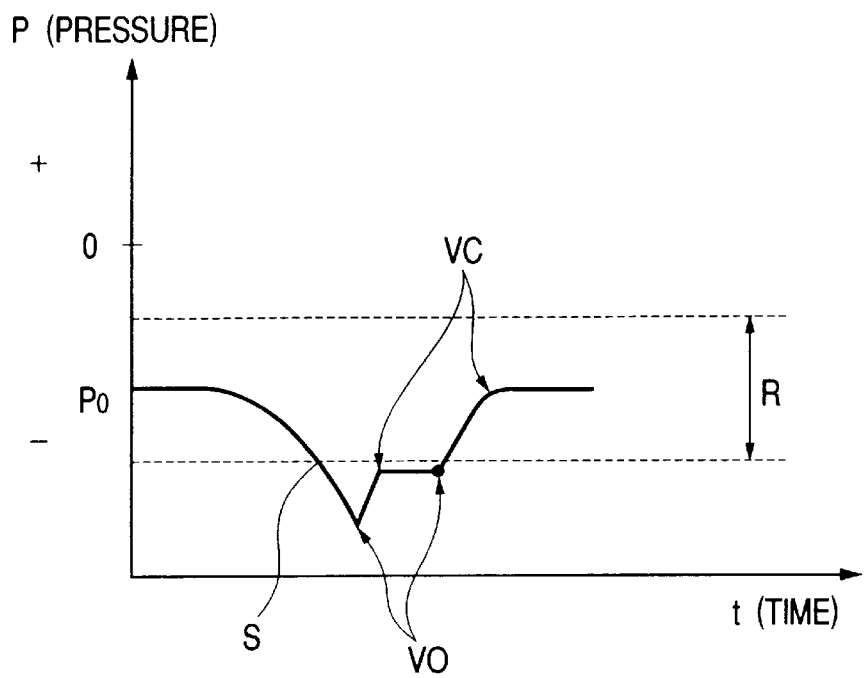
FIG. 36 is a view which shows one example of internal pressure information to be written on the solid type semiconductor device in the graphical form.

The actuated pressure detecting means 115 detects the internal pressure of ink tank 101 (step S111 in FIG. 23). Then, discriminating means 116 reads out accumulated information from information accumulating means 117 (S112 in FIG. 23), and compares the condition thus read out with the detected information of tank internal pressure, hence determining whether or not adjustment is needed for the internal pressure of ink tank 101 (step S113 in FIG. 23). In this respect, the ink tank 101 is set at an initial pressure by use of a dedicated inspection apparatus at the time of shipment from the factory after ink has been filled (step S116 in FIG. 23), and such information is written on ROM in the device 111 as initial information (step S117 in FIG. 23) as to the portion (indicated as an adequate range (R) in FIG. 36). In FIG. 36, a reference mark S designates the suspension of printing, and VO and VC, opening and closing of valve, respectively.

In the step S113, if the detected internal pressure of ink tank 101 is within the range of internal pressure of ink tank 101 accumulated on information accumulating means 117, and then, discriminating means 116 determines that no adjustment is needed for the internal pressure of ink tank 101, pressure adjustment means 118 is not driven, and the current internal information of ink tank 101 is accumulated on information accumulated means 117 (step S114 in FIG. 23). Here, FIG. 36 shows the example of accumulated internal information. In this manner, then, it becomes possible to grasp the temporal changes of negative pressure along the consumption of ink in the ink tank 101, as well as the temporal changes of negative pressure during the serial scan of recording head. Such information is transmitted to the control circuit of recording head to optimize the performance of recovery operation and the setting of driving condition of recording head.

Also, in the step S113, if the detected negative pressure of ink tank 101 is lower than the value of upper limit set to the internal pressure of ink tank 101, which is accumulated on information accumulating means 117, and discriminating means 116 determines that the internal pressure of ink tank 101 should be adjusted, pressure adjustment means 118 is driven by the electric power 113 converted by energy converting means 115. Here, if pressure adjustment means 118 is a valve mechanism, the internal pressure of ink tank 101 is adjusted as described above (step S115 in FIG. 23).

When the device 111 is used for an ink jet recording apparatus, the preferable position where means for supply electromotive force as the external energy is the recording head, carriage, recovery position of recording head, or carriage return position, among some others, for the ink jet recording apparatus of serial type, for example. Besides, if an apparatus which is provided with means for supplying electromotive force is used, it is possible to know the internal condition of ink tank even without ink jet recording apparatus. Thus, the internal pressure of ink tank may be adjusted without mounting the ink tank on the ink jet recording apparatus actually at a factory or a shop, for example.

As described above, with the device 111 provided for the ink tank 101, it becomes possible to detect the internal pressure of ink tank 101 and adjust it to a designated pressure if only electromotive force 112 is given to the device 111. As a result, the interior of ink tank 101 can be kept in a preferably negative condition suitable for discharging ink from recording head 104 irrespective of the amount of ink remainders in ink tank 101, hence making it possible to supply ink to the recording head 104 stably. Also, there is no need for retaining ink in an ink absorbent by absorbing it for keeping the interior of ink tank 101 in negative condition as in the case of the conventional art. Therefore, the efficiency of ink storage is enhanced.

Also, in accordance with the present embodiment, since the device 111 is provided with energy converting means 115, it is no longer necessary to provide any direct electrical wiring with the outside, and the device 111 can be used even in any location that makes electrical wiring difficult for direct connection with the outside. Further, with the device 111 having energy converting means 115 provide therefor, there is no need for providing the device 111 with any means for accumulating electromotive force (power-supply source for this example) for operating the device 111. Therefore, the device 111 can be made smaller, and the device 111 can be made usable in any locations in an object. In other words, the device 111 can be set at the optimal location in ink tank 101. Here, for the present embodiment, electromotive force is supplied to the device 111 in the form of non-contact, but it may be possible to adopt a mode in which electromotive force is supplied by being in contact with the outside provisionally, and after that, it is made non-contact with the outside.

Seventh Embodiment

Figure 24:
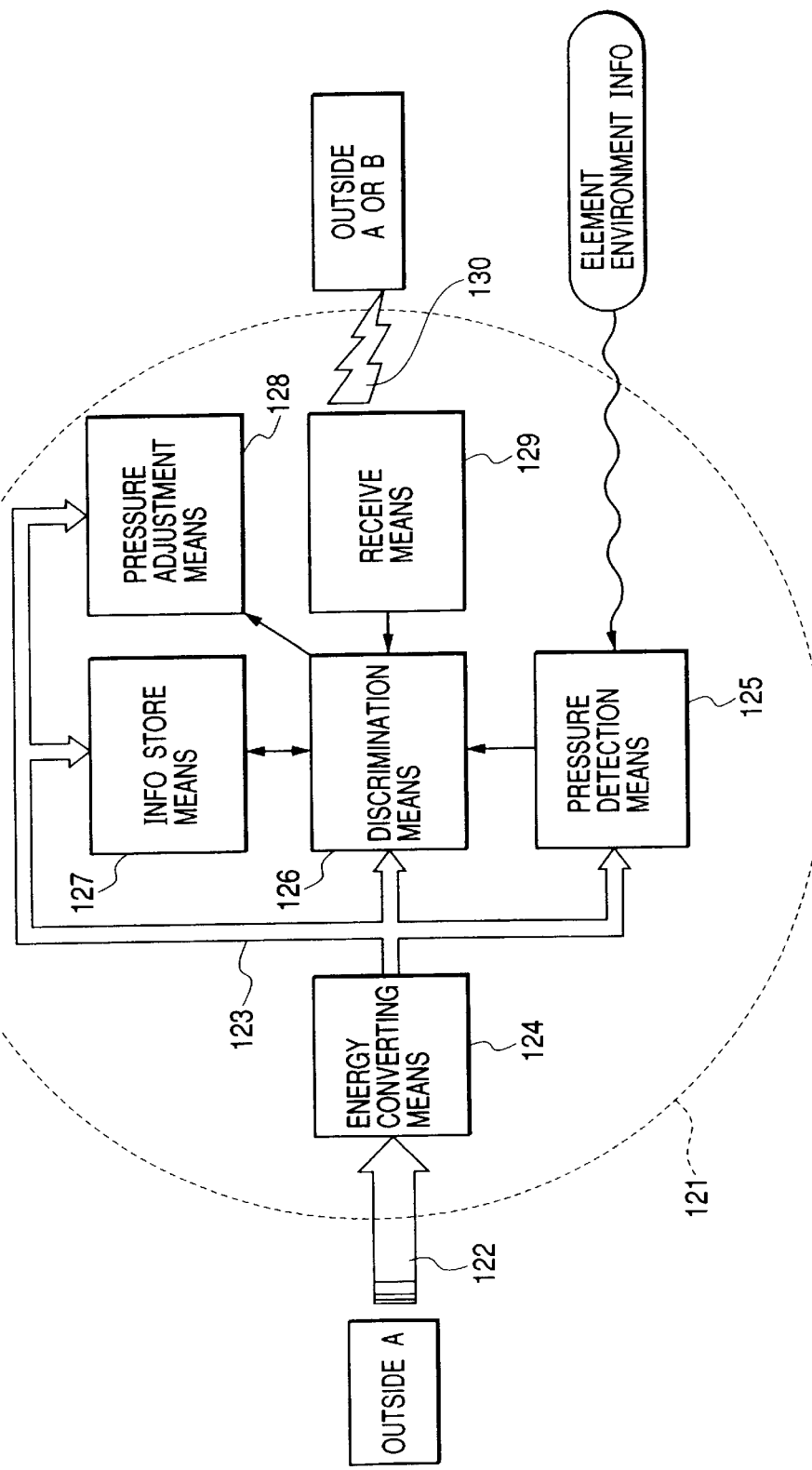
FIG. 24 is a block diagram which shows the inner structure of a solid type semiconductor device in accordance with a seventh embodiment of the present invention, and also, represents the communicative condition thereof with the outside.

FIG. 24 is a structural block diagram which shows the internal structure of the solid type semiconductor device in accordance with a seventh embodiment of the present invention, and the communicative condition thereof with the outside. The solid type semiconductor device shown in FIG. 24 (hereinafter referred to simply as the "device") 121 is fixed to an ink tank (not shown) in the same manner as the device 111 shown in FIG. 21, and comprises energy converting means 124 for converting into electric power 123 the electromotive force 122 which is supplied from the outside A of ink tank in non-contact toward the device 121; pressure detecting means 125, discriminating means 126, information accumulating means 127, pressure adjustment means 128, and reception means 129 actuated by the electric power thus converted by energy converting means 124. The present embodiment differs from the sixth embodiment in that it has the function to receive signals, that is, it has reception means 129. For the electromotive force 122 to be supplied to actuate the device 121, electromagnetic induction, heat, light, radiated rays or the like is usable. Also, at least energy converting means 124 and reception means 129 should preferably be formed on the surface of the device 121 or near the surface thereof.

Pressure detecting means 125 detects the internal pressure of ink tank, which is the environmental information surrounding the device 121, and output it to the discriminating means 126. Reception means 129 receives input signals 130 from the outside A which is the supply source of electromotive force 122 or for the outside B which is different from the outside A. Discriminating means 126 enables pressure detecting means 125 to detect the internal pressure of ink tank in accordance with input signals from reception means 129, and compares the internal information of ink tank thus detected with information stored on information accumulating means 127, thus determining whether or not the detected information of internal pressure of ink tank satisfies the condition on which ink is discharged from the recording head (not shown) installed on the ink tank. Information accumulating means 127 accumulates such condition and ink information itself obtained from pressure detecting means 125. Pressure adjustment means 128 is driven by the electric power which is provided from energy converting means 124 to adjust the internal pressure of ink tank in accordance with the instruction from discriminating means 126. For pressure detecting means 125 and pressure adjustment means 128, it is possible to use the same ones described in conjunction with the sixth embodiment.

Figure 25:
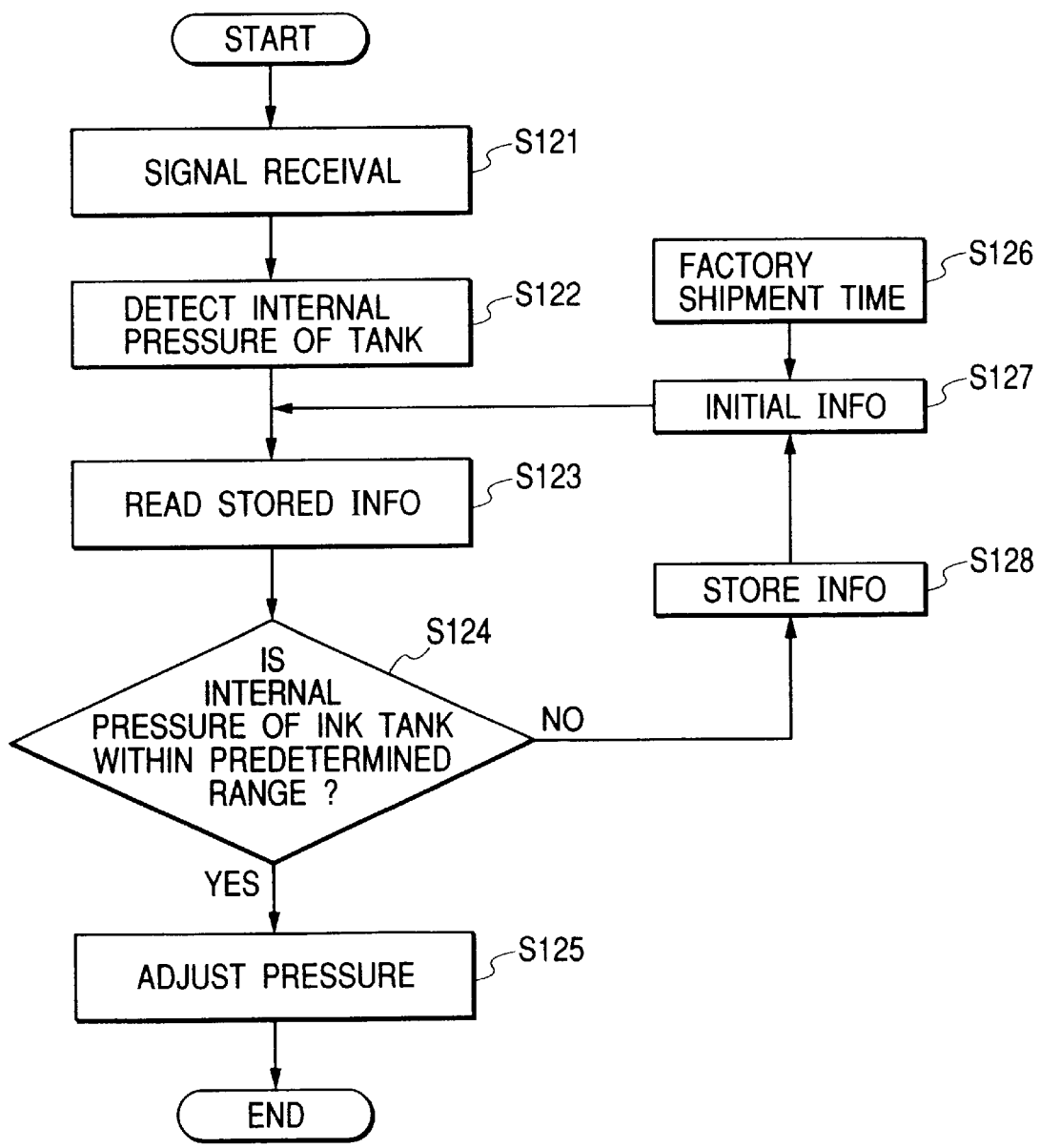
FIG. 25 is a flowchart which illustrates the operation of the solid type semiconductor device shown in FIG. 24.

FIG. 25 is a flowchart which illustrates the operation of device shown in FIG. 24. With reference to FIG. 24 and FIG. 25, energy converting means 124 converts electromotive force 122 into electric power 123 when the electromotive force 122 is given from the outside A toward the device 121, thus actuating pressure detecting means 125, discriminating means 126, information accumulating means 127, pressure adjustment means 128, and reception means 129.

In this sate, input signal 130 transmitted from the outside A or outside B to the device 121 is received by reception means 129 (step S121 in FIG. 25). This input signal 130 is to inquire the device 121 of the internal pressure of ink tank. The input signal 130 may be provided for the device 121 together with electromotive force 122.

When the input signal 130 is received, discriminating means 126 enables pressure detecting means 125 to detect the internal pressure of ink tank (step S122 in FIG. 25), and reads out accumulated information for information accumulating means 127 (step S123 in FIG. 25), thus determining whether or not the detected internal pressure satisfies the aforesaid condition (step S124 in FIG. 25). In this respect, the initial pressure is set for the ink tank by use of a dedicated inspection apparatus at the time of shipment from the factory after ink has been filled (step S126 in FIG. 25), and the information thereof is written as the portion (indicated as an adequate range (R) in FIG. 37) on the ROM of device 121 as initial information (step S127 in FIG. 25).

Figure 37:
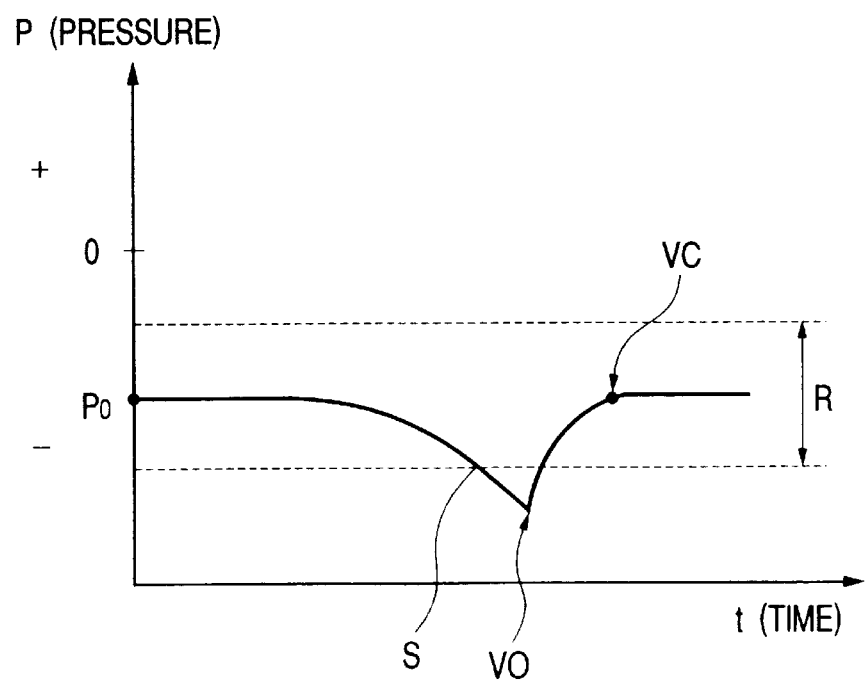
FIG. 37 is a view which shows another example of internal pressure information to be written on the solid type semiconductor device in the graphical form.

In the step S124, if it is found that the detected internal pressure does not satisfy condition, pressure adjustment means 128 is driven to adjust the internal pressure of ink tank (step S125 in FIG. 25). On the other hand, if the detected internal pressure satisfies condition, the information of current internal pressure of ink tank is accumulated on information accumulating means 127 (step S128 in FIG. 25). In this respect, FIG. 37 shows the example of accumulated information of internal pressure. In FIG. 37, reference marks VO and VC designate the opening and closing of valve, and S, the suspension of printing. In this manner, then, it becomes possible to grasp the temporal changes of negative pressure along the consumption of ink in the ink tank, as well as the temporal changes of negative pressure during the serial scan of recording head. Such information is transmitted to the control circuit of recording head to optimize the performance of recovery operation and the setting of driving condition of recording head.

In accordance with the present embodiment, with the provision of the function to receive signals from the outside, it becomes possible to respond to variously signalized questions from the outside in addition to the effects obtainable by the sixth embodiment, and communicate information between the device and the outside bidirectionally.

Here, for the present embodiment, the description has been made of one device 121 being provided with pressure detecting means 125 and pressure adjustment means 128, but it may be possible to provide pressure detecting means and pressure adjustment means each individually for different devices. Then, the structure may be arranged so that the internal pressure of ink tank is detected by one device to determine whether or not adjustment is required for the internal pressure thereof, and that, if adjustment is found necessary, the other device having pressure adjustment means provided therefor is informed accordingly to adjust the internal pressure of ink tank.

Now, the description will be made of the example of specific structure of pressure adjustment means, together with the manufacturing steps thereof.

Figure 26:
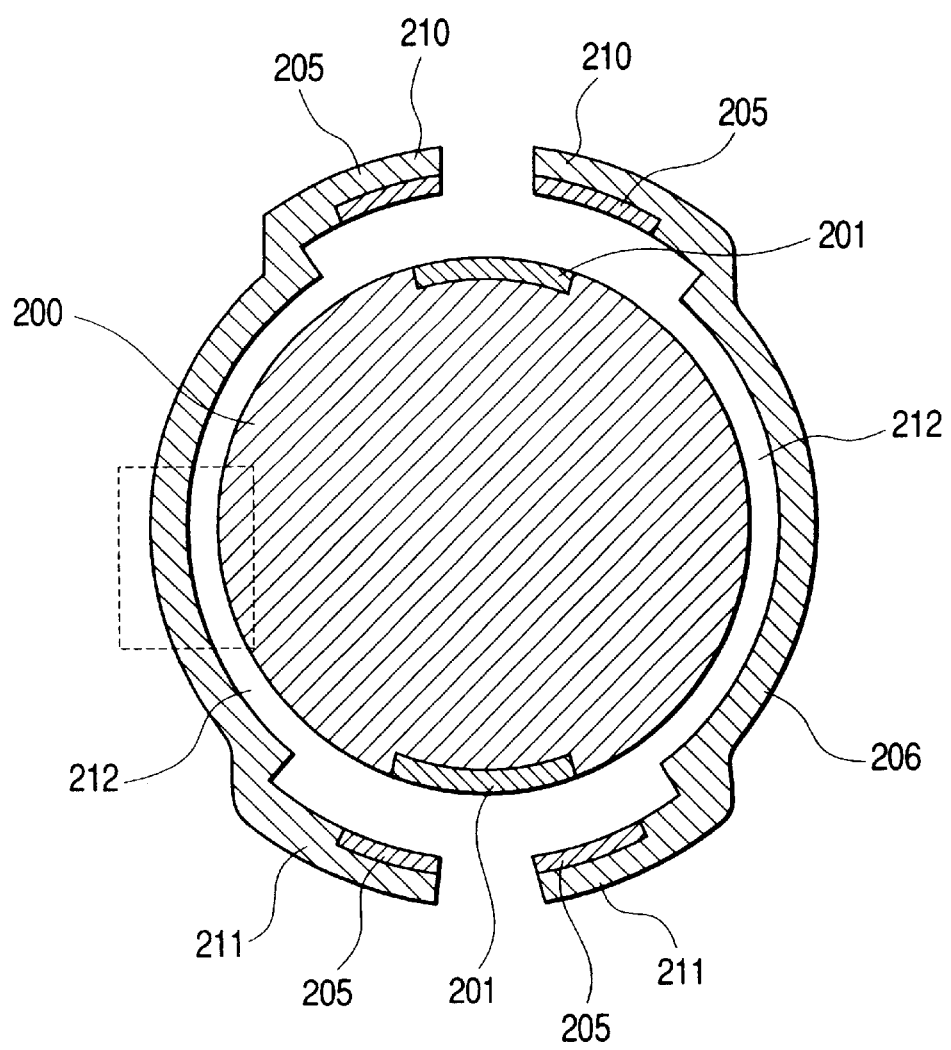
FIG. 26 is a view which illustrates one example of the structure of pressure adjustment means provided for the solid type semiconductor of the present invention.

FIG. 26 is a view which shows the one structural example of pressure adjustment means provided for the solid type semiconductor of the present invention, and illustrates the case where it is formed on the spherical silicon used for the aforesaid ball semiconductor. FIGS. 27A to 27G are views which illustrate the manufacturing process of pressure adjustment means shown in FIG. 26. In this respect, FIG. 26 and FIGS. 27A to 27G are sectional views taken at the center of the spherical silicon.

As shown in FIG. 26, each of base electrodes 201 is formed respectively at two locations of spherical silicon 200, which face each other. Also, surrounding the spherical silicon 200, SiN film 206 is formed. The SiN film 206 is formed to be movable portions 210 and 211, which are supported in a cantilever fashion having a gap with the surface of the spherical silicon 200, respectively, on the areas where each of the base electrodes 201 faces each other. Each of the movable members 210 and 211 is provided with valve electrode 205 facing the base electrode 201, respectively. Also, the SiN film 206 has a gap locally with the spherical silicon 200 in each area from one base electrode 201 to the other electrode 201, respectively. Each of these portions becomes the passage 212 that makes it possible to distribute the air between one movable member 210 side and the other movable member 211 side.

Now, with reference to FIGS. 27A to 27G, the description will be made of the method for manufacturing pressure adjustment means shown in FIG. 26.

Figure 27A:
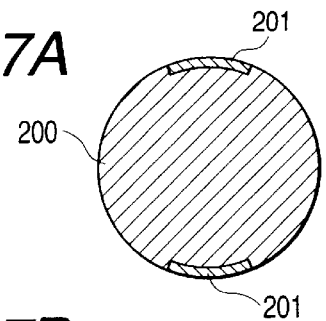
FIGS. 27A, 27B, 27C, 27D, 27E, 27F and 27G are views which illustrate the manufacturing process of pressure adjustment means.
Figure 27B:
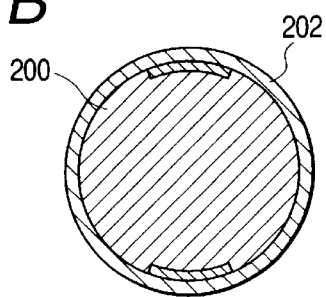
Figure 27C:
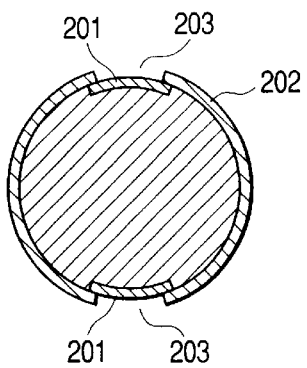

At first, on the entire surface of spherical silicon 201 shown in FIG. 27A, PSG (phospho silicate glass) film 202 shown in FIG. 27B is formed. Here, before PSG film 202 is formed, each of base electrodes 201 is formed in advance on the spherical silicon 201 at each of the two locations which are symmetrical to the center thereof. After that, as shown in FIG. 27C, in order to form openings 203 on the PSG film 202 to allow at least the base electrodes 201 to be exposed, and also, the passage to be described later, the PSG film 202 is patterned by use of photolithographic process with the portions becoming passage left intact.

Figure 27D:
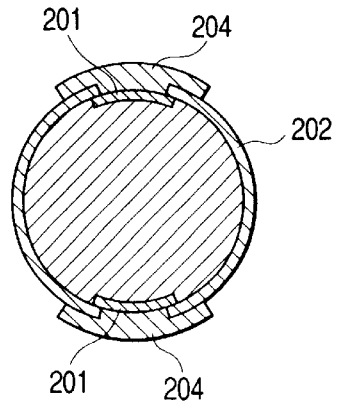
Figure 27E:
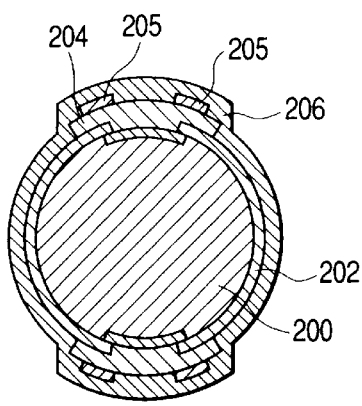

Then, as shown in FIG. 27D, using metallic CVD method Cu film 204 is formed to cover the base electrodes 201 and PSG film 202. The Cu film 204 is removed with the base electrodes 201 and portions around them being left intact. Subsequently, as shown in FIG. 27E, valve electrodes 205 are formed on the portions of Cu film 204 which become movable portions to be described later. Further, on the entire circumference of spherical silicon 200, SiN film 206 is formed using PECVD method to cover the PSG film 202, the Cu film 204 and valve electrodes 205.

Figure 27F:
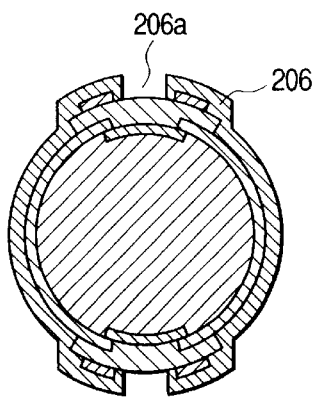
Figure 27G:
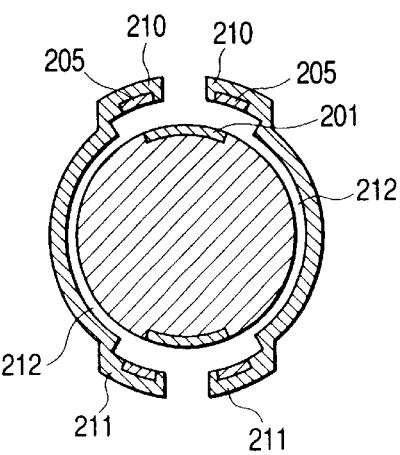
Figure 28:
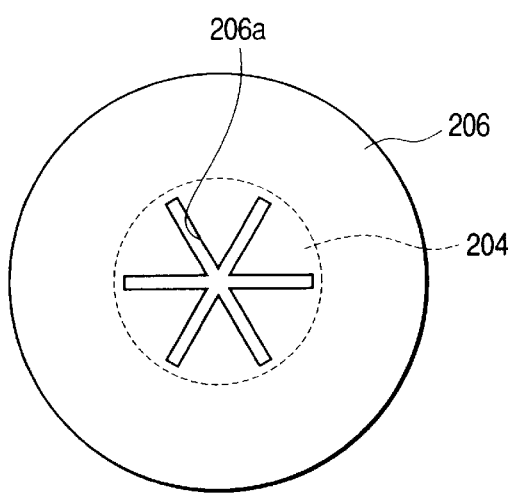
FIG. 28 is a plan view which shows the solid type semiconductor device represented in FIGS. 27A to 27G.

Further, as shown in FIG. 27F, the SiN film 206 is patterned to be in the form of movable members. FIG. 28 is a plan view which schematically shows the device at this stage. With the SiN film 206 patterning, radial slits 206 a are formed on the Cu film 204 portion on SiN film 206 as shown in FIG. 28. Then, the Cu film 204 and PSG film 202 are removed by dissolution using adequate solvent. In this manner, as shown in FIG. 27G, an solid type semiconductor device is obtained, which is structured with the movable portions 210 and 211 on the two locations, each on the upper and lower portions, respectively, so as to function as valves supported with a gap to the spherical silicon 200, and then, a space between the upper movable member 210 and spherical silicon 200, and a space between the lower movable member 211 and spherical silicon 200 are connected with each other by the passage 212.

When this solid type semiconductor device is installed on an ink tank, one movable member 210 is positioned outside the ink tank, and the other movable member 211 is positioned inside the ink tank for installation.

Now, with reference to FIG. 26, FIG. 29, and FIG. 30, the description will be made of the method for adjusting pressure in the ink tank which is provided with the solid type semiconductor device having pressure adjustment means formed therefor.

Figure 29:
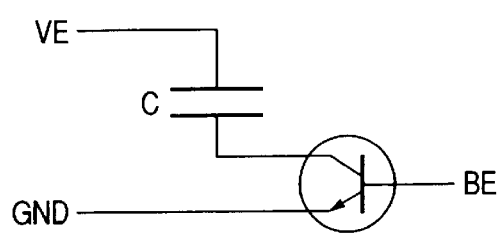
FIG. 29 is a view which shows the equivalent circuit of electrical structure related to pressure adjustment means represented in FIG. 26.
Figure 30:
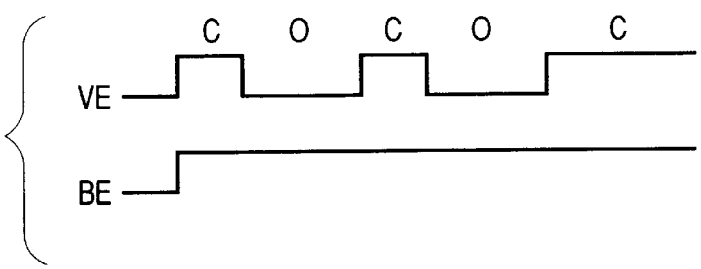
FIG. 30 is a timing chart which shows one example of signals applied to the valve electrodes and base electrode of pressure adjustment means represented in FIG. 26.

FIG. 29 is a view which shows the equivalent circuit, the electrical structure related to pressure adjustment means shown in FIG. 26. As clear from FIG. 29, a capacitor C is formed between the valve electrode VE and base electrode BE which face each other. Also, FIG. 30 is a timing chart which shows one example of signal applied to the valve electrode and base electrode of pressure adjustment means shown in FIG. 26. In this respect, a reference mark C designates closing, and O, opening.

At first, the base electrode 201 and valve electrode 205 are set at GND level. Then, high level signal is applied to the base electrode 201, and high level signal is also applied to the valve electrode 205. Thus, electrostatic attraction occurs between the valve electrode 205 and the base electrode 201, and the valve electrode 205 is pulled to the base electrode 201. As a result, the movable portions 210 and 211 are displaced to the spherical silicon 200 side to be in contact with the spherical silicon 200, thus closing the both ends of passage 212. In other words, the outside and inside of ink tank are brought into the non-communicative condition.

This condition is established as the initial one, and ink in the ink tank is being consumed. Then, the internal pressure of ink tank is detected by pressure detecting means (not shown) as required. The negative pressure rises along with the consumption of ink in the ink tank, and if the detected internal pressure becomes higher than a specific negative pressure, low level signal is applied to the valve electrode 205. Thus, the movable portions 210 and 211 are allowed to part from the spherical silicon 200 to release the passage 212. as a result, the air is induced from the outside to inside of the ink tank through the passage 212 to lower the negative pressure in ink tank. Then, when the negative pressure in ink tank becomes the designated value, high level signal is again applied to the valve electrode 205 to displace the movable portions 210 and 211 for closing the passage 212.

The determination of whether or not the negative pressure in ink tank becomes the designated value may be made while controlling the releasing time of the passage 212 in accordance with the difference between the result of detection executed by pressure detecting means or by repeating the release of passage 212 for a specific period several times or in accordance with the result of detection of the internal pressure of ink tank by use of pressure detecting means in real time.

For the example shown in FIG. 26, the structure is arranged to provide the movable portions 210 and 211 for the outside and inside of ink tank, respectively, but if the outside and inside of ink tank can be cut off, it may be good enough to set either one of them only for the purpose.

Next, the description will be made of one example of the specific structure of pressure detecting means.

Figure 31:
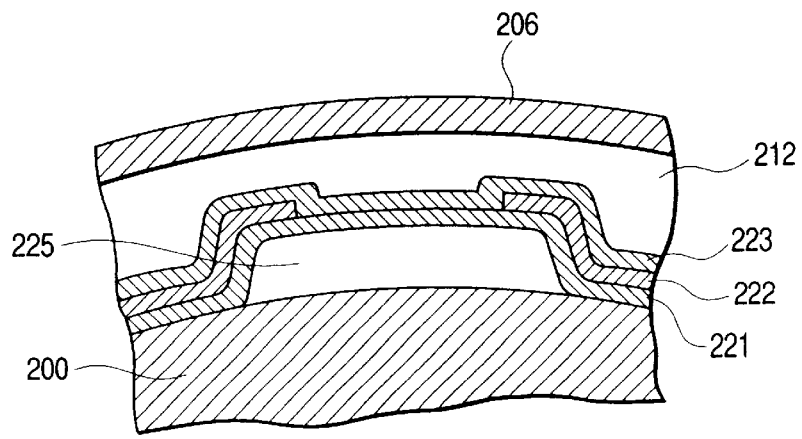
FIG. 31 is a view which illustrates one example of the structure of pressure detection means provided for the solid type semiconductor of the present invention.

FIG. 31 is a view which shows the structure of pressure detecting means provided for the solid type semiconductor device of the present invention in a case where it is formed on the portion of the device surrounded by broken lines in FIG. 26, that is, formed in the passage that constitutes pressure adjustment means. FIGS. 32A to 32D and FIGS. 33E to 33H are views which illustrate the manufacturing process of pressure detecting means shown in FIG. 31. Here, in FIG. 31 to FIGS. 33E to 33H, the same reference marks as shown in FIG. 26 are applied to the same parts as those appearing in FIG. 26. Also, the example shown in FIG. 31 is not provided with the movable portion on the side corresponding to the interior of ink tank so as to be able to detect internal pressure of ink tank while the valve is closed, because pressure detecting means is arranged in the passage 212.

Pressure detecting means shown in FIG. 31 is the semiconductor distortion gauge that utilizes the piezo-resistive effect of polysilicon film, and formed in the passage 212 of pressure detecting means described earlier. The polysilicon resistive layer 221 is formed on the surface of spherical silicon 200 as a diaphragm having a portion to float up locally through a hollow portion 225. On both edge portions of the floating up area of polysilicon resistive layer 221, wiring 222 formed by Cu or W is formed, for example. Then, the polysilicon resistive layer 221 and wiring 222 are covered by protection film 223 formed by SiN. In this way, pressure detecting means is structured.

Next, with reference to FIGS. 32A to 32D and FIGS. 33E to 33H, the description will be made of the method for manufacturing pressure detecting means shown in FIG. 31. Here, in the following description, it is assumed that pressure detecting means is formed in the steps after the state shown in FIG. 27D.

Figure 32A:
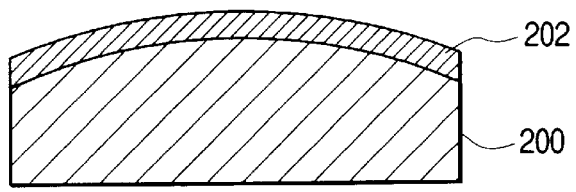
FIGS. 32A, 32B, 32C and 32D are views which illustrate the manufacturing process of pressure detection means shown in FIG. 31.
Figure 32B:
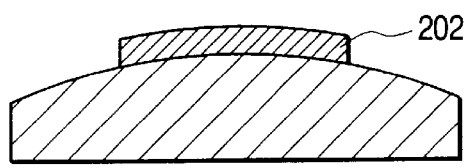
Figure 32C:
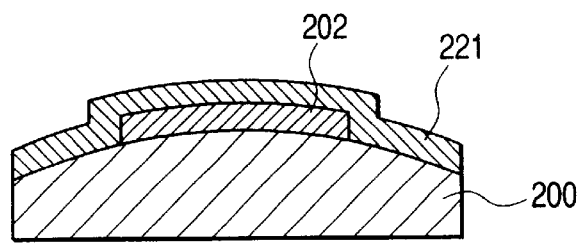
Figure 32D:
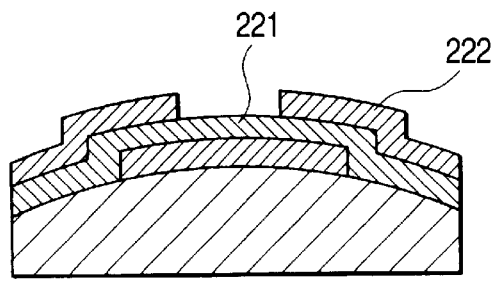

As shown in FIG. 32A, PSG film 202 is formed on the surface of spherical silicon 200. Now, as shown in FIG. 32B, this PSG film 202 is patterned into the shape of the hollow portion 225 (see FIG. 31) by means of photolithographic process. Then, as shown in FIG. 32C, polysilicon resistive layer 221 is filmed by plasma CVD method to cover the PSG film 202 thus patterned and spherical silicon 200, and patterned into the designated shape that becomes diaphragm. Next, as shown in FIG. 32D, metallic film, such as Cu or W, is formed by metallic CVD method on the polysilicon resistive layer 221, which is patterned to form wiring 222 on locations corresponding to both edge portions of diaphragm.

Figure 33E:
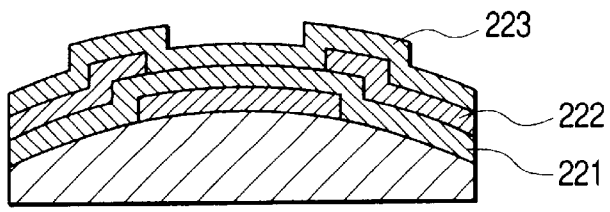
FIGS. 33E, 33F, 33G and 33H are views which illustrate the manufacturing process of pressure detection means shown in FIG. 31 after the process shown in FIGS. 32A to 32D.
Figure 33F:
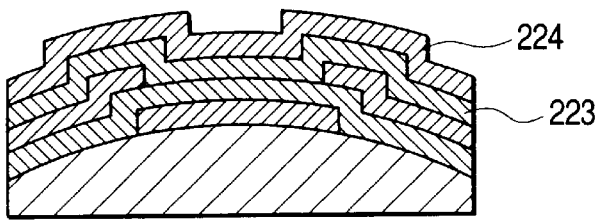
Figure 33G:
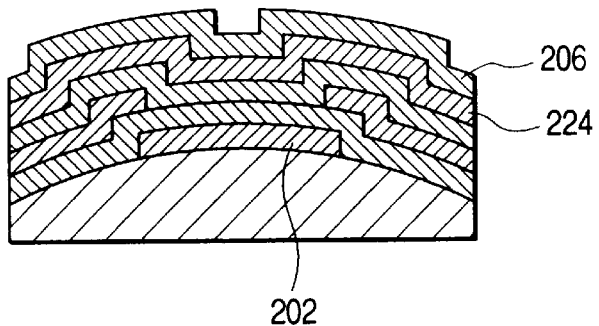

When the wiring 222 is formed on the polysilicon resistive layer 221, these are covered as shown in FIG. 33E to form SiN film by plasma CVD method, thus forming protection film 223. Further, as shown in FIG. 33F, PSG film 224 is formed by plasma CVD method on the protection film 223, and as shown in FIG. 33G, SiN film 206 is formed thereon. The state shown in FIG. 33G corresponds to the state shown in FIG. 27E.

Figure 33H:
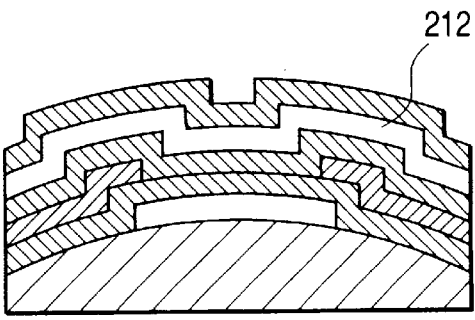

Thereafter, the SiN film 206 is patterned (FIG. 27F) to form the movable portions 210 and 211 as shown in FIG. 27G. Lastly, the PSG films 202 and 224 are removed to form pressure detecting means in the passage 212 as shown in FIG. 33H.

Figure 34:
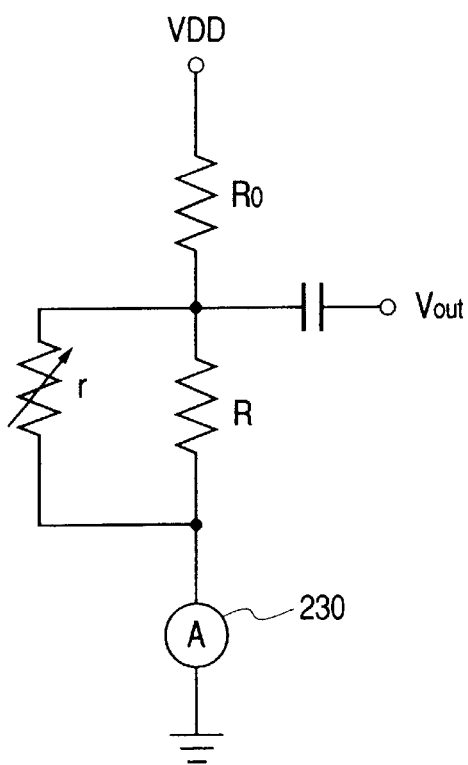
FIG. 34 is a view which shows the circuit that monitors the output from polysilicon resistive layer represented in FIG. 31.

Now, the description will be made of the pressure detection principle of pressure detecting means with reference to FIG. 31, and FIG. 34 which is a circuit diagram of the circuit that monitors the output from the polysilicon resistive layer shown in FIG. 31, In FIG. 34, given the resistance value of polysilicon resistive layer 221 as r, current of $$i = VDD / \{Ro + R \times r(R + r)\}$$

flows on the ammeter 230. Also, polysilicon has the property that the resistance value thereof increases substantially in proportion to the displacement thereof. Therefore, when the polysilicon resistive layer 221 displaces with the pressure changes of passage 212, the resistance value r of polysilicon resistive layer 221 changes. As a result, the current i that can be measured by use of ammeter 230 also changes. In other words, the amount of displacement of polysilicon resistive layer 221 is known by the changes of current i, thus making it possible to detect the pressure of passage 212, that is, the internal pressure of ink tank.

To describe further in detail, given the length of polysilicon resistive layer 221 as L, the sectional area thereof as S, the total resistance value R can be expressed as follows:

$$R = \rho L / S$$

where the ρ is resistivity. Here, if the polysilicon resistive layer 221 changes along pressure changes, the length becomes longer as L+ΔL, and resistance value increases. On the other hand, the sectional area becomes smaller as S−ΔS. Also, the ρ changes to ρ'. The relationship between the increased portion ΔR of the resistance value and the increased portion ΔL of the length can be expressed as follows:

$$R + \Delta R = \frac{\rho'(L + \Delta L)}{S - \Delta S} = \frac{\rho L}{S} + \Delta L \frac{\rho'}{S - \Delta S}$$

Further, it becomes as follows:

$$\frac{\Delta R}{R} = \frac{\rho'}{\rho} \times \frac{S}{S - \Delta S} \times \frac{\Delta L}{L} = kg \times \frac{\Delta L}{L}$$

where the kg is the coefficient of change of resistance value against distortion.

Then, using bridge circuit or the like, the change portion ΔR of resistance value is detected to obtain the pressure changes.

Polysilicon has the property that the distortion resistance thereof changes by temperatures. Therefore, it is desirable to provide a temperature sensor for pressure detecting means having polysilicon resistive layer 221 in order to monitor the temperature of polysilicon resistive layer 221. In other words, with the voltage VDD which is supplied to the polysilicon resistive layer 221 through the temperature sensor, it becomes possible to compensate for the resistance changes of polysilicon resistive layer 221 due to the changes of environmental temperature, and detect the internal pressure of ink tank more accurately.

Figure 35:
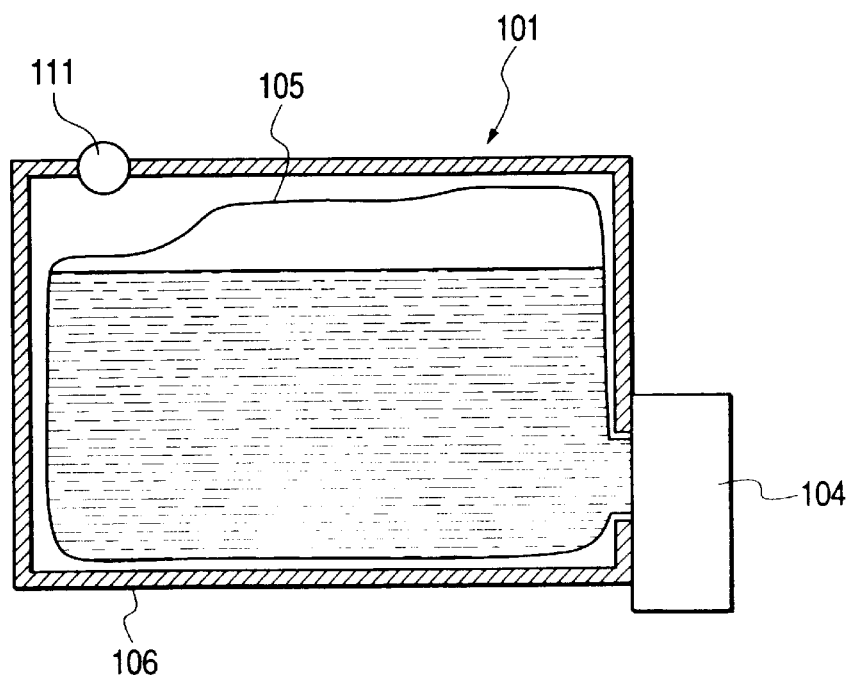
FIG. 35 is a cross-sectional view which shows schematically another example of the ink tank to which the present invention is applicable.

The solid type semiconductor device provided with the aforesaid pressure adjustment means is also applicable to an ink tank as shown in FIG. 35.

The ink tank shown in FIG. 35 comprises the outer wall 106 that constitutes the housing of tank, and the flexible ink containing bug 105 which is housed inside the outer wall 106. Ink is contained in the ink containing bug 105. In this way, airtightness is enhanced for containing ink so as to prevent chemical reaction from being progressed by the material which is easily dissolved by ultraviolet rays from outside or ultraviolet rays as catalyst. In an ink tank of the kind, the solid type semiconductor device of the present invention 111 is arranged for the outer wall. Then, with the solid type semiconductor device 111 thus arranged, it becomes possible to maintain the internal pressure constantly between the outer wall 106 and the ink containing bug 105 against the changes of negative pressure following the consumption of ink from the ink supply port.

So far, the description has been made of the present invention by exemplifying the case where the internal pressure is adjusted for the ink tank which is used for an ink jet recording apparatus. The present invention is not necessarily limited thereto. The invention is applicable to any case where the internal pressure of a closed container should be adjusted. It is most preferable, however, to apply the invention to the case where, as described in each of the aforesaid embodiments, the internal pressure of an ink tank is optimally maintained for an ink jet printer using ink contained in an detachably mountable ink tank, which is supplied to the ink jet recording head thereof in order to print on a recording sheet by ink droplets discharged from such recording head.

Also, the pressure adjustment means has been described by exemplifying the case where this means is driven in accordance with the internal pressure of an ink tank which is detected by pressure detecting means. However, when the solid type semiconductor device is used for the ink tank, the amount of ink consumption in the ink tank can be estimated almost exactly by the driving frequency of the recording head. Also, if the amount of ink contained in an ink tank is constant in the initial condition (unused condition), there are correlations between the amount of ink consumption and the internal pressure of ink tank. Therefore, if only the relationship between the driving frequency of recording head and the internal pressure of ink tank is obtained in advance by means of measurement or the like, it may be possible to maintain the internal pressure of the ink tank adequately by driving pressure adjustment means on the bases of the driving frequency of the recording head even without the provision of pressure detecting means.

As described above, in accordance with the present invention, energy from outside is converted into energy of different kind. Then, the function to adjust negative pressure in a container by means of energy thus converted is incorporated in the solid type semiconductor device. In this way, it becomes possible to adjust and control the negative pressure in the container in the mode of non-contact with the outside. Particularly, with the application of the solid type semiconductor device of the present invention, the negative pressure in ink tank can be maintained adequately so that ink discharges from the discharge head are made executable in good condition, and at the same time, the ink storage efficiency is enhanced.

Eighth Embodiment

Figure 38:
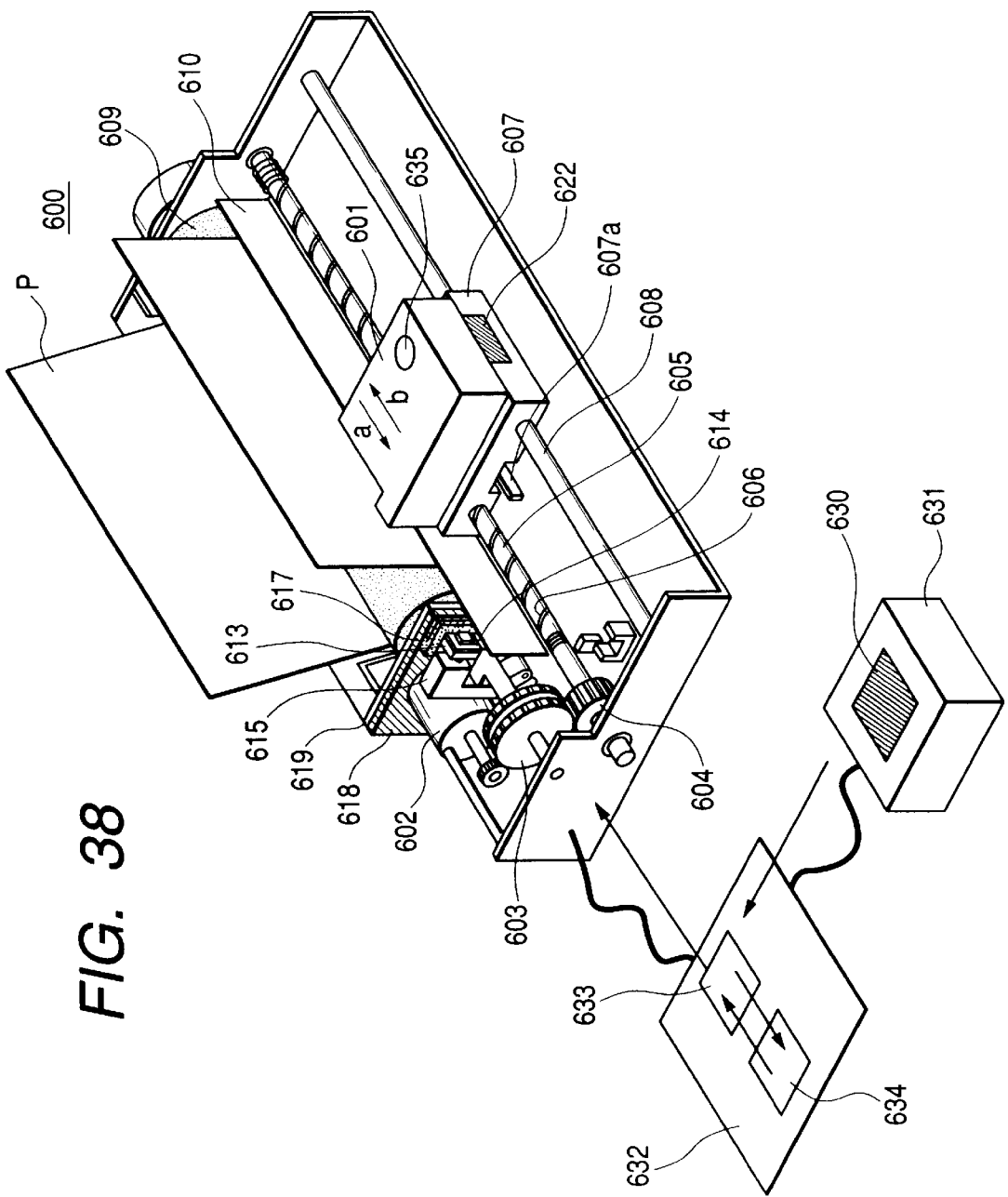
FIG. 38 is a perspective view which schematically shows another example of the ink jet recording apparatus to which the present invention is applicable.

FIG. 38 is a perspective view which schematically shows an ink jet recording apparatus embodying the present invention.

The head cartridge 601 which is mounted on the ink jet recording apparatus 600 shown in FIG. 38 comprises a liquid discharge head for discharging ink droplets for recording prints, and an ink tank that retains liquid to be supplied to the liquid discharge head. Also, on the wall portion on the upper face of head cartridge 601, a solid type semiconductor device 635 is buried. Then, as described later, the security system of this apparatus is structured by use of the solid type semiconductor device 635 and the recording apparatus 600. Here, in the recording apparatus 600, an energy supply unit 622 is installed to supply in non-contact the electromotive force, which is the external energy, to the solid type semiconductor device 635 installed on the upper part of the head cartridge 601 mounted on the carriage 607. For the electromotive force to be supplied for the operation of the device, electromagnetic induction, heat, light, radiated rays, or the like is usable.

As shown in FIG. 38, the head cartridge 601 is mounted on the carriage 607 which engages with the spiral groove 606 of lead screw 605 which is interlocked to rotate with the regular and reverse rotations of driving motor 602 through the driving power transmission gears 603 and 604. By the driving power of driving motor 602, the head cartridge 601 reciprocates together with the carriage 607 along the guide 608 in the directions indicated by arrows a and b. For the ink jet recording apparatus 600, recording sheet carrying means (not shown) is provided to carry a printing sheet serving as the recording medium that receives liquid, such as ink, discharged from the head cartridge 601. The sheet pressure plate 610 for use of the printing sheet P carried by recording medium carrying means on a platen 609 is arranged to press the printing sheet P to the platen 609 in the traveling direction of the carriage 607.

In the vicinity of one end of the platen 609, there is provide the supporting member 613 which supports a cap member 614 to cover the front face of discharge ports of head cartridge 601. Also, ink suction means 615 is provided for sucking ink retained in the interior of the cap member 614 by idle discharges or the like from the head cartridge 601. With ink suction means 615, the suction recovery of head cartridge 601 is performed through the opening of cap member 614.

On the main body supporting member 619 of ink jet recording apparatus 600, a movable member 618 is movably supported in the forward and backward directions, that is, the direction at right angles to the traveling direction of carriage 607. for the movable member 618, a cleaning blade 617 is installed. However, the cleaning blade 617 is not necessarily limited to this configuration. It may be possible to use any one of cleaning blades of the mode publicly known.

For the ink jet recording apparatus 600 thus structured, the printing sheet P is carried on the platen 609 by recording medium carrying means as described above, and the head cartridge 601 reciprocates over the entire width of the printing sheet P. When driving signal is supplied to the head cartridge 601 from driving signal supply means (not shown) at that time, ink (recording liquid) is discharged from the liquid discharge head unit to the recording medium for recording in accordance with such signal.

Figure 39:
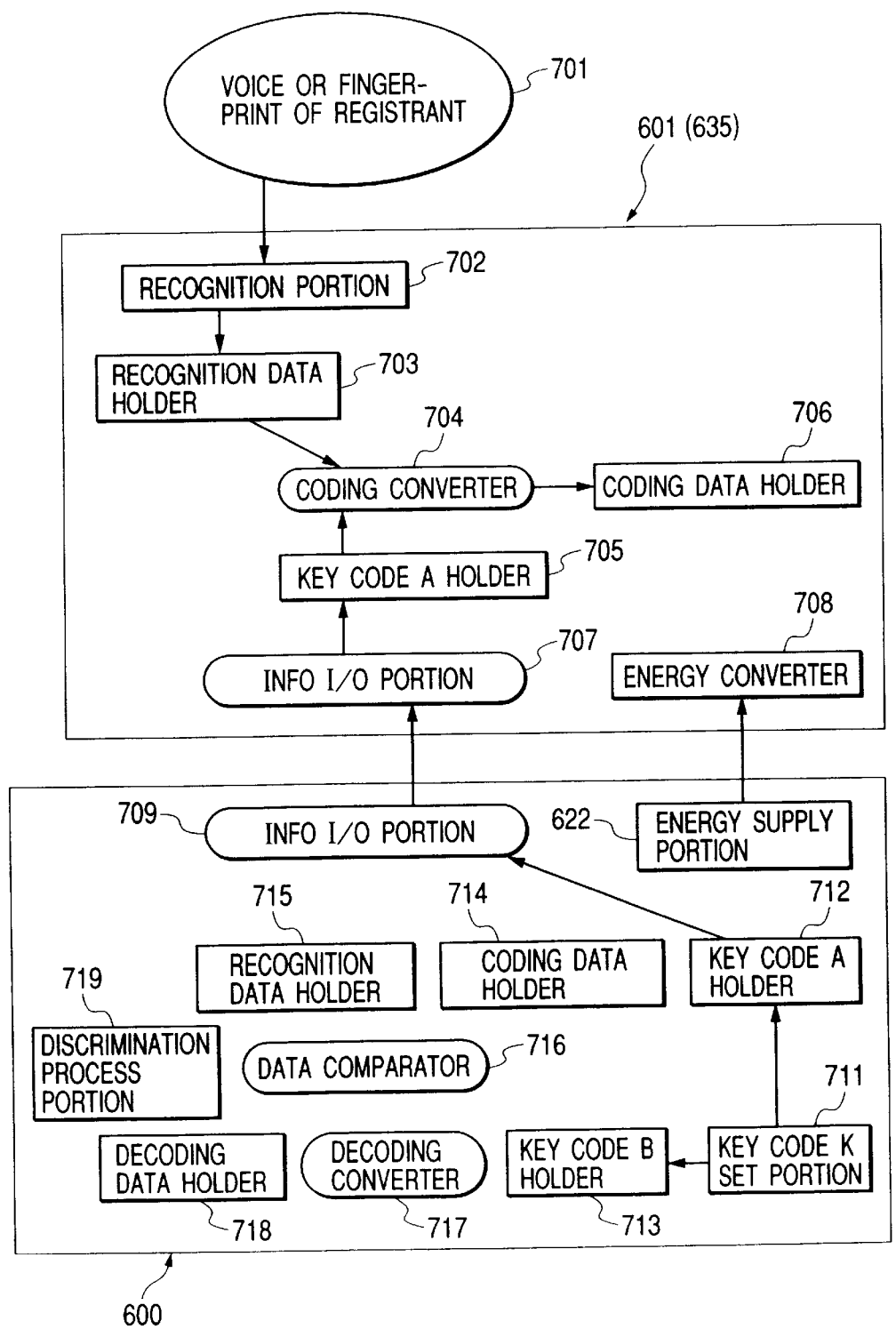
FIG. 39 is a view which shows the structure of security system of the recording apparatus represented in FIG. 38, and the transmission and reception of data at the time of registration.
Figure 40:
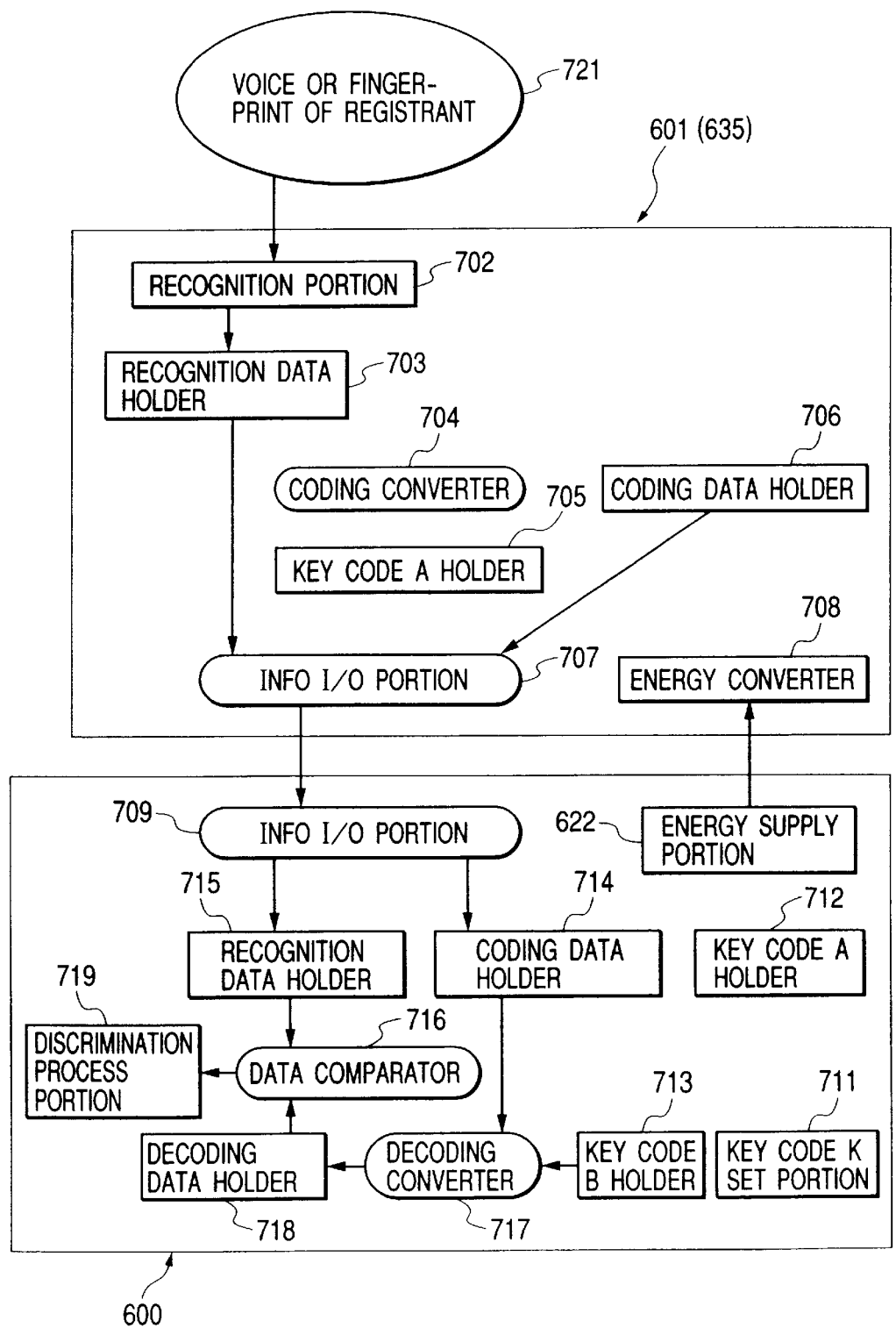
FIG. 40 is a view which shows the structure of security system of the recording apparatus represented in FIG. 38, and the transmission and reception of data at the time of discriminating the user.

Now, the description will be made of the security system of the aforesaid ink jet recording apparatus. FIG. 39 and FIG. 40 are views which illustrate the structure of security system of recording apparatus of the present embodiment. Particularly, using arrow marks FIG. 39 shows the transmission and reception of data between the constituents at the time of registration, and FIG. 40 shows the transmission and reception of data between them at the time of user recognition.

Now, as shown in FIG. 39 and FIG. 40, the solid type semiconductor device 635 which belongs to the head cartridge 601 of this example comprises a first recognized data holding portion 703 that holds as recognized data the personal information recognized by recognizing portion 702 for recognizing personal information at the time of registration or user recognition; a first information input and output portion 707 that receives key code A from the recording apparatus 600 side and transmits encoded data and recognized data to the recording apparatus 600; a first key code A holding portion 705 that holds the key code A received by the information input and output portion 707; an encode converting portion 704 that encodes the recognized data by use of the key code A; a first encoded data holding portion 706 that holds the data encoded by the encode converting portion 704; and the energy converting portion 708 that converts the electromotive force which is supplied in non-contact from the recording apparatus 600 side toward the device 635 into the electric power that can actuate at least the aforesaid constituents 702 to 707.

Also, it is desirable to form the energy converting portion 708 and information input and output portion 707 on the surface or near the surface of the device 635, and any other constituents than these portions are formed inside the device 635 in order to improve the security set up.

On the other hand, the control device (not shown) in the recording apparatus 600, on which the head cartridge 601 is mounted, comprises an energy supply portion 622 that supplies the electromotive force which is external energy to the solid type semiconductor device 635 in non-contact; a key code K setting portion 711 for the user to set the key code K; a second key code A holding portion 712 where the key code A is created form the key code K when the user admits of registration; a key code B holding portion 713 that holds the key code B created from the key code K when the user admits of registration; a second information input and output portion 709 that transmits the key code A to the solid type semiconductor device 635, and receives the recognized data and encoded data from the device 635 side; a second recognized data holding portion 715 that holds the recognized data; a second encoded data holding portion 714 that holds the encoded data; a decode converting portion 717 that decodes the encoded data by use of the key code B; a decoded data holding portion 718 that holds the data decoded by the decode converting portion 717; a data comparing portion 716 that performs the comparative reference between the recognized data and decoded data; and a discrimination processing portion 719 that performs whether or not admits the use of apparatus in accordance with the result of comparison made by the data comparing portion 716. Here, however, it is assumed that the encoded data encoded by use of the key code A cannot be decoded by use of the key code A but only by use of the key code B.

In this respect, it is desirable to use non-volatile memory for the holding portions of personal data and key codes in the device 635 and recording apparatus main body so that data are held even when the supply of electric power is cut off.

It is also desirable to install the energy supply portion 622 on the carriage 607 so as to enable it to face the solid type semiconductor device 635 provided for the head cartridge 601 mounted on the carriage 607.

The information input and output portion 707 and 709 arranged for the head cartridge 601 and the recording head 600, respectively, may be either in the contact type or in non-contact type. In the case of contact type, it is possible to use the one that can implement electrical conduction with each other when the cartridge 601 is mounted on the carriage 607. In the case of non-contact type, it is possible to use communicating means that uses electric wave, magnetic field, or the like.

Also, the recognizing portion 702 recognizes finger prints, voices, irides of eyeballs, or the like as personal information. The recognizing portion 702 is formed on the solid type semiconductor device 635. Besides, however, the solid type semiconductor device 635 may be able to provide the recognizing portion 702 outside the device, not necessarily limited to the structural example shown in FIG. 39 and FIG. 40.

For example, as shown in FIG. 38, it may be possible to recognize the patterns of irides of eyeballs or the like by use of personal information input adopter 631 which is provided with an image sensor 630 as the recognizing portion in the recording apparatus main body. Such personal information thus recognized is transmitted to the control board 632 provided for the recording apparatus main body. The control board 632 is provided with CPU 633 and memory 634 installed thereon. The recognized personal information is provisionally stored on the memory 634, and transmitted to the solid type semiconductor device 635 through the information input and output portion (not shown) after being data processed by the CPU 633. Thus, the data on the personal information is stored and held in the solid type semiconductor device 635. In this case, it is good enough to obtain electromotive force for the image sensor 630 from the apparatus main body side.

Here, it may be possible to use the same system of iris recognition as the one disclosed in the specification of Japanese Patent Application Laid-Open No. 9-201348 or the like for means for recognizing and acquiring irides of eyeballs.

Figure 41:
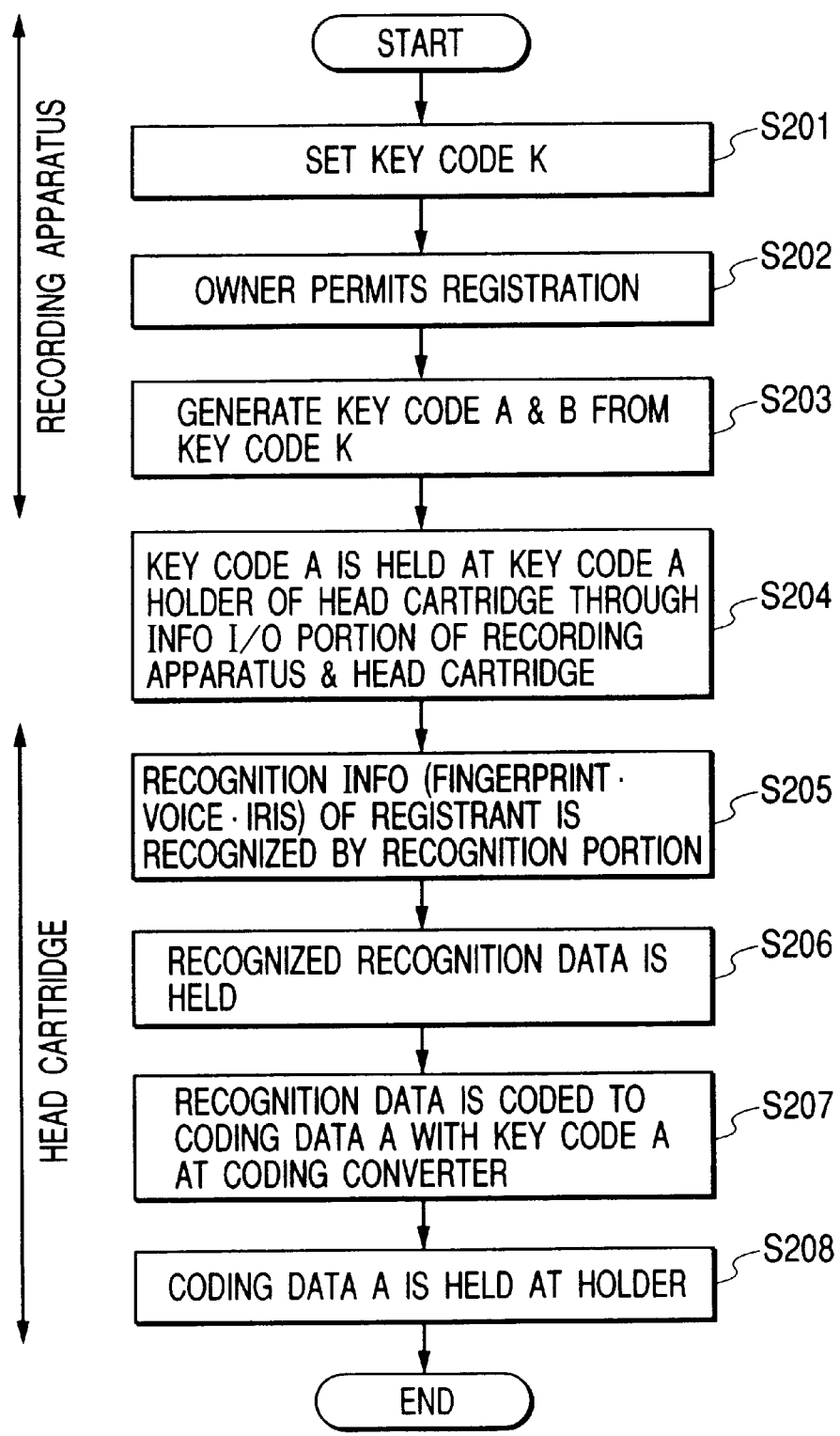
FIG. 41 is a view which shows the operational flow for the security system of recording apparatus represented in FIG. 38 at the time of registration.

Now, with reference to FIG. 39 and FIG. 41, the description will be made of the case where the owner of the recording apparatus 600 registers authorized personnel. Here, FIG. 41 is an operational flowchart at the time of registration.

On the key code K setting portion 711 of recording apparatus 600, the key code K which is defined by the owner is set (step S201), and when the owner authorizes registration, key code A and key code B are created from the key code K (step S202 and step S203), which are held by the key code A holding portion 712 and the key code B holding portion 713 of recording apparatus 600, respectively. The key code A is transmitted from the information input and output portion 709 of recording apparatus 600 to the solid type semiconductor device 635 of head cartridge 601.

On the other hand, in the head cartridge 601, the key code A thus transmitted to the solid type semiconductor device 635 is received by the information input and output portion 707 of the solid type semiconductor device 635, and held on the key code A holding portion 705 (step S204). Also, by the recognizing portion 702 of solid type semiconductor device 635, the voices or finger prints of registered person 701 are recognized (step S205). Then, the voices or finger prints 701 are held on the recognized data holding portion 703 as recognized data (step S206). Thus, the recognized data are encoded data by use of the key code A by the encode converting portion 704 (step S207). The data thus encoded are held on the encoded data holding portion 706 (step S208), hence terminating the registration of personnel authorized by the owner.

Figure 42:
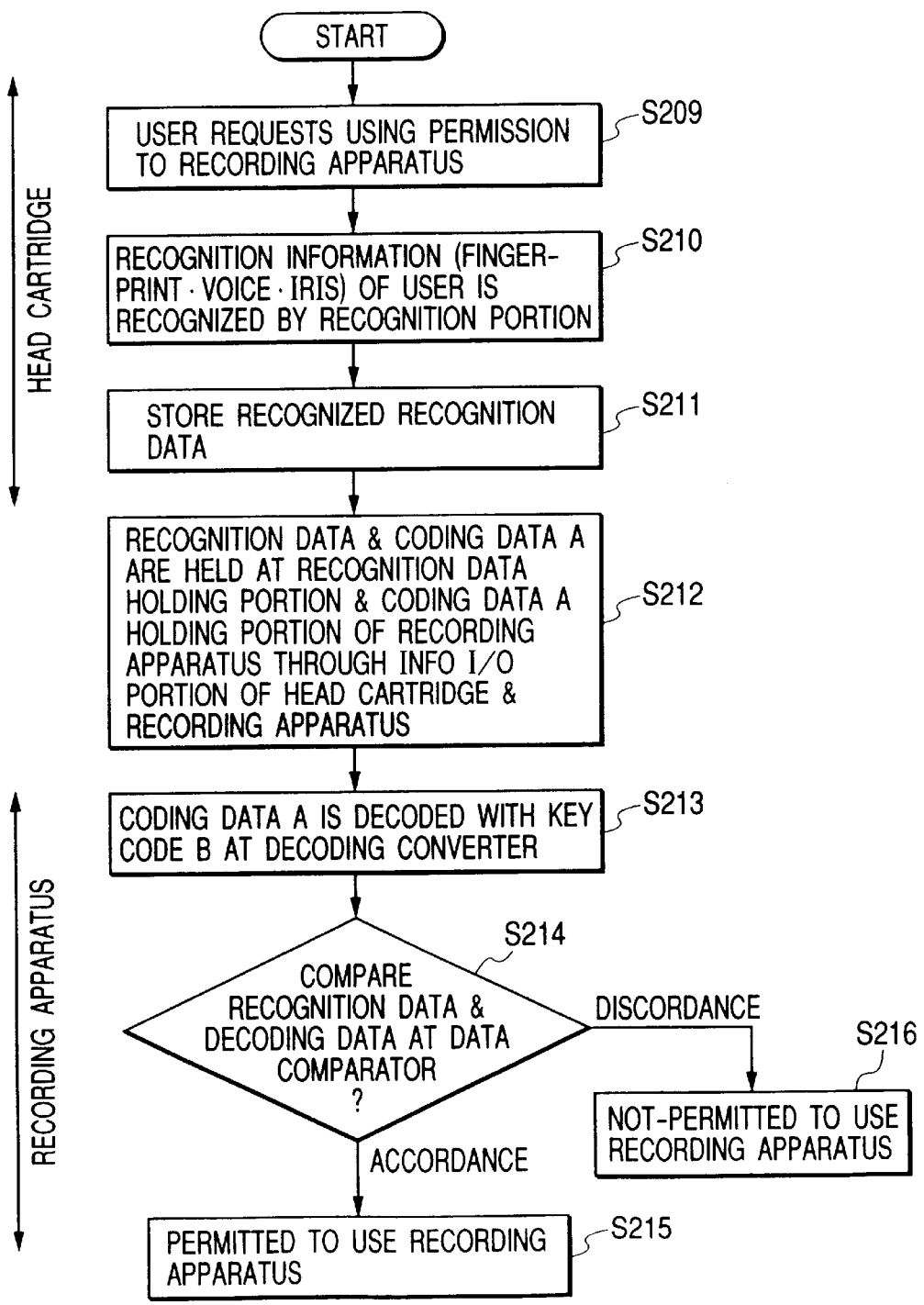
FIG. 42 is a view which shows the operational flow for the security system of recording apparatus represented in FIG. 38 at the time of discriminating the user.

Next, with reference to FIG. 40 and FIG. 42, the description will be made of the case where the user of recording apparatus 600 is the registered personnel or not. Here, FIG. 42 is the operational flowchart at the time of making discrimination (recognition).

At first, when the user seeks the permission to use, the recognizing portion 702 of solid type semiconductor device that belongs to the head cartridge 601 recognizes the voices, finger prints or the like 721 (step S209 and step S210). The recognized data holding portion 703 holds the voices, finger prints, or the like 721 as recognized data (step S211). Then, the encoded data created at the time of registration is transmitted by the information input and output portion 709 to the recording apparatus 600 together with the recognized data.

In the recording apparatus 600, the information input and output portion 709 receives the recognized data of the user and the encoded data thus transmitted, which are held on the recognized data holding portion 715 and the encoded data holding portion 714, respectively (step S212). Then, the encoded data is decoded by the decode data converting portion 717 by use of the key code B and decoded data which is held on the decoded data holding portion 718 (step S213). After that, the decoded data is compared with the recognized data of the user for reference (step S214) by the data comparative portion 716. If identification is confirmed by the comparative reference, the discriminating process portion 719 authorizes the user as registered personnel to enable the user to use the recording apparatus 600 (step S215). If data are not identical, the user is yet to be registered. Therefore, the discriminating process portion 719 makes the recording apparatus 600 unusable (step S216).

For the embodiment described above, the energy supply portion 622 that supplies electromotive force to the device 635 as external energy is provided for the carriage 607, but it may be possible to arrange it on the recovery position, returning position, or the like.

In accordance with the present embodiment, the recognized data of a registered personnel authorized by the owner of recording apparatus 600 is encoded using a part of key code, and the encoded data is stored and held on the solid type semiconductor device 635 of head cartridge 601 as the one that cannot be decoded with the exception of the remaining part of the aforesaid key code, while the remaining part of the key code is stored and held in the recording apparatus 600. As a result, it is impossible to acquire the recognized code of registered personnel even if only the device is analyzed. Also, if an encoded data holding portion is formed in the device 635 utilizing the solid shape thereof, it becomes extremely difficult to analyze data from the outside as compared with the semiconductor device formed on a flat substrate, thus making it possible to enhance the security set up.

Further, in accordance with the present embodiment, with the device 635 being provided with the energy converting portion 708, there is no need for the provision of any direct wiring, thus making it possible to install the device 635 freely on the position in the head cartridge 601 or recording apparatus 600 where the personal information, such as voices, finger prints, of the user or registered personnel can be easily read out.

Figure 43:
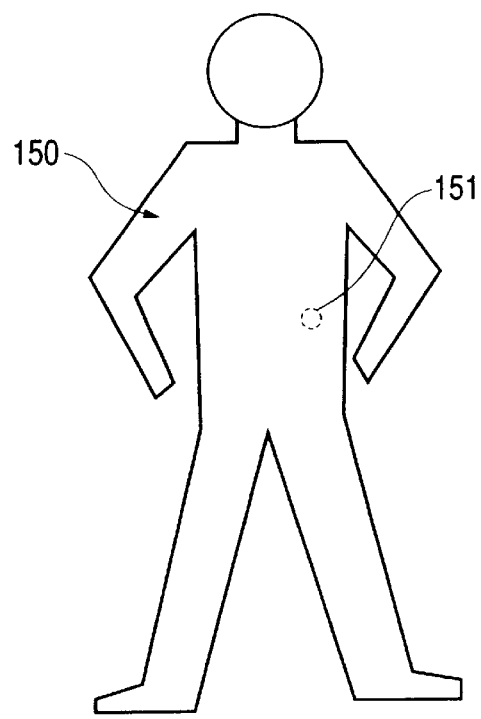
FIG. 43 is a view which shows another application example of the solid type semiconductor of the present invention.

Also, for the present embodiment, the example is described in which the solid type semiconductor device of the present invention is used for an ink jet recording apparatus, but this solid type semiconductor device being able to store and hold personal information, it is possible to identify the person himself reliably if the solid type semiconductor device 151 is buried in the human body 150 as shown in FIG. 43, and detect a pretender exactly.

Also, it becomes possible to receive an adequate treatment in an accident or when getting ill if the profile of clinical history of the person himself is stored on the device.

Hereinafter, the detailed description will be made of the specific example which is preferably applicable to the aforesaid security system.

At first, the structural example is described with respect to the recognizing portion 702 that recognizes the registered personnel or the user.

Figure 44:
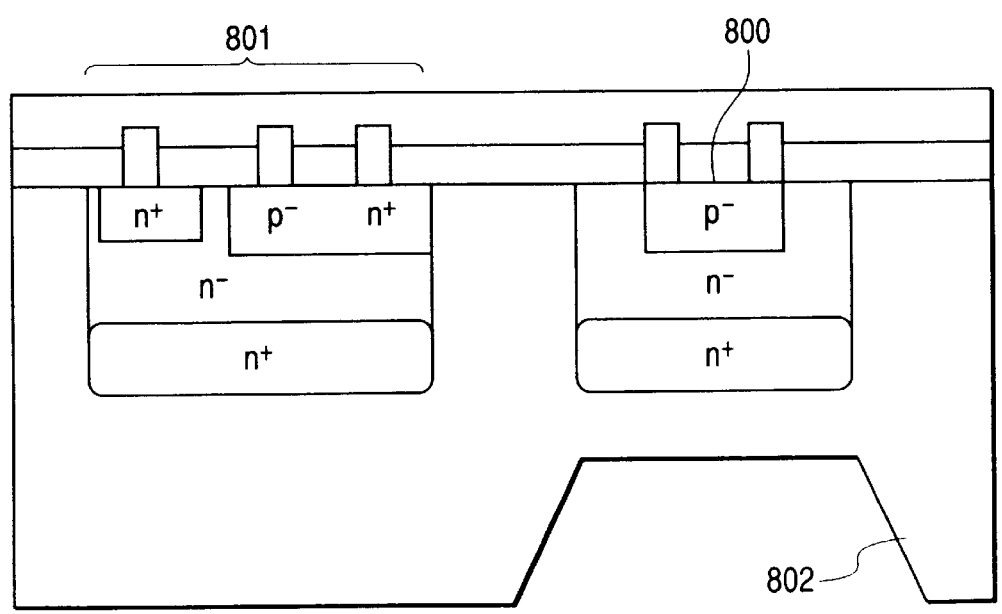
FIG. 44 is a cross-sectional view which shows schematically a voice input sensor used for the recognition unit of security system.
Figure 45:
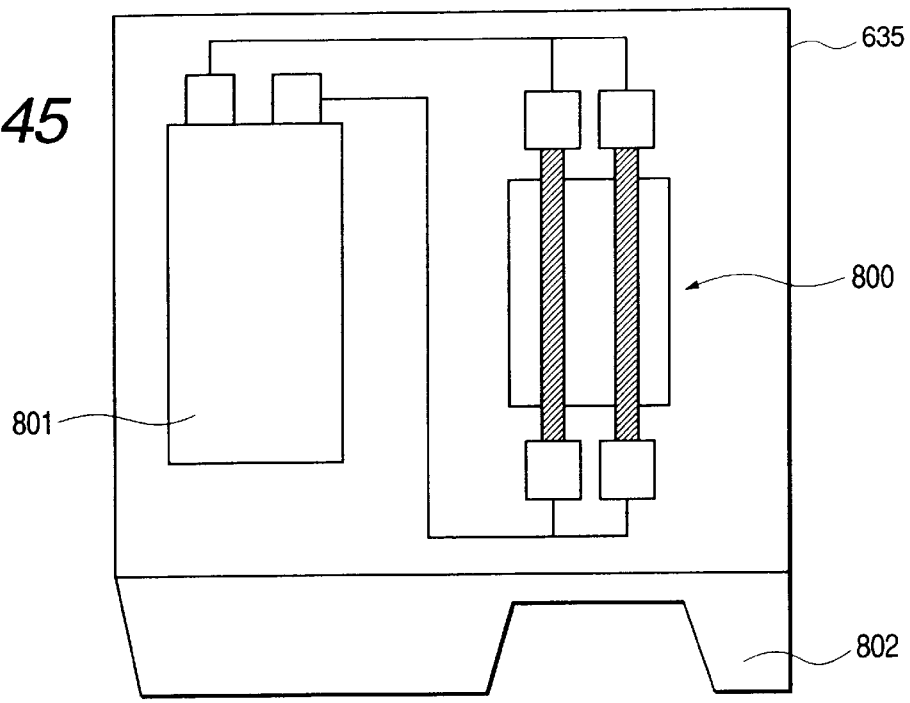
FIG. 45 is a plan view which schematically shows the voice input sensor used for the recognition unit of security system.

FIG. 44 and FIG. 45 are cross-sectional and plan views, respectively, which schematically illustrate a voice input sensor when the voice input sensor is used as the recognizing portion 702.

As shown in FIG. 44 and FIG. 45, the voice input sensor uses a diaphragm 802 with silicon base, on a part of which a piezo-resistor (silicon distortion gauge) is incorporated by use of diffusion method, and on the circumference of the sensor, electric circuits are integrated to form a arithmetically amplifying portion (PNP transistor 801, for instance) 800. This sensor is formed near the surface of solid type semiconductor device 635. As the functions of circuit, there are provided such functions as the adjustment of output amplification degrees, the compensation for temperature characteristics (zero point and sensitivity), the adjustment of zero point, among some others. In order to adjust them, it may be possible to add laser trimming function to each individual thin film resistor (not shown).

The silicon distortion gauge 200 adopted here is used for the purpose of detecting the vibrations of guttural bone when human produces a sound. The usual voice recognition recognizes voices such as by the input of voices detected by a microphone, the conversion into the frequency region, and the standardization of length and tone thereof. However, this voice input sensor utilizes high piezo-resistance effect of silicon to make it possible to detect pressure wave vibrations at high sensitivity (usually, silicon gauge factor is approximately 200). The distortion due to the pressure wave vibration thus detected by the voice input sensor is converted into electric signals. Then, the recognized data holding portion 703 holds the input voice signals thus formed as the recognition data of the registered person.

Figure 46:
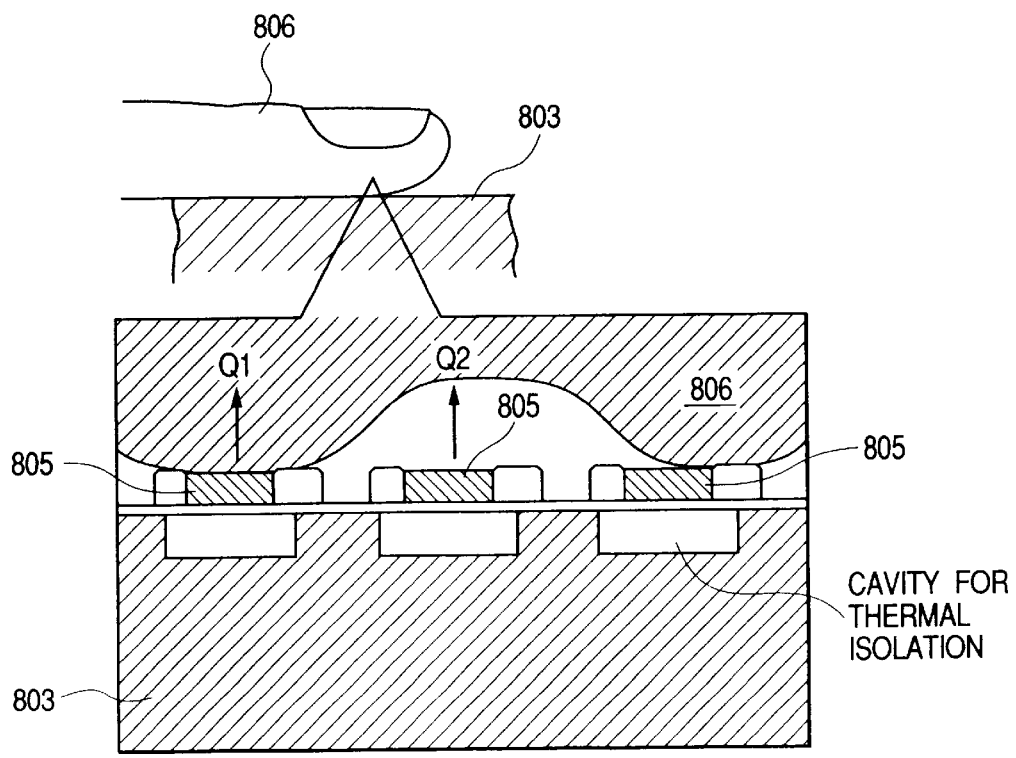
FIG. 46 is a plan view which schematically shows a finger print sensor used for the recognition unit of security system.

Also, FIG. 46 is a cross-sectional view which shows schematically a finger print sensor when the finger print sensor is used as the recognizing portion 702.

As shown in FIG. 46, the fingerprint sensor 803 uses a thin film diaphragm 804 of silicon base, and on a part thereof, fine resistive layer (heater) 805 of several micron square is incorporated by use of diffusion method or the like. Then, the resistance value of the resistive layer 805 changes by whether or not the surface of finger 806 touches the fine resistive layer 805. Thus, such changes are measured on the entire area of the finger print portion of finger that has touched, and used for the discrimination and identification of the finger print which serves as personal information. Further, on the circumference of the sensor, electric circuits are integrated to form an arithmetic amplifying portion is arranged, hence making it possible to enhance the identification accuracy still more. As the functions of circuit, there are arranged the adjustment of output amplification degree, the compensation of temperature characteristics, the adjustment of zero point, or the like. In FIG. 46, a reference marks $Q_1$ and $Q_2$ designate heat flow.

Figure 47:
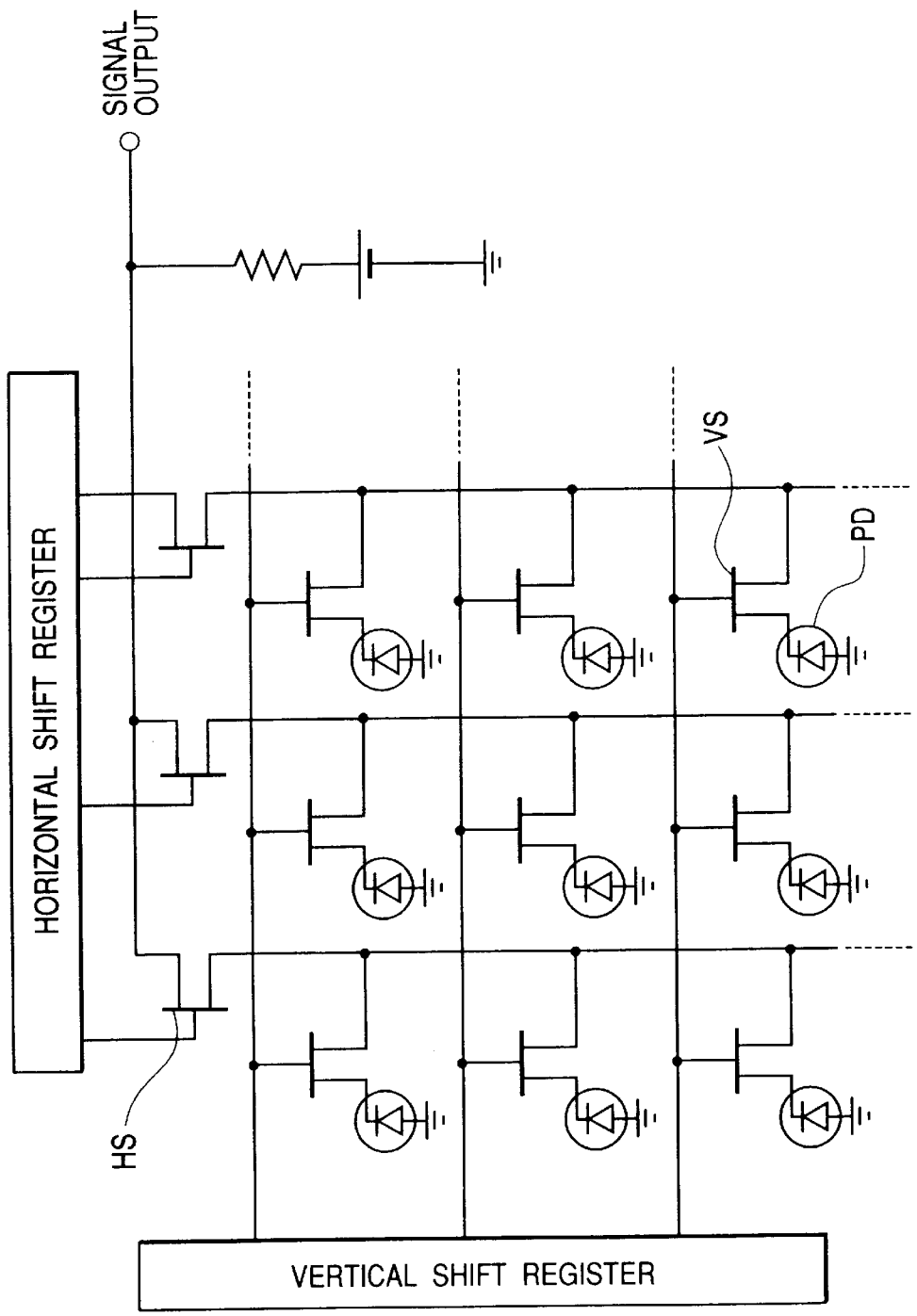
FIG. 47 is a plan view which schematically shows a finger print sensor used for the recognition unit of security system.

Further, FIG. 47 is a structural diagram of a finger print sensor in which the aforesaid finger print sensor is arranged in tow-dimensionally, with the shift registers each controlling the horizontal scan and vertical scan, respectively, being combined. For example, if each of the finger print sensors is formed in MOSFET mode for this structure shown in FIG. 47, it becomes possible to detect the two-dimensional information of finger print by turning on and off the drain voltage of MOS or turning on and off all the gates of MOSFET required for one horizontal scan in the vertical direction at a time. In FIG. 47, a reference mark HS designates horizontal switch; VS, vertical switch; and PD, diode.

Figure 48:
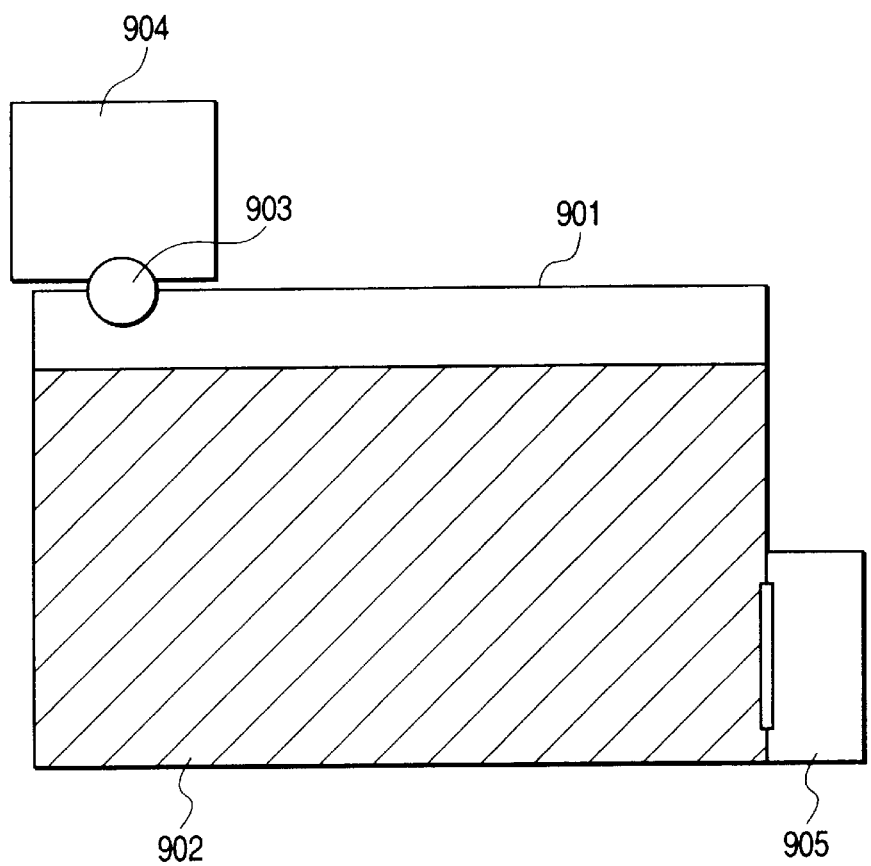
FIG. 48 is a view which schematically shows the structure of a head cartridge which can disable recording as a result of the user discrimination in the security system.

Now, the description will be made of the example in which the use of recording apparatus 600 is prohibited as a result of identifying discrimination of the user by the aforesaid security systems. FIG. 48 is a view which schematically shows the structure of head cartridge that makes recording impossible. The ink tank 901 of head cartridge shown in FIG. 48 contains ink 902 in it by use of a valve 903, and by use of a suction pump 904, the air in ink tank 901 is sucked through the valve 903. Then, after the interior of tank is set at a designated negative pressure, the valve 903 is closed. When ink 902 in such ink tank 901 is consumed by the discharge operation of ink jet recording head, the negative pressure in tank becomes greater in the negative direction, because the interior of tank is not communicated with the air outside. If the negative value inside the tank exceeds the designated value, the meniscus of discharge nozzle of ink jet recording head is allowed to retract too much to disable discharges of recording liquid. Therefore, in accordance with this ink supply structure, a pressure sensor (not shown) is arranged inside the tank to detect negative pressure. Then, when the value of such pressure sensor exceeds the designated value, the valve 903 is open until the value of pressure sensor again becomes lower than the designated value, hence controlling the negative pressure inside the tank constantly.

With the structure thus arranged, the recording head cartridge shown in FIG. 48 is used for the recording apparatus 600 to make it impossible to perform recording in such a manner that if it is found that data are not identical as a result of the identifying discrimination of user by means of the aforesaid security system, the valve 903 is open to lower the negative pressure inside the tank by use of the suction pump 904 until ink discharges are disabled, or the level at which ink supply to the head becomes impossible ultimately.

With the structure that embodies the present invention, the external energy supplied from the outside in non-contact is converted into electric power to actuate the device to make it possible to hold the personal information recognized by the recognizing portion. As a result, there is no need for the provision of electrical connection with the device for the supply of electric power, and the device that holds the personal information can be arranged freely.

Further, the means for holding the recognized data as personal information may be provided inside the solid type semiconductor device, it becomes difficult to obtain such personal information by the external analysis, thus enhancing the security of personal information.

In addition, personal information can be recognized in the three-dimensional mode to make the restriction imposed upon the direction of recognizing such information smaller than the flat type semiconductor device that may be used for the same purpose.

Also, with such solid type semiconductor device provided for the recording head cartridge or such cartridge is mounted on the recording apparatus, it becomes possible to provide function to provide function to recognize personal information, and at the same time, keep the recognized data with high security in the single body of recording head cartridge or recording apparatus.

Also, in accordance with the security system of the present invention, it becomes impossible to obtain the recognized code of a registered personnel even by analyzing the device only, because the recognized data of the registered personnel authorized by the owner of recording apparatus is encoded by use of the key code A which is a part of the key code K defined by the owner, and the data thus encoded cannot be decoded but only by the key code B which the remaining part of the aforesaid key code, and such data is stored and held on the solid type semiconductor device of recording head cartridge, while the key code B is stored and held inside the recording apparatus. Also, if the encoded data holding portion is formed inside the device utilizing the solid type thereof, it becomes extremely difficult for the outside to analyze the data as compared with such portion that may be formed on a flat substrate, hence enhancing the security set up.

Figure 49:
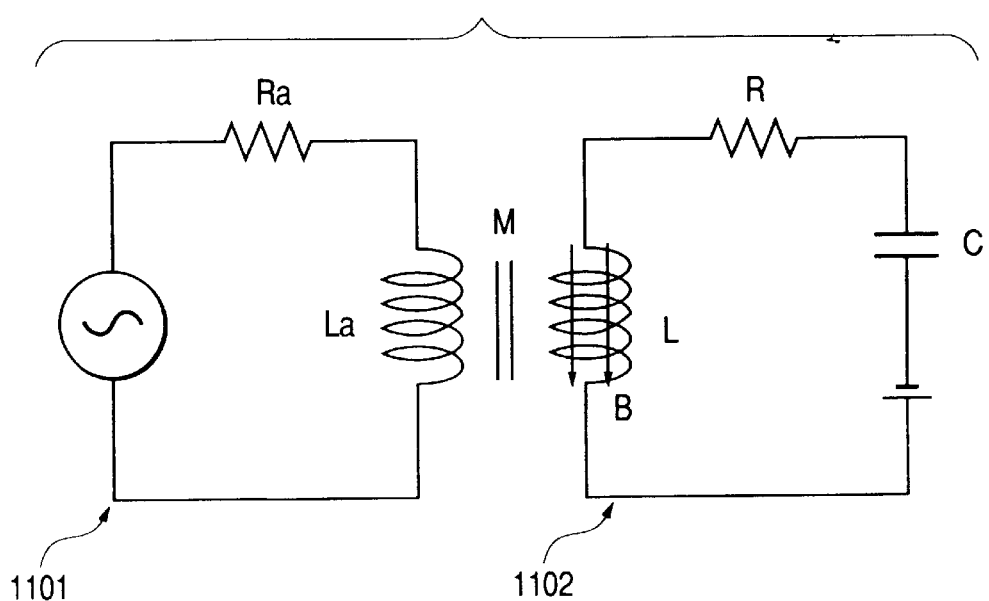
FIG. 49 is a view which illustrates the principle of electric power generation for energy converting means constituting the solid type semiconductor device of the present invention.

Next, the description will be made of energy generating means which is applicable to the aforesaid solid type semiconductor device. FIG. 49 is a view which illustrates the electric power generating principle of the energy generating means that is a constituent of the solid type semiconductor device of the present invention.

In FIG. 49, adjacent to the coil La of external resonance circuit 1101, the conductive coil L of oscillation circuit 1102 is placed, and when electric current Ia runs through the coil La by way of the external resonance circuit 1101, the magnetic flux B is generated by the electric current Ia, which penetrates the coil L of oscillation circuit 1102. Here, the electric current Ia is allowed to change, the magnetic flux B that penetrates the coil L changes accordingly. Then, induction electromotive force V is generated on the coil L. As a result, the oscillation circuit 1102 is incorporated in spherical silicon as energy generating means, and if, for example, the external resonance circuit 1101 is arranged outside the device, such as arranged in the ink jet recording apparatus, so as to enable the conductive coil L of oscillation circuit 1102 on the device side to be placed adjacent to the coil La of the resonance circuit 1102 outside the device, it becomes possible to generate the electric power that can operate the device by the electromotive force from the outside by means of magnetic induction.

Also, the magnetic flux B that penetrates the coil L of oscillation circuit 1102 of winding number N which is incorporated in the spherical silicon as energy generating means can be expressed by the following formula with the proportional constant being given as K, because it is proportional to the product of the winding number Na of the coil La of external resonance circuit 1101 and the electric current Ia:

$$B = k*Na*Ia \tag{1}$$

The electromotive force V generated in the coil L can be expressed as follows:

$$\begin{aligned} V &= -N\{dB/dt\} \\ &= -kNaN\{dIa/dt\} \\ &= -M\{dIa/dt\} \end{aligned} \tag{2}$$

Here, if the magnetic flux B is assumed to provide the permeability of coil magnetic core as $\mu a$, and the magnetic filed as H:

$$\begin{aligned} B &= \mu a H(z) \\ &= \{\mu a N a I a r a^2 / 2(r a^2 + z^2)^{3/2}\} \end{aligned} \tag{3}$$

where the z is the distance between the coil of external resonance circuit and the coil which is incorporated in the spherical silicon.

Now, the mutual inductance of the formula (2): M can be expressed as follows:

$$\begin{aligned} M &= \{\mu N / \mu a I a\} \int_s B \cdot dS \\ &= \{\mu \mu a r a^2 N a N S / 2 \mu o (r a^2 + z^2)^{3/2}\} \end{aligned} \tag{4}$$

where the $\mu o$ is the permeability of vacuum.

Then, the impedance of the transmission circuit which is incorporated in the spherical silicon: Z can be expressed as follows:

$$Z(\omega) = R + j\{\omega L - (1/\omega C)\} \tag{5}$$

And the impedance of external resonance circuit: Za can be expressed as follows:

$$Za(\omega) = Ra + j\omega La - \{\omega^2 M^2 / Z(\omega)\} \tag{6}$$

where the j represents magnetization. Then, the impedance when this external resonance circuit is caused to resonate (current value: Ia at the maximum): Zo can be expressed as follows:

$$Zo(\omega o) = Ra + jLa\omega o - (\omega o^2 M^2 / R) \tag{7}$$

Then, the phase delay of this resonance circuit: φ can be expressed as follows:

$$\tan \phi = \{jLa\omega o - (\omega o^2 M^2 / R)\}/R \tag{8}$$

And the resonant frequency of external resonance circuit: fo can be obtained as follows:

$$fo = 1/2\pi(LC)^{1/2} \quad (9)$$

From the relations described above, when the impedance of oscillation circuit 1102 which is incorporated in the spherical silicon is caused to change following the changes of ink status in ink tank, the frequency of external resonance circuit 1101 changes accordingly. Then, the changes of ink status appear in the amplitude and the phase differential of the impedance of external resonance circuit 1101. Further, this phase differential and amplitude contains the changes of ink remainders (that is, the changes of the z).

For example, with the changes of resonant frequency of external resonance circuit 1101, the output (impedance) of oscillating circuit 1102 incorporated in the spherical silicon is caused to change in accordance with the environmental changes that surrounds it. Therefore, with the detection of this frequency dependability, it becomes possible to detect the presence or absence of ink or ink remainders.

Consequently, the oscillation circuit incorporated in the spherical silicon can be used not only as energy generating means for generating electric power, but also, as a part of means for detecting the changes of ink status inside the tank.

Now, the description will be made of the method for manufacturing the solid type semiconductor device of this example. FIGS. 50A to 50G are views which illustrate one example of the method for manufacturing the solid type semiconductor device of the present invention. Each of the processing steps is represented by the section that runs through the center of the spherical silicon. Here, also, the exemplified method of manufacture is such that the spherical silicon is produced so that the gravity thereof comes to the lower part of the center thereof, and the upper part inside the spherical body is made hollow, and further, the hollow portion is kept airtightly.

Now, for the spherical silicon shown in FIG. 50A, the thermally oxidized $SiO_2$ film 1202 is formed on the entire surface thereof as shown in FIG. 50B. After that, as shown in FIG. 50C, the $SiO_2$ film is patterned by use of photolithographic process in order to form opening 1203 on a part thereof.

Then, as shown in FIG. 50D, only the upper silicon portion is removed through the opening 1203 by means of isotropic etching using KOH solvent, thus forming the hollow portion 1204. After that, as shown in FIG. 50E, SiN film 1205 is formed on the inner and outer surface of the solid type device using LPCVD method.

Further, as shown in FIG. 50F, using metallic CVD method Cu film 1206 is formed on the entire surface of solid type device. The, as shown in FIG. 50G, the Cu film 1206 is patterned by use of know photolithographic process to form the conductor coil L of winging number N, which becomes a part of oscillation circuit. After that, the solid type device having the conductor coil L formed therefor is withdrawn from a vacuum apparatus to the air outside to clog the aforesaid upper opening 1203 with a sealing member 1207, such as resin or plug, to keep the hollow portion 1204 inside the spherical type device in airtight condition. Being manufactured in this manner, the solid type semiconductor device itself formed by silicon can be provided with buoyance without any provision of means for generating buoyance by the application of electric power.

Figure 51:
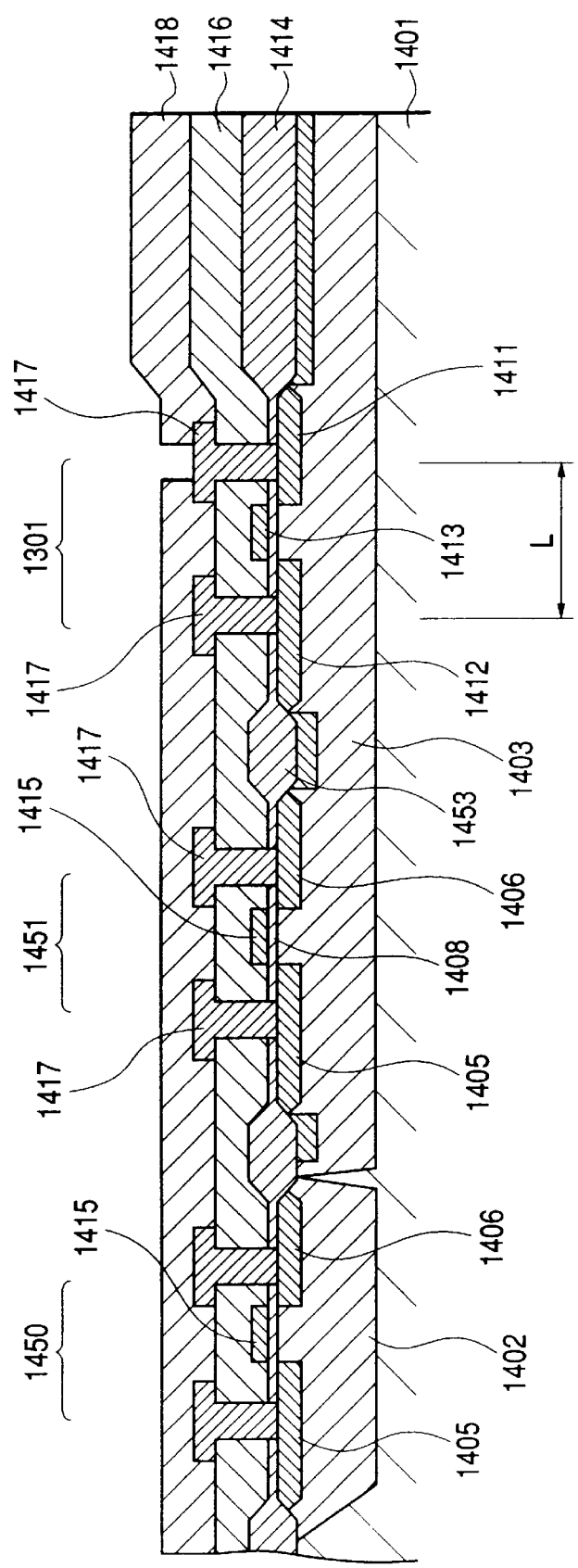
FIG. 51 is a vertically cut sectional view which schematically shows the N-MOS circuit element used for the solid type semiconductor device of the present invention.

Also, the driving circuit element other than the coil L which is formed on the spherical silicon, before the solid type floating semiconductor device is manufactured, uses N-MOS circuit element. FIG. 51 is a vertically sectional view which schematically shows the N-MOS circuit element.

As shown in FIG. 51, P-type MOS 1450 is formed for N-type well region 1402 on the Si substrate 1401 of P-conductor by means of impurity implantation induction and diffusion by implantation or the like using general MOS process, and N-MOS 1451 is formed on P-type well region 1403. The P-MOS 1450 and N-MOS 1451 are structured by the polysilicon gate wiring 1415, and the source region 1405, drain region 1406 and others which have induced N-type or P-type impurities and deposited by CVD method in a thickness of 4000 angstrom or more and 5000 angstrom or less through gate insulation film 1408 formed in a thickness of several hundreds of angstrom. Then, the C-MOS logic is formed by the P-MOS 1450 and N-MOS 1451.

The N-MOS transistor 1301 for use of driving element is also structured in the processes of impurity implantation, diffusion, and the like with the drain region 1411, source region 1412, gate wiring 1413, and others on the P-type well substrate 1402.

Here, if the N-MOS transistor 1301 is used as the device driver, the distance L between drain gates that form one transistor becomes approximately 10 μm at the minimum value. One of the breakdown items of the 10 μm is the width of contact 1417 between the source and drain, and the width portion is 2×2 μm. Actually, however, it is ½ thereof: 2 μm, because a half is also used by the adjacent transistor simultaneously. The other breakdown items are the distance portion between the contact 1417 and the gate 1413 of 4 μm (=2×2 μm), and the width portion of the gate 1413 which is 4 μm. Therefore, the total is 10 μm.

Between each of elements, the oxidation film separation region 1453 is formed by field oxidation in a thickness of 5000 angstrom or more and 10000 angstrom or less, thus separating the elements. This field oxidation film functions as the first layer of heat accumulation layer 1414.

After each of the elements is formed, PSG, BPSG film or the like is deposited by CVD method as interlayer insulation film 1416 in a thickness of approximately 7000 angstrom, and smoothing process or the like is preformed by means of heat treatment. Then, through the contact hole, wiring is made by the Al electrode 1417 which becomes a first wiring layer. After that, the interlayer insulation film 1418 of $SiO_2$ film or the like is deposited by plasma CVD method in a thickness of 10000 angstrom or more and 15000 angstrom or less, and further, through hole is formed.

This N-MOS circuit is formed before the solid type floating semiconductor device is formed as in FIGS. 50A to 50G. Then, the FeRAM which is preferably used as information accumulating means for the solid type semiconductor of the present invention, the oscillation circuit serving as energy converting means, the sensor portion serving as information input means, and the like are connected by way of the aforesaid through hole.

Here, FIGS. 52A to 52C are views which illustrate the cell structure of FeRAM which is preferably used as information accumulating means, that is, the cell structure of ferroelectric memory. In FIGS. 52A to 52C a reference mark C designates a ferroelectric capacitor. As shown in FIG. 52A which is sectional view of structure, the plate line (lower electrode) 1352, ferroelectrics 1350, and upper electrode 1351 are laminated in that order to form the ferroelectric capacitor on a semiconductor substrate together with bit line 1353 and word line 1354. By use of this cell structure, it becomes possible to form the cell of 1T1C type as shown FIG. 52B, and cell of 2T2C type as shown in FIG. 52C.

Also, irrespective of the modes of ink tank for which the solid type semiconductor device is arranged, it is necessary for the magnetic flux (magnetic field) to act stably between the oscillation circuit incorporated in the spherical silicon by the aforesaid method of manufacture, and the external resonance circuit shown in FIG. 49. Here, in the case where the solid type semiconductor device is arranged to float in liquid such as ink, the liquid surface may be vibrated due to external vibration sometimes. The gravity of solid type floating semiconductor device should be established so as to keep the stable condition thereof in liquid even in such a case.

Figure 53A:
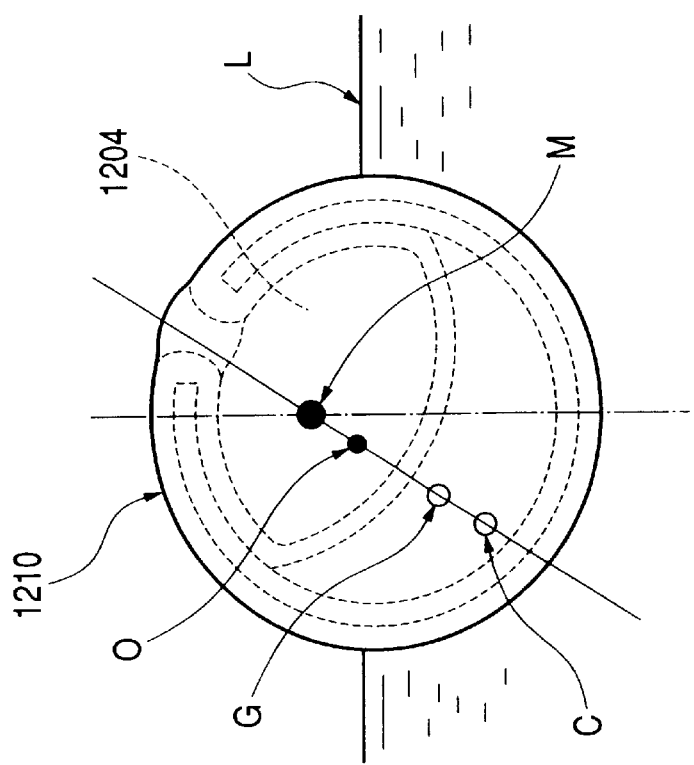
FIGS. 53A and 53B are views which illustrate conditions to enable the solid type semiconductor device manufactured by the method shown in FIGS. 50A to 50G to hold the stabilized state in liquid.
Figure 53B:
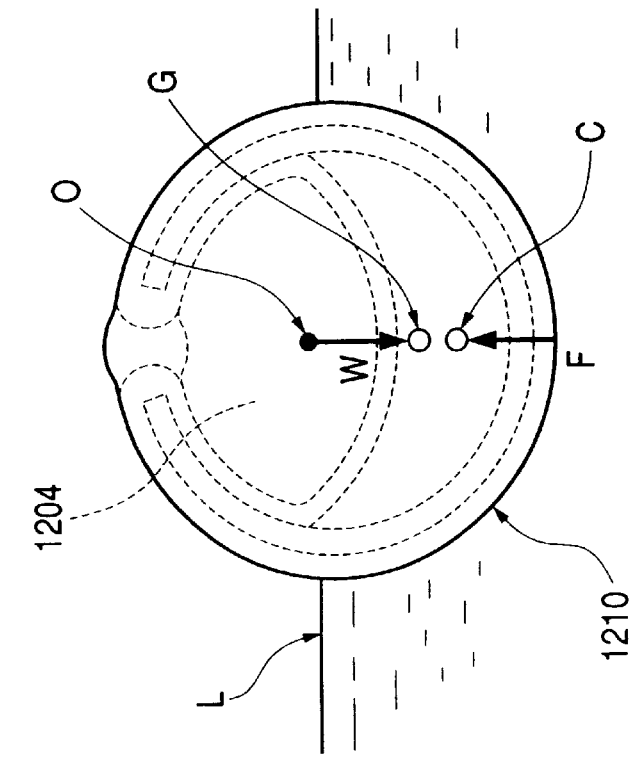

As shown in FIG. 53A and FIG. 53B, when the ball semiconductor device 1210 of this example is allowed to float in liquid, it is necessary, as shown in FIG. 53A, to satisfy the relations that (1) buoyance F=weight W and (2) the line of action of buoyance and that of weight (line that runs through the center of gravity G) are in agreement in order to keep the device in balanced condition. In FIG. 53A and FIG. 53B, a reference mark L designates ink liquid surface; O, liquid surface; G, the center of gravity; C, buoyance; and M, metacenter.

Then, as shown in FIG. 53B, when liquid is caused by external force to vibrate, and the solid type semiconductor device 1210 is slightly inclined from the balanced condition to move the center of buoyance, the couple of forces is formed by the buoyance and weight.

Here, the intersection point of the line of action of weight (indicated by one-dot chain line in FIG. 53B) in the balanced condition and that of buoyance (indicated by solid line in FIG. 53B) in the inclined condition is called "metacenter", and the distance h between the metacenter and the center of gravity is called "height".

As shown in this example, the metacenter of solid type semiconductor device 1210 is positioned higher than the center of gravity. Therefore, the couple of forces (restoring force) acts in the direction in which the original position of balanced condition is regained.

This restoring force: T cam be expressed as follows:

$$T = Wh\sin\theta = Fh\sin\theta$$

$$= \rho g Vh\sin\theta \quad (>0)$$

where the V is the volume of liquid displaced by the solid type semiconductor device 1210, and the ρg is the amount of specific gravity of solid type semiconductor device 1210.

Now, therefore, to make h>0 is essentially sufficient condition in order to make the restoring force positive.

Then, from the representation of FIG. 53B, h becomes as given below.

$$h=(I/V)-\overline{CG}$$

where the I is inertia momentum around the O axis. Therefore, the relations of:

$$(I/V)>\overline{CG}$$

become the prerequisite of the ball semiconductor device 1210 to float stably in ink, and perform the induction of electromotive force from the external resonance circuit, as well as to make the bidirectional communications with communicating means outside the device.

Figure 54A:
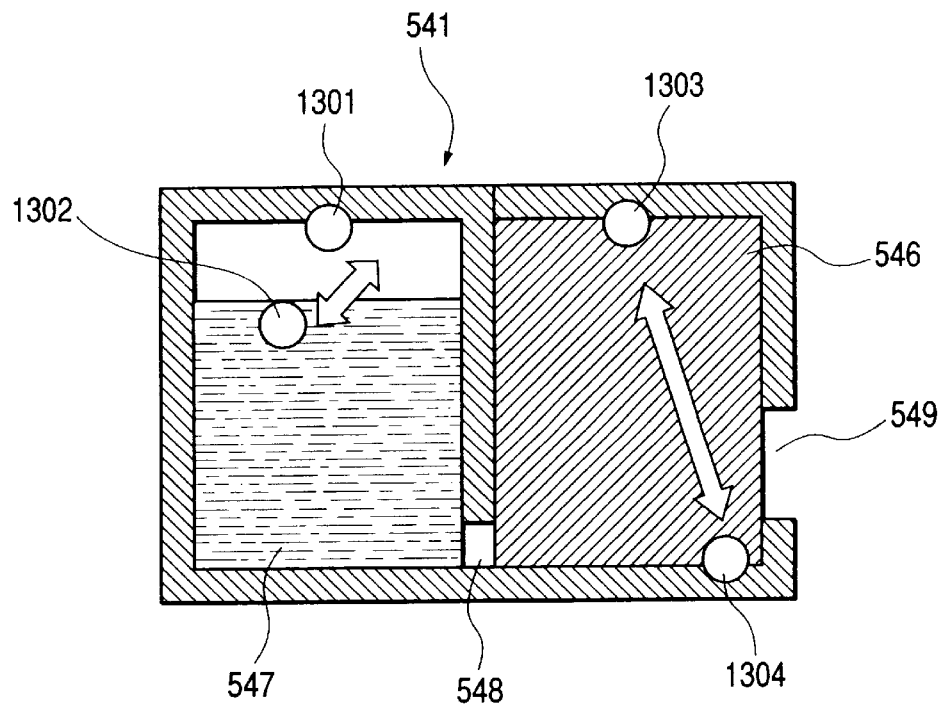
FIGS. 54A and 54B are views which illustrate the example of ink tank for which the solid type semiconductor device of the present invention can be arranged preferably.
Figure 54B:
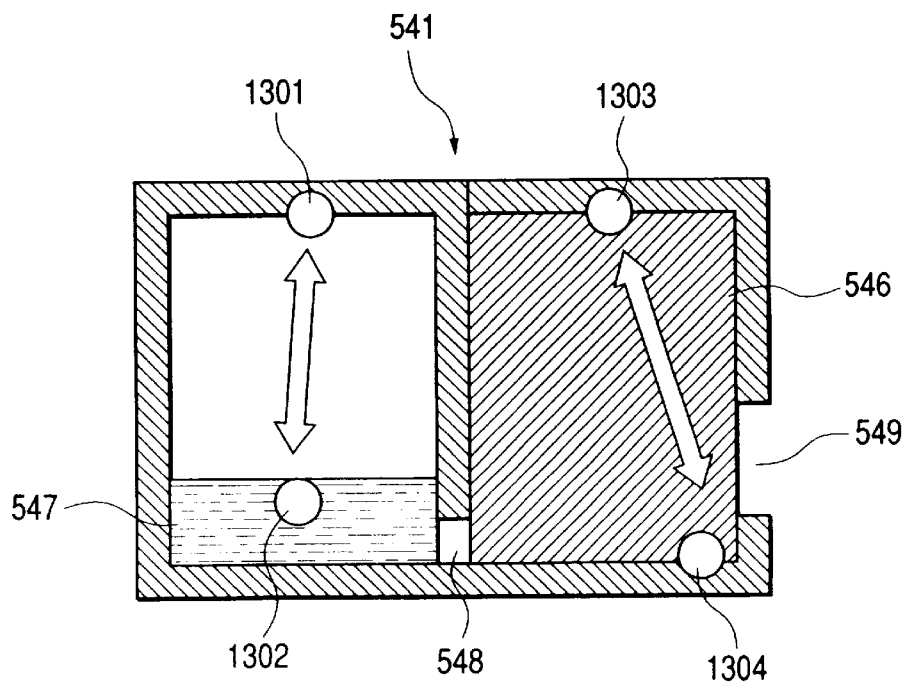

FIG. 54A and FIG. 54B are views which illustrate schematically the structure of ink tank that uses the solid type semiconductor device. The ink tank 541 shown in FIG. 54A and FIG. 54B comprises a first chamber which is completely closed and contains ink 547; a second chamber which is the negative pressure chamber containing negative pressure generating member 546 in a state of being communicated with the air outside; and a communicative passage 548 that communicate the first and second chambers at the lowest part of the tank. Ink in the second chamber is consumed through the ink supply port 549 formed on the portion on the side opposite to the communicative passage 548 side on the wall portion that forms the second chamber. For this ink tank 541, a first solid type semiconductor device 1301 and a second solid type semiconductor device 1302 are arranged in the first chamber, and a third solid type semiconductor device 1303 and a fourth solid type semiconductor device 1304 are arranged in the second chamber.

As shown in FIG. 54A, the second solid type semiconductor device 1302 floats near the liquid surface of ink 547 in the first chamber of ink tank 541, and electromotive force is induced by means of magnetic induction from the external resonance circuit outside the ink tank 541. Also, resonant frequency can be generated. On the other hand, the first solid type semiconductor device 1301 fixed to the upper wall of ink tank 541 induces electromotive force by magnetic induction from the external resonance circuit outside the ink tank 541. Also, it receives the resonant frequency signals generated by the second solid type semiconductor device 1302, and the same time, accumulate them on information accumulating means. Further, it generates resonant frequency to communicate the ink information inside the ink tank 541 to the outside. In this case, the first solid type semiconductor device 1301 and the second solid type semiconductor device 1302 are provided with different functions, and the functions of these devices may be inverted or may be made the same.

Figure 55:
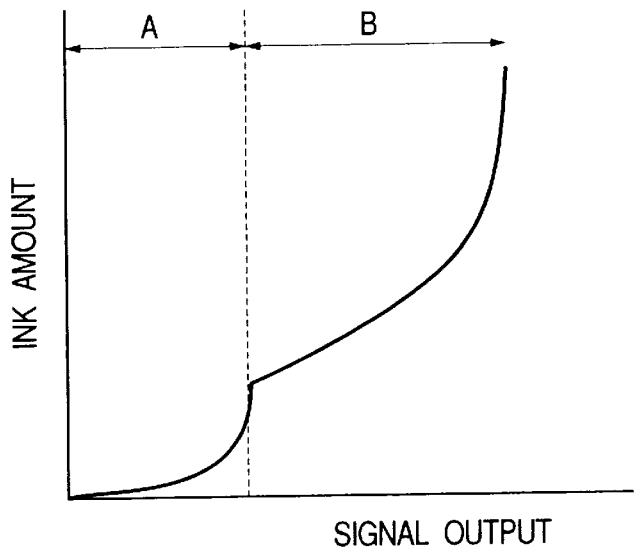
FIG. 55 is a view which illustrates the detection of ink amounts.

Next, the description will be made of the method for detecting the amount of ink in ink tank 541. With the operation of the first solid type semiconductor device 1301 and the second solid type semiconductor device 1302, the ink condition is set at the initial state as represented in FIG. 54A. From this condition, the first solid type semiconductor device 1301 and the second solid type semiconductor device 1302 are likewise operated in the condition where the amount of ink is reduced as shown in FIG. 54B. In this way, the amount of ink can be detected. Here, the description has been made of the two points in FIG. 54A and FIG. 54B, but with the periodical operation of the first and second solid type semiconductor devices 1301 and 1302, the amount of ink can be detected one after another. FIG. 55 shows the changes of ink amounts and the status of output signals at that time.

Now, the description will be made of the detection of ink amount in the second chamber (negative pressure generating chamber), in which the negative pressure generating member 546 is contained, after ink 547 in the first chamber is no longer available.

As shown in FIG. 54A, the third solid type semiconductor device 1303 and the fourth solid type semiconductor device 1304 are fixed in advance to designated position in the second chamber, respectively. For example, the third solid type semiconductor device 1303 is fixed to the upper wall of the second chamber, while the fourth solid type semiconductor device 1304 is fixed to the bottom face of the second chamber in accordance with the example shown in FIG. 54A and FIG. 54B. In this second chamber, the difference in resonant frequencies is utilized, which is detected by the third solid type semiconductor device 1303 and the fourth solid type semiconductor device 1304 by use of the amount of ink inside the negative generating member 546. If the signal output is set in advance so that the initial state in the second chamber is in agreement with the terminating point in the first chamber, it becomes possible to obtain the signal output curve shown in FIG. 55. Thus, the amount of ink inside the ink tank 541 can be detected at all the time. In FIG. 55, the area A corresponds to the negative pressure generating chamber, and the area B corresponds to the ink chamber.

As described above, with a plurality of solid type semiconductor devices being used, the amount of ink inside the ink tank 541 can be detected. Here, it is particularly possible to detect the amount of ink in the first chamber and the second chamber individually. Also, using a plurality of solid type semiconductor devices the initial condition in the second chamber can be set in particular. Therefore, while storing the full-tank condition of ink inside the ink tank 541 on a memory, comparison with that condition (differential detection) is being performed to make it possible to detect the amount of ink more accurately.

As described above, it is required for the solid type semiconductor device of the present invention to operate using energy from the outside and discriminate the amount of ink or the like inside the ink tank, and then, to communicate exact information to the outside at high speed. However, in order to provide the recording head (ink tank) which is in operation with energy from the outside stably, high-level art is needed, and also, the device can be driven with the lowest possible electric power. Also, non-volatile memory is needed so that information can be kept without providing energy at all times, while information can be rewritten as required. Further, it is necessary to form these means inside the solid type semiconductor device, which requires miniaturization thereof. In this respect, however, the usual semiconductor process used for the other devices can be applied with an advantage in costwise.

With these aspects in view, it has been found that the FeRAM formed by ferroelectrics is optimally usable as information accumulating means provided for the solid type semiconductor device of the present invention. The characteristics of ferroelectric material used for the FeRAM are the memory function with respect to the electric field, and using this as dielectrics for the memory capacitor in the conventional DRAM it becomes possible to provide DRAM with non-volatility while maintaining the high speed thereof. With the high speed access being possible, and no data being eliminated by non-volatility even if the power-supply source is unstable, the solid type semiconductor device can be used for an ink tank effectively. With the accumulation of information on such FeRAM, it becomes possible to process information exactly, and perform signal communication with the outside bidirectionally, as well as to drive this device at low voltage.

At the same time, the ferroelectric material has higher dielectric constant in general to make it possible to form a capacitor o large capacitance. As a result, the wireless communication which does not use any wiring is possible between the ink tank and recording apparatus, and at the same time, the freedom of communication is enhanced for the solid type semiconductor device. Here, given the inductance of coil formed for the solid type semiconductor device as L, and the capacitance of capacitor formed for the solid type semiconductor device as C, the communication frequency f of the solid type semiconductor device can be obtained by the following formula:

$$f = \frac{1}{2\pi\sqrt{LC}}$$

Therefore, when the ferroelectric material of FeRAM serving as information accumulating means is filmed, it is possible to make the capacitance C grater for the solid type semiconductor device by utilizing the ferroelectrics as capacitor. Thus, the solid type semiconductor device can communicate at low frequency. The freedom of communication becomes more accordingly.

Now, the description will be made of the method for manufacturing the ferroelectrics used for the FeRAM serving information accumulating information of the present invention.

Figure 56:
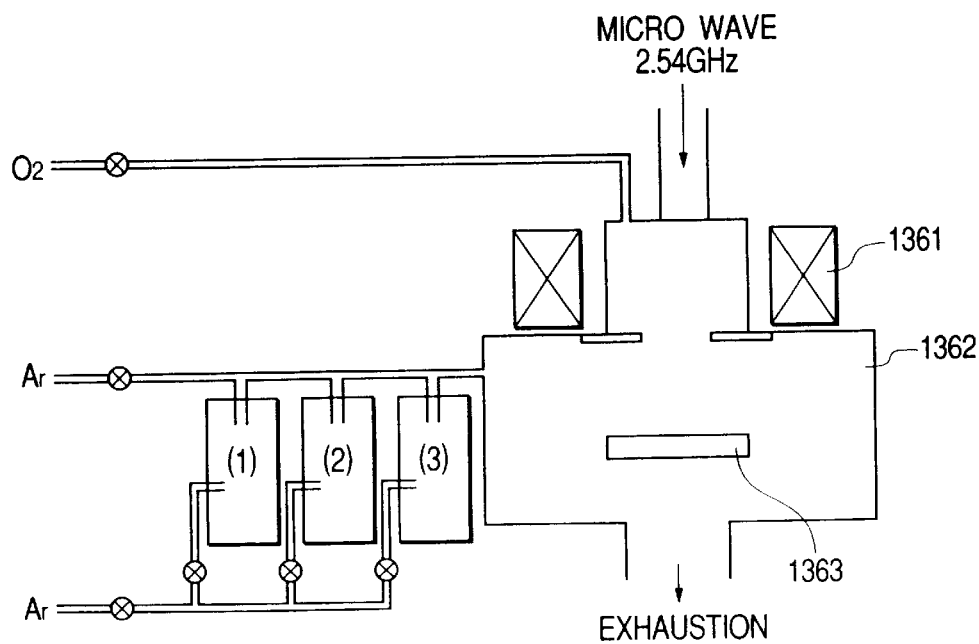
FIG. 56 is view which schematically shows the ECR plasma CVD apparatus used for manufacturing the ferroelectrics of FeRAM for the solid type semiconductor device.

FIG. 56 is a view which schematically shows the ECR plasma CVD apparatus used for this method of manufacture.

The method of manufacture described in conjunction with FIG. 56 is to form the ferroelectrics using ECR plasma CVD method and (Ba—Sr) TiO$_3$ (BST: barium titanate strontium) as structural material of thin ferroelectric film of FeRAM serving as information accumulating means of solid type semiconductor device.

As the material of ferroelectric material formed by the ECR plasma CVD, Ba (DPM)$_2$[bis-dipivaloyl-methanate barium], Sr (DPM)$_2$, Ti(O-i-C$_3$H$_7$)$_4$ and O$_2$ are used. The Ba(DPM)$_2$ and Sr(DPM)$_2$ are supplied at high temperature each almost close to the fusion point into the chamber 1362 of the apparatus with Ar gas as carrier shown in FIG. 56. Also, the Ti(O-i-C$_3$H$_7$)$_4$ is hubbled by carrier Ar gas to be supplied into the chamber 1362. Meanwhile, the O$_2$ gas is also supplied into the chamber 1362. In the chamber 1362, spherical silicon is held on the sampling stand 1363.

Then, microwave of 2.54 GHz is induced into the chamber 1362 through magnetic coil 1361 to make the aforesaid material arranged in the chamber 1362 to be plasmic. Thus, the materials reach the surface of sampling stand 1363 where the spherical silicon is held in the chamber 1362, and on the surface of spherical silicon on the sampling stand 1363, thin ferroelectric film formed by ferroelectric materials is produced. It may be possible to enable the sampling stand 1362 to rotate or to move in order to form the thin ferroelectric film uniformly on the surface of spherical silicon.

In this respect, the description has been made of the aforesaid method by use of ECR plasma CVD method, but the method is not necessarily limited thereto. Besides this method, it may be possible to adopt plasma CVD method, thermal CVD method, MOCVD (Molecular Organic CVD) method, sputtering method, or the like for the formation thereof.

Also, as the materials of thin ferroelectric film, it may be possible to use, besides those described above, PZT (zirconate titanate: [solid solution of PbZrO$_3$ and PbTiO$_3$]): Pb-Zrx—Til-xO$_3$, SBT (bismuth strontium tantalate):Sr—Bi$_2$—Ta$_2$ O$_9$, SrTiO$_3$ (STO: strontium titanate), BaTiO$_3$ (BTO: barium titanate), or PLZT (PZT, that is, metallic oxide formed by adding La to the solid solution of PbZrO$_3$ and PbTiO$_3$):(Pb, La)—(Zr, Ti)O$_3$ or the like.

As the bidirectional communication method adopted for the systems using the solid type semiconductor device, it is possible to use the wireless LAN system that uses frequencies of microwave band or the wireless access system that utilizes frequencies of quasi-millimeter wave to millimeter wave band.

In this respect, the description will be made of the outline of reception and transmission in the wireless LAN system. Now, hereunder, the data transmission from the solid type semiconductor device to the recording apparatus will be described; on the contrary, when data is transmitted from the recording apparatus side to the solid type semiconductor device, discrimination is also possible by the data ID which has been distributed to the transmission and reception sides, respectively.

For the solid type semiconductor device on the transmission side, each portion of the line monitor, data handling, acknowledgement and checking, and error processing is arranged, and for the recording apparatus on the reception side, each portion of the data handling, acknowledgement, error processing, and display is arranged, among some others.

Figure 57:
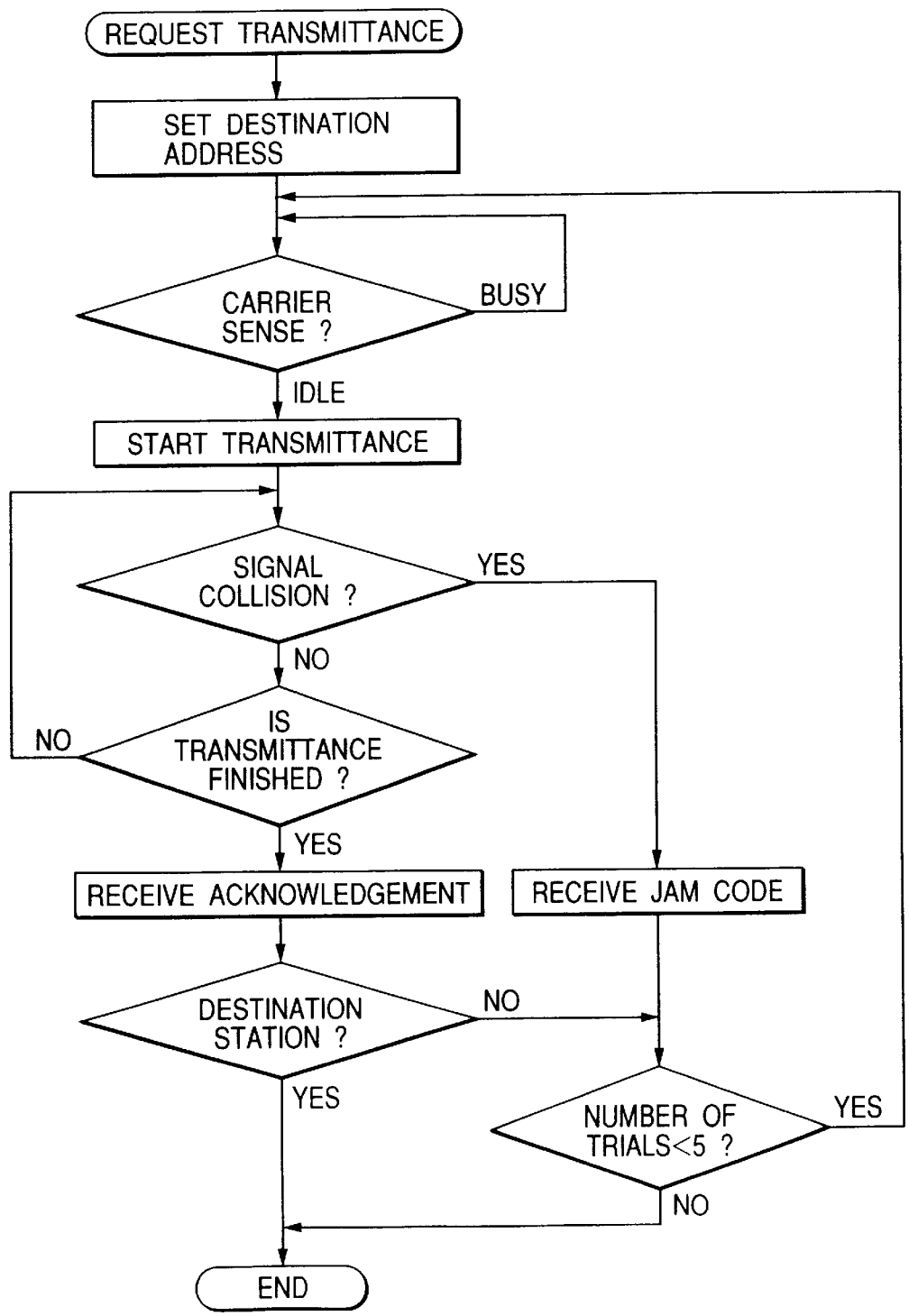
FIG. 57 is a view which shows the flowchart of bidirectional communications between solid type semiconductor and recording apparatus on the transmitting side of the solid type semiconductor embodying the present invention.

FIG. 57 is a flowchart which shows the procedures for the solid type semiconductor device on the transmission side. When data is transmitted, the initial setting is made in accordance with the prearranged communication protocol, and then, the address on the reception side is set for transmitting data. If any signal collision occurs during communication or no acknowledgement is returned from the device on the reception side, data is again transmitted. During operation, the line status, and the absence or presence of acknowledgement are indicated on the display screen or the like provided for the recording apparatus on the reception side, thus enabling the user to respond and take action exactly on the respective operations.

Figure 58:
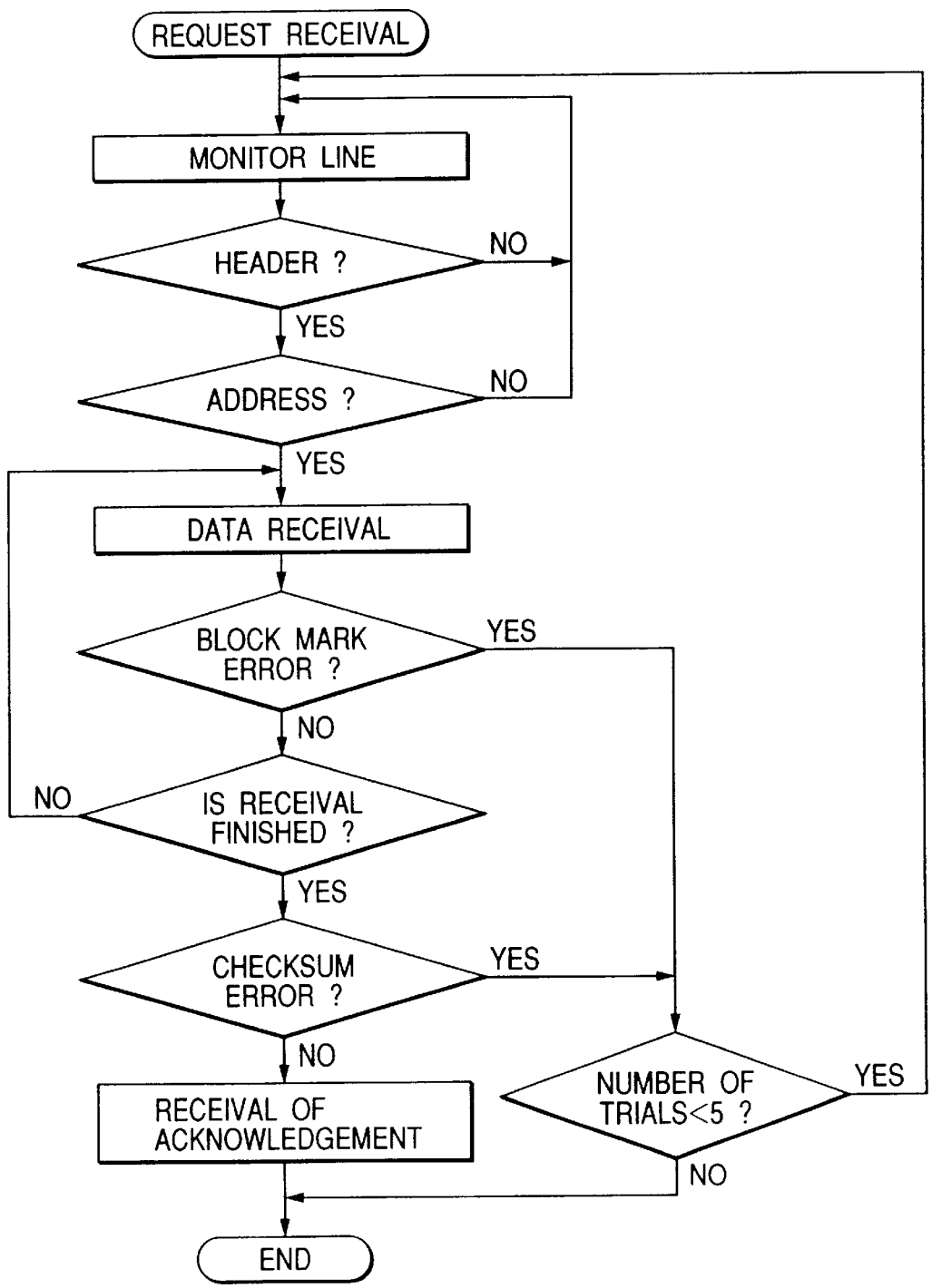
FIG. 58 is a view which shows the flowchart of bidirectional communications between solid type semiconductor and recording apparatus on the receiving side of the solid type semiconductor embodying the present invention.

FIG. 58 is a flowchart which shows the procedures for the recording apparatus on the reception side. On the reception side, the line monitoring is always on, and when the availability of address of on that side own is ascertained, data are fetched from the line and accumulated on the buffer of the main memory. During reception, if block mark cannot be acknowledged per 16 bytes or the checked sums are not identical due to erroneous detection process after the completion of reception, the current reception is suspended, Then, line is monitored again, waiting for the arrival of header. If reception is completed without any errors, the contents of reception are indicated on the display screen.

For the solid type semiconductor device of the embodiments described above, the magnetic induction generated by means of coil is used as external energy for supplying electric power to actuate the device, but it may be possible to use light. Then, in order to convert the brightness and darkness of light into electric signals, the material that changes the resistive values by the irradiation of light (photoconductor, for instance) is used to generate electric power with photoconductive effect thus produced. As the photoconductor, Cds, InSb or $Hg_{0.8}Cd_{0.2}Te$ or some other two- or three-dimensional alloys, GaAs, Si, Va-Si, or the like is usable. Further, when heat is used as electromotive force, it is possible to generate electric power by means of quantum effect of radiation energy from substance.

Also, the solid type semiconductor device embodying the present invention is preferably applicable to the ink jet printer which makes it possible to detect the information of ink and tank as well related to the ink jet recording printer that prints on a recording sheet by ink droplets discharged from the recording head to which ink contained in the detachably mounted ink tank is supplied to the ink jet recording head, and communicate such information to the ink jet recording printer in order to control the printer with an adequate method or to enable the ink jet printer to control condition inside the ink tank to maintain it optimally.

In this respect, although the outer appearance of the ink jet recording apparatus is not shown for the present embodiment, if the outer cover may be arranged to be semi-transparent, and also, a semi-transparent ink tank is made usable, light can be adopted as communicating means. Then, the user can observe the light condition of the tank to easily notice such condition as "tank should be replaced". In this way, the user is prompted to replace tanks. (The button of the apparatus main body has been arranged to be illuminated conventionally, but such illuminations may indicate several functions dually to make it difficult for the user to notice the contents of information carried by the way of light being illuminated.)

The solid type semiconductor device of the present invention comprises means for converting external energy; means for obtaining external environmental information and information accumulating means which operate by the energy made usable by this energy converting means; discriminated means for comparing the information thus obtained and accumulated information for discrimination; and information communicating means for communicating the information thus obtained to be displayed or communicated to the outside. Then, with information accumulating means that uses the FeRAM which is formed by ferroelectrics, it becomes possible for the device to efficiently obtain the environmental information that surrounds it, while utilizing the spherical configuration fully. Further, communicating means is arranged to receive signals from the outside, and obtain information in accordance with the signals thus received. Then, when the result of comparison between such information and accumulated information is transmitted to the outside together with the information thus received, the accumulated information is stored on the FeRAM which is non-volatile memory formed by ferroelectrics, hence making it possible to perform information process exactly, and execute signal communications with external apparatus bidirectionally at high speed and low voltage. Further, with the utilization of ferroelectric material of FeRAM as capacitor, it becomes possible to make the capacitance of solid type semiconductor device larger so that the degree of communication freedom is enhanced when the solid type semiconductor device communicates with the outside.

Also, with a plurality of solid type semiconductor devices arranged in an ink tank, it becomes possible to communicate in real time such information of ink contained in the ink tank, pressure inside the tank, and the like to the outside, such as an ink jet recording apparatus. For example, in order to stabilize ink jet discharges by controlling the degree of negative pressure inside the tank that changes from time to time along with the ink consumption, it is required to provide the capability to operate at high speed with low power dissipation, as well as the optimal size of the device owing to the restriction imposed upon the availability of space. With these aspects in view, this device advantageously stores accumulated information on the FeRAM which is formed by ferroelectrics to meet the requirements.

Further, it is structured to supply in non-contact the external energy which is needed to drive the solid type semiconductor device. Therefore, there is no need for the provision of energy supply source for actuating the device inside the ink tank or for the provision of the energy supply wiring to be connected with the device, thus making it possible to use the device in the location where it is difficult to set up any direct wiring with the outside.

For example, when the electric power is used as energy to actuate the device, the conduction coil of an oscillation circuit is formed to be wound around the outer surface of solid type semiconductor device as external energy converting means. In this way, by means of magnetic induction, electric power is generated in the conduction coil between the external resonance circuit and the oscillating circuit, thus making it possible to supply electric power to the device in non-contact.

In this case, since the coil is wound on the outer surface of device, the intensity of inductance of coil changes depending on the ink remainders inside the ink tank, ink density, pH of ink, for example. Therefore, the oscillating circuit changes the oscillating frequency in accordance with the changes of such inductance. In this way, it also becomes possible to detect the ink remainders inside the ink tank or the like based upon the updated changes of oscillating frequency.

Then, The solid type semiconductor device is provided with a hollow portion in order to float in liquid, and at the same time, the center of gravity of device is formed to be set at the position lower than the center of device. For example, therefore, even if the recording head and ink tank mounted on the ink jet recording apparatus operate serially to cause ink inside the ink tank to sway up and down, and right and left, the device floats stably in ink inside the ink tank, while detecting the information of ink, pressure inside the ink tank, and the like, in good precision. Moreover, it is made possible to hold the coil of oscillation circuit formed for the device described above on the position which is stabilized with respect to the coil of external resonance circuit, hence enabling the bidirectional communication to be made stably at all the time.

What is claimed is:

1. A solid type semiconductor device structured in the solid form comprising:

energy converting means for converting energy from outside;

operating means operated by energy converted by said energy converting means.

2. A solid type semiconductor device according to claim 1, wherein said operating means is valve mechanism for opening and closing passage.

3. A solid type semiconductor device according to claim 2, wherein said valve mechanism is arranged for a container keeping negative pressure in the interior thereof to constitute pressure adjustment means for negative pressure inside said container in accordance with negative pressure in the interior of container.

4. A solid type semiconductor device according to claim 2, said valve mechanism is provide with a movable portion displaceable by electrostatic attraction.

5. A solid type semiconductor device according to claim 3, wherein said negative pressure adjustment is made by opening said passage by the operation of said valve mechanism to induce the air outside into the interior of said container when the negative pressure inside said contain becomes high.

6. A solid type semiconductor device according to claim 1, further comprising pressure detecting means for detecting negative pressure inside said container by being operated by energy converted by said energy converting means, said pressure adjustment means adjusting negative pressure inside said container in accordance with the result of detection by said pressure detecting means.

7. A solid type semiconductor device according to claim 6, wherein said pressure detecting means is a pressure sensor provided with diaphragm formed by polysilicon film to detect negative pressure inside said container utilizing change of resistive values by the displacement of said diaphragm.

8. A solid type semiconductor device according to claim 1, wherein said operating means is information communicating means for communicating information to display information externally or communicate information to the outside.

9. A solid type semiconductor device according to claim 1, further comprising recognizing means for recognizing personal information and holding said recognized personal information with actuation by electric power.

10. A solid type semiconductor device according to claim 9, further comprising means for encoding said recognized personal information.

11. A solid type semiconductor device according to claim 10, wherein means for holding said recognized personal information is arranged in solid type semiconductor device.

12. A solid type semiconductor device according to claim 11, wherein data is eliminated when the interior is released.

13. A solid type semiconductor device according to claim 12, wherein a hollow portion is formed in solid type semiconductor device, and circuit is formed on the portion facing said hollow portion by use of oxidized material extinguishable by oxidation.

14. A solid type semiconductor device according to claim 11, wherein means for encoding said recognized personal information encodes the recognized information by use of a part of key code, and a part of said key code is provided by external apparatus, and the encoded data cannot be decoded but only by the reaming part of said key code.

15. A solid type semiconductor device according to claim 9, wherein said personal information is voice, a finger print, or an iris of eyeball.

16. A solid type semiconductor device according to claim 9, wherein means for holding said recognized personal information is image memory for holding a patterned image.

17. A solid type semiconductor device according to claim 16, wherein said image memory is formed by non-volatile semiconductor.

18. A solid type semiconductor device according to claim 15, wherein the iris of eyeball is obtained by image sensor.

19. A solid type semiconductor device according to claim 1, further comprising:

information acquiring means for acquiring external environmental information;

information accumulating means for accumulating information to be compared with acquired information by said information acquiring means; and discriminating means for discriminating the necessity to communicate information by comparing the acquired information acquired by said information acquiring means with the corresponding information accumulated on said information accumulating means, wherein said information communicating means displays the information acquired by said information acquiring means externally or communicates said information to the outside when said discriminating means discriminates the necessity of communicating information, and said information acquiring means, said information accumulating means, and said discriminating means are also operated by energy converted by said energy converting means.

20. A solid type semiconductor device according to claim 1, further comprising:

reception means for receiving signals from the outside; and information accumulating means for accumulating information, wherein said information communicating means displays or communicate information stored on said information accumulating means in accordance with signals received by said reception means, and said reception means and said information accumulating means are also operated by energy converted by said energy converting means.

21. A solid type semiconductor device according to claim 1, further comprising:

reception means for receiving signals from the outside;

information acquiring means for acquiring external environmental information;

information accumulating means for accumulating information to be compared with acquired information by said information acquiring means; and discriminating means for enabling said information acquiring means to acquire external environmental information in accordance with signals received by said reception means, and comparing said acquired information with the corresponding information stored on said information accumulating means to determine whether or not said acquired information satisfies designated conditions, wherein said information communicating means displays at least the result of determination of said discriminating means externally or communicate said result to the outside, and said reception means, said information accumulating means, and said discriminating means are also operated by energy converted by said energy converting means.

22. A solid type semiconductor device according to claim 1, wherein said information communicating means displays on or communicate information to other solid type semiconductor devices.

23. A solid type semiconductor device according to either one of claim 19 to claim 21, wherein said information accumulating means is FeRAM formed by ferroelectrics.

24. A solid type semiconductor device according to claim 23, wherein the structural material of said ferroelectrics is PZT, PLZT, SBT, $SrTiO_3$, $BaTiO_3$, or $(Ba—Sr)TiO_3$.

25. A solid type semiconductor device according to claim 20, wherein said reception means receives signals from other solid type semiconductor device.

26. A solid type semiconductor device according to claim 21, wherein said reception means receives signals from other solid type semiconductor device.

27. A solid type semiconductor device according to claim 1, wherein the external energy converted by said energy converting means is supplied in non-contact.

28. A solid type semiconductor device according to claim 1, wherein energy converted by said energy converting means is electric power.

29. A solid type semiconductor device according to either one of claim 19 to claim 21, wherein said information communicating means also displays information on or communicating information to other solid type semiconductor device.

30. A solid type semiconductor device according to claim 1, wherein said information communicating means is light emitting means for converting the energy converted by said energy converting means into light to display externally or communicate information to said outside.

31. A solid type semiconductor device according to claim 30, wherein said light emitting means is structured to emit light containing wavelength within a range of 300 to 700 nm.

32. A solid type semiconductor device according to claim 30, wherein said light emitting means is structured to emit light having wavelength of 500 nm.

33. A solid type semiconductor device according to claim 1, wherein the external energy converted by said energy converting means is electromotive force by electromagnetic induction, heat, light, or radiating rays.

34. A solid type semiconductor device according to claim 1, wherein said energy converting means is provided with the conductor coil and oscillation circuit for generating electric power by electromagnetic induction between external resonance circuit and said oscillation circuit.

35. A solid type semiconductor device according to claim 34, wherein said conductor coil is formed to be wound around the outer surface of solid type semiconductor device.

36. A solid type semiconductor device according to claim 1, further comprising means for generating buoyance to generate buoyance using energy converted by said energy converting means.

37. A solid type semiconductor device according to claim 1, wherein said solid type semiconductor device is provided with a hollow portion in order to float on a designated position on the liquid surface or in liquid.

38. A solid type semiconductor device according to claim 37, wherein the center of gravity of solid type semiconductor device is positioned lower than the center of said device so as not to allow the device to rotate but to sway stably in the liquid for the device to float therein.

39. A solid type semiconductor device according to claim 38, wherein the metacenter of solid type semiconductor device is placed above the center of gravity of said solid type semiconductor device at all times.

40. A communication system using solid type semiconductor device comprising:

a liquid container having said solid type semiconductor device arranged therefor;

an oscillation circuit provided with conductor coil, information acquiring means for acquiring information inside said container, reception means for receiving signals from the outside, and information communicating means for communicating information to the outside formed for said solid type semiconductor device;

an external resonance circuit arranged outside said solid type semiconductor device to generate electric power by magnetic induction between said circuit and the oscillation circuit of said solid type semiconductor device; and an external communication means for communicating bidirectionally by said reception means and said information communicating means of said solid type semiconductor device.

41. A communication system according to claim 40, wherein the center of gravity of solid type semiconductor device is positioned lower than the center of said device so as not to allow the device to rotate but to sway stably in the liquid for the device to float therein.

42. A communication system according to claim 41, wherein the metacenter of solid type semiconductor device is placed above the center of gravity of said solid type semiconductor device at all times.

43. A method for manufacturing a solid type semiconductor device, comprising the following steps of:

forming a protection film A on the entire surface of Si;

forming opening on a part of said protection film A;

removing only the upper part of said Si;

forming a protection film B on the inner and outer surfaces of the work formed by said Si and protection film A;

making the hollow portion in airtightly closed condition by use of conductive material; and forming conductor coil made by said conductive material.

44. A method for manufacturing a solid type semiconductor device, comprising the following steps of:

forming a protection film A on the entire surface of Si;

forming opening on a part of said protection film A;

removing only the upper part of said Si;

forming a protection film B on the inner and outer surfaces of the work formed by said Si and protection film A;

making the hollow portion in airtightly closed condition by use of conductive material and forming conductive film on the entire surface thereof; and patterning said conductive film to from conductor coil made by conductive material.

45. A security system of a recording apparatus having a recording head cartridge detachably mounted thereon, wherein said recording head cartridge comprises a recognized data holding portion for holding as recognized data the personal information recognized by recognizing portion for recognizing personal information; a key code A holding portion for holding key code A; an encode converting portion for encoding said recognized data by said key code A; an encoded data holding portion for holding the encoded data by said encode data converting portion; an information input and output portion for receiving said key code A from said recording apparatus side, and for transmitting said recognized data and said encoded data to said recording apparatus; an energy converting portion for converting electromotive force supplied from said recording apparatus side in non-contact into electric power for actuating each of structural portions, and said recording apparatus comprises an energy supplying portion for supplying electromotive force to said energy converting portion in non-contact; a key code K setting portion for the owner of recording apparatus to set the key code K; a key code A holding portion and a key code B holding portion for holding key code A and key code B created from said key code K, respectively; an information input and output portion for transmitting said key code A to said solid type semiconductor device, and for receiving said recognized data and said encoded data from said solid type semiconductor device side; a recognized data holding portion for holding said recognized data; an encoded data holding portion for holding said encoded data; a decode converting portion for decoding said encoded data by said key code B; a decoded data holding portion for holding decoded data by said decode converting portion; a data comparing portion for comparing said recognized data and said decoded data for reference; and discrimination processing portion for admitting the use of recording apparatus or making the use thereof impossible in accordance with the result of comparison by said data comparing portion.

46. A security system according to claim 45, wherein the encoded data by the key code A cannot be decoded by said key code A but by only said key code B.

47. A security system according to claim 45, wherein said personal information is voice, a finger print, or an iris of eyeball.

48. A security system according to claim 45, wherein said data recognizing portion, said key code A holding portion, said encode converting portion, said encode converting portion are arranged in said solid type semiconductor device, and said information input and output portion and said energy converting portion are formed on the surface or neat the surface of said solid type semiconductor device.

49. A security system according to claim 45, wherein the electromotive force supplied by said energy supplying portion and converted by said energy converting portion into electric power is electromagnetic induction, heat, light, or radiated rays.

50. A security system according to claim 49, wherein said energy supplying portion and said energy converting portion are installed face to face when said recording head cartridge is mounted.

51. A security system according to claim 50, said energy supplying portion if formed by a resonance circuit provided with conductor coil, and said energy converting portion is formed by an oscillation circuit provided with conductor coil adjacent to the conductor coil of said resonance circuit, and said conductor coil of oscillation circuit performs the conversion of electric power by electromagnetic induction from said resonance circuit.

52. A security system according to claim 51, wherein the conductor coil of said oscillation circuit is formed to be wound around the outer surface of said solid type semiconductor device.

53. An ink tank having at least one solid type semiconductor device arranged therefor, comprising:

energy converting means for converting energy from the outside; and operating means operated by energy converted by said energy converting means.

54. An ink jet recording apparatus having an ink tank according to claim 53 mounted thereon, being provided with photosensitive means for receiving light emitted by light emitting means of said solid type semiconductor device arranged in said ink tank, and transmitted through ink contained in said ink tank.

55. An ink jet recording apparatus according to claim 54, wherein each of said plural ink tanks is structured to be installed on designated position in accordance with the kind of ink contained in said ink tank, respectively, and comprises means for issuing warning to the user when said photosensitive means receives said light and detects said ink tank being installed on an inadequate position.

56. An ink jet recording apparatus according to claim 54, wherein each of said plural ink tanks is structured to be installed on designated position in accordance with the kind of ink contained in said ink tank, respectively, and comprises controlling means for controlling the recording head having ink to be supplied from said installed ink tank in accordance with said kind of ink when said photosensitive means receives said light and detects said ink tank being installed on an inadequate position.

57. An ink tank containing ink to be supplied to a discharge head for discharging ink, and holding negative pressure in the interior thereof, comprising:

pressure adjustment means for adjusting negative pressure in said interior in accordance with negative pressure in said interior; and energy converting means for converting energy provide from the outside into energy of different kind from said energy for operating said pressure adjustment means.

58. An ink tank according to claim 57, wherein said pressure adjustment means comprises passage for communicating said interior and outside; and a valve mechanism for opening and closing said passage.

59. An ink tank according to claim 58, wherein said valve mechanism is provide with a movable portion displaceable by electrostatic attraction.

60. An ink tank according to claim 57, wherein said negative pressure adjustment is made by opening said passage by the operation of said valve mechanism to induce the air outside into the interior of said interior when negative pressure in said interior becomes high.

61. An ink tank according to claim 57, further comprising pressure detecting means for detecting negative pressure in said interior by being operated by energy converted by said energy converting means, said pressure adjustment means adjusting negative pressure in said interior in accordance with the result of detection by said pressure detecting means.

62. An ink tank according to claim 61, wherein said pressure detecting means is provided with diaphragm formed by polysilicon film to detect negative pressure in said interior utilizing change of resistive values by the displacement of said diaphragm.

63. An ink tank according to claim 61, further comprising:
information accumulating means for accumulating conditional information of negative pressure admitted by ink tank; and
discriminating means for discriminating the necessity to adjust pressure in said interior by comparing the result of detection of said pressure detecting means and information accumulated on said information accumulating means, wherein
said pressure adjustment means adjusts said negative pressure when said discriminating means discriminates the necessity to adjust negative pressure, and
said information accumulating means and said energy converting means are operated by energy converted by said energy converting means.

64. An ink tank according to claim 61, further comprising:
information accumulating means for accumulating conditional information of negative pressure admitted by ink tank;
reception means for receiving signals from the outside; and
discriminating means for enabling said pressure detecting means to detect said negative pressure in accordance with signals received by said reception means, and comparing the result of detection by said pressure detecting means with information stored on said information accumulating means to determine whether or not said result of detection satisfies said conditional information of negative pressure, wherein
said pressure adjustment means adjusts said negative pressure when said result of detection is determined by said discriminating means not to satisfy said conditional information of negative pressure, and
said information accumulating means, said reception means, and said discriminating means are operated by energy converted by said energy converting means.

65. An ink tank according to claim 61, wherein said energy converting means is provided with oscillating circuit for generating electric poser by induction electromotive force with electromagnetic induction between said circuit and resonance circuit arranged outside.

66. An ink tank according to claim 57 wherein said ink tank is provided with a discharge head, and contains ink to be supplied to said discharge head.

67. A method for adjusting pressure using a solid type semiconductor device arranged for a container holding negative pressure in the interior thereof, being provided with pressure adjustment means for adjusting negative pressure inside said container in accordance with the internal pressure of said container, and energy converting means for converting energy provided from outside into different kind of energy from said energy in order to operate said pressure adjustment means, comprising the following step of:
keeping pressure inside said container regularly by comparing pressure detected by said pressure detecting means for detecting pressure inside said container with the pressure inside said container.

68. A method for adjusting pressure according to claim 67, wherein said solid type semiconductor device is fixed to said container in a state of a part thereof being exposed to the outside of said container and another part exposed to the inside of said container, and said pressure adjustment means is provided with a passage communicating the interior of said container with the outside, and a valve mechanism for opening and closing said passage.

69. A method for adjusting pressure according to claim 68, wherein said valve mechanism is provide with a movable portion displaceable by electrostatic attraction.

70. A method for adjusting pressure according to claim 68, wherein said negative pressure adjustment is made by opening said passage by the operation of said valve mechanism to induce the air outside into the interior of said container when negative pressure in said interior becomes high.

71. A method for adjusting pressure according to claim 67, wherein said solid type semiconductor device comprises pressure detecting means for detecting negative pressure in said container by being operated by energy converted by said energy converting means, said pressure adjustment means adjusting negative pressure in said container in accordance with the result of detection by said pressure detecting means.

72. A method for adjusting pressure according to claim 71, wherein said pressure detecting means is provided with diaphragm formed by polysilicon film to detect negative pressure in said container utilizing change of resistive values by the displacement of said diaphragm.

73. A method for adjusting pressure according to claim 71, further comprising:
information accumulating means for accumulating conditional information of negative pressure admitted by said container; and
discriminating means for discriminating the necessity to adjust pressure in said container by comparing the result of detection of said pressure detecting means and information accumulated on said information accumulating means, wherein
said pressure adjustment means adjusts said negative pressure when said discriminating means discriminates the necessity to adjust negative pressure, and
said information accumulating means and said energy converting means are operated by energy converted by said energy converting means.

74. A method for adjusting pressure according to claim 71, further comprising:
information accumulating means for accumulating conditional information of negative pressure admitted by said container;
reception means for receiving signals from the outside; and
discriminating means for enabling said pressure detecting means to detect said negative pressure in accordance with signals received by said reception means, and comparing the result of detection by said pressure detecting means with information stored on said information accumulating means to determine whether or not said result of detection satisfies said conditional information of negative pressure, wherein
said pressure adjustment means adjusts said negative pressure when said result of detection is determined by said discriminating means not to satisfy said conditional information of negative pressure, and
said information accumulating means, said reception means, and said discriminating means are operated by energy converted by said energy converting means.

75. A method for adjusting pressure according to claim 71, wherein said energy converting means is provided with oscillating circuit for generating electric power by induction electromotive force with electromagnetic induction between said circuit and resonance circuit arranged outside.

76. An ink tank for containing ink to be supplied to a discharge head for discharging ink, wherein the internal pressure thereof is adjusted by use of the method for adjusting pressure according to claim 67.

77. An ink jet recording apparatus having an ink tank according to claim 53 mounted thereon, being provided with photosensitive means for receiving light emitted by light emitting means of said solid type semiconductor device arranged in said ink tank, and transmitted through ink contained in said ink tank.

78. An ink jet recording apparatus according to claim 77, wherein each of said plural ink tanks is structured to be installed on designated position in accordance with the kind of ink contained in said ink tank, respectively, and comprises means for issuing warning to the user when said photosensitive means receives said light and detects said ink tank being installed on an inadequate position.

79. An ink jet recording apparatus according to claim 77, wherein each of said plural ink tanks is structured to be installed on designated position in accordance with the kind of ink contained in said ink tank, respectively, and comprises controlling means for controlling the recording head having ink to be supplied from said installed ink tank in accordance with said kind of ink when said photosensitive means receives said light and detects said ink tank being installed on an inadequate position.

80. An ink tank according to claim 53, wherein at least one of said plural solid type semiconductor devices floats on the liquid surface of ink inside said ink tank or on a designated position in ink, and said plural solid type semiconductor devices compare the information acquired by said information acquiring means with the corresponding information stored on said information accumulating means, and after said discriminating means discriminates the necessity of communicating information, said information communicating means outputs the result of discrimination by said discriminating means to the outside.

81. An ink tank according to claim 80, wherein among said plural solid type semi-conductor devices, the other solid type semiconductor devices than the solid type semiconductor floating on the liquid surface of ink inside said ink tank are fixed to said ink tank, and said plural solid type semiconductor devices detect ink remainders inside said ink tank when said other solid type semiconductor devices fixed to said ink tank receive signal from said solid type semi-conductor device floating on said liquid surface of ink.

82. An ink jet recording apparatus having an ink tank according to claim 80 mounted thereon.

83. A memory element comprising energy converting means for converting external energy supplied from the outside in non-contact into electric power, wherein personal information is held by actuating said electric power.

84. A memory element according to claim 83, wherein said memory element is formed by non-volatile semiconductor.

85. A memory element according to claim 83, said memory element is provided with recognizing portion for recognizing personal information.

* * * * *

UNITED STATES PATENT AND TRADEMARK OFFICE
CERTIFICATE OF CORRECTION

PATENT NO. : 6,719,394 B2 Page 1 of 1
DATED : April 13, 2004
INVENTOR(S) : Kubota et al.

It is certified that error appears in the above-identified patent and that said Letters Patent is hereby corrected as shown below:

Title page,
Item [*] Notice, delete "328 days" to be replaced with -- 449 days --

Signed and Sealed this

Eleventh Day of January, 2005

JON W. DUDAS
*Director of the United States Patent and Trademark Office*

UNITED STATES PATENT AND TRADEMARK OFFICE
CERTIFICATE OF CORRECTION

PATENT NO. : 6,719,394 B2
DATED : April 13, 2004
INVENTOR(S) : J. Kubota et al.

It is certified that error appears in the above-identified patent and that said Letters Patent is hereby corrected as shown below:

Column 1,
Line 36, "decision" should read -- decisions --.

Column 2,
Line 40, "in no" should read -- is no --.

Column 5,
Line 48, "registration" should read -- register --.

Column 6,
Line 27, "from" should read -- form --.

Column 7,
Line 11, "provide" should read -- provided --.

Column 8,
Line 29, 32, 36 and 39, "which" should read -- which the --.
Lines 30, 33, 37 and 40, "arrange" should read -- arranged --.

Column 9,
Lines 62 and 66, "of" should read -- of the --.

Column 10,
Lines 2 and 4, "of" should read -- of the --.
Line 30, "is view" should read -- is a view --.

Column 11,
Line 22, "communicate" should read -- communicates --.
Line 38, "used" should read -- used by --.
Line 67, "of" should read -- of the --.

Column 13,
Line 53, "of" should read -- or --.

Column 14,
Line 45, "eclectic" should read -- electric --.
Line 49, "question" should read -- questions --.

UNITED STATES PATENT AND TRADEMARK OFFICE
CERTIFICATE OF CORRECTION

PATENT NO. : 6,719,394 B2
DATED : April 13, 2004
INVENTOR(S) : J. Kubota et al.

It is certified that error appears in the above-identified patent and that said Letters Patent is hereby corrected as shown below:

Column 17,
Line 8, "of" should read -- of the --.
Line 25, "being" should read -- beings --.

Column 18,
Line 12, "being" should read -- beings --.

Column 19,
Line 29, "of on end" should read -- of one end --.
Line 31, "constitutes" should read -- constitute --.
Line 32, "607 a" should read -- 607a --.

Column 21,
Line 38, "kind" should read -- kinds --.

Column 22,
Line 7, "discharge" should read -- discharging --.

Column 23,
Line 14, "formed" should read -- be formed --.

Column 25,
Line 1, "provide" should read -- provided --.

Column 27,
Line 46, "206 a" should read -- 206a --.

Column 28,
Line 30, "as a" should read -- As a --.

Column 31,
Line 67, "provide" should read -- provided --.

Column 32,
Line 67, "form" should read -- from --.

Column 35,
Line 61, "when" should read -- when a --.

UNITED STATES PATENT AND TRADEMARK OFFICE
CERTIFICATE OF CORRECTION

PATENT NO.    : 6,719,394 B2
DATED         : April 13, 2004
INVENTOR(S)   : J. Kubota et al.

It is certified that error appears in the above-identified patent and that said Letters Patent is hereby corrected as shown below:

Column 36,
Lines 21-22, "is arranged" should be deleted.
Line 30, "in tow-dimensionally," should read -- two-dimensionally, --.

Column 39,
Line 14, "surrounds" should read -- surround --.
Line 47, "The," should read -- Then --.

Column 41,
Line 35, "cam" should read -- can --.

Column 42,
Line 1, "communicate" should read -- communicates with --.
Line 67, "at all" should read -- all --.

Column 43,
Line 49, "o large" should read -- of large --.
Line 66, "grater" should read -- greater --.

Column 44,
Line 47, "$Bi_2$-$Ta_2$ $O_9$" should read -- $Bi_2$-$Ta_2O_9$, --

Column 45,
Line 26, "suspended," should read -- suspended. --

Column 47,
Line 1, "The" should read -- the --.
Line 14, "at all" should read -- all --.
Line 19, "outside;" should read -- outside; and --.
Line 32, "provide" should read -- provided --.

Column 48,
Line 4, "and" should read -- and a --.
Line 10, "of key" should read -- of a key --.
Line 20, "by" should read -- by a --
Line 53, "municate" should read -- municates --.

Column 49,
Lines 10 and 17, "communicate" should read -- communicates --.

UNITED STATES PATENT AND TRADEMARK OFFICE
CERTIFICATE OF CORRECTION

PATENT NO. : 6,719,394 B2
DATED : April 13, 2004
INVENTOR(S) : J. Kubota et al.

It is certified that error appears in the above-identified patent and that said Letters Patent is hereby corrected as shown below:

Column 51,
Line 1, "from" should read -- form --.
Line 56, "neat" should read -- near --.
Line 67, "if" should read -- is --.

Column 52,
Lines 44 and 52, "provide" should read -- provided --.

Column 53,
Line 43, "poser" should read -- power --.
Line 46, "claim 57" should read -- claim 57, --.

Column 54,
Line 5, "provide" should read -- provided --.

Column 56,
Lines 9 and 16, "semi-conductor" should read -- semiconductor --.

Signed and Sealed this

Second Day of August, 2005

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,719,394 B2 |
| APPLICATION NO. | : 09/829924 |
| DATED | : April 13, 2004 |
| INVENTOR(S) | : Masahiko Kubota et al. |

It is certified that error appears in the above-identified patent and that said Letters Patent is hereby corrected as shown below:

<u>COLUMN 48</u>
      Line 13, "reaming part" should read --remaining part--.

<u>COLUMN 51</u>
      Line 52, "said encode converting portion, said encode converting" should read --said encode converting portion, and said encoded data holding--.

Signed and Sealed this

Sixteenth Day of January, 2007

JON W. DUDAS
*Director of the United States Patent and Trademark Office*